US012727226B2

(12) United States Patent
Chen et al.

(10) Patent No.: US 12,727,226 B2
(45) Date of Patent: Sep. 1, 2026

(54) METHOD FOR FORMING SEMICONDUCTOR STRUCTURE

(71) Applicant: Taiwan Semiconductor Manufacturing Company, Ltd., Hsinchu (TW)

(72) Inventors: Shih-Cheng Chen, New Taipei City (TW); Zhi-Chang Lin, Zhubei City (TW); Jung-Hung Chang, Changhua County (TW); Chien-Ning Yao, Hsinchu (TW); Tsung-Han Chuang, Tainan City (TW); Kuo-Cheng Chiang, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 622 days.

(21) Appl. No.: 18/171,524

(22) Filed: Feb. 20, 2023

(65) Prior Publication Data

US 2024/0170556 A1 May 23, 2024

Related U.S. Application Data

(60) Provisional application No. 63/384,252, filed on Nov. 18, 2022.

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ......... *H10D 64/017* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/021* (2025.01); *H10P 50/642* (2026.01); *H10P 50/695* (2026.01)

(58) Field of Classification Search

CPC . H10D 64/017; H10D 30/6757; H10D 64/021

See application file for complete search history.

(56) References Cited

U.S. PATENT DOCUMENTS 9,209,247 B2 12/2015 Colinge et al.
9,236,267 B2 1/2016 De et al.
9,412,817 B2 8/2016 Yang et al.

(Continued)

*Primary Examiner* — Brian Turner

(74) *Attorney, Agent, or Firm* — McClure, Qualey & Rodack, LLP

(57) ABSTRACT

A method for forming a semiconductor structure is provided. The method includes forming a spacer layer along a first fin structure and a second fin structure, etching a first portion of the spacer layer and the first fin structure to form first fin spacers and a first recess between the first fin spacers, etching a second portion of the spacer layer and the second fin structure to form second fin spacers and a second recess between the second fin spacers, and forming a first source/drain feature in the first recess and a second source/drain feature in the second recess. The second fin structure is wider than the first fin structure. The first fin spacers have a first height, and the second fin spacers have a second height that is greater than the first height.

20 Claims, 49 Drawing Sheets

(51) Int. Cl.
*H10P 50/00* (2026.01)
*H10P 50/64* (2026.01)

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2017/0133286 | A1* | 5/2017 | Sung | H10D 62/151 |
| 2018/0308852 | A1* | 10/2018 | Lee | H10D 64/021 |
| 2020/0105620 | A1* | 4/2020 | Tan | H10D 84/0193 |
| 2021/0066473 | A1* | 3/2021 | Lin | H10D 30/6219 |

* cited by examiner

50B

50A

50B

50A

50B

50A 50B
132
132
132
124
122
120
118
134B
116
114
112
112
134B
104B1
108
106
108
106
108
106
103P
102
PW2
X2
X2

50A
132
132
132
124
122
120
118
134A
116
114
112
112
134A
104A1
108
106
108
106
108
106
103P
102
PW1
X1
X1

D1
103P
136A
134A
W3
130A
122
124
D2
H1
110

104A
108
106
136A
103P
130A
122
124
110

METHOD FOR FORMING SEMICONDUCTOR STRUCTURE

PRIORITY CLAIM

This application claims the benefit of U.S. Provisional Application No. 63/384,252, filed on Nov. 18, 2022 and entitled "SEMICONDUCTOR STRUCTURE AND METHOD FOR FORMING THE SAME," which is incorporated herein by reference.

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2A-3 and 2A-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2B-1, 2B-2, 2B-3 and 2B-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2C-1, 2C-2, 2C-3 and 2C-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2D-1, 2D-2, 2D-3 and 2D-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2E-1, 2E-2, 2E-3 and 2E-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2F-1, 2F-2, 2F-3 and 2F-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2G-1, 2G-2, 2G-3 and 2G-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2H-1, 2H-2, 2H-3 and 2H-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2I-1, 2I-2, 2I-3 and 2I-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2J-1, 2J-2, 2J-3 and 2J-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2K-1, 2K-2, 2K-3 and 2K-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2L-1, 2L-2, 2L-3 and 2L-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2M-1, 2M-2, 2M-3 and 2M-4 are cross-sectional views of the semiconductor structure at an intermediate stage corresponding to line Y1-Y1, line Y2-Y2, lines X1-X1 and X1'-X1', lines X2-X2 and X2'-X2' of FIG. 2A, in accordance with some embodiments of the disclosure.

FIGS. 2N-1, 2N-2, 2N-3 and 2N-4 are cross-sectional views of the semiconductor structure at an intermediate stage corresponding to line Y1-Y1, line Y2-Y2, lines X1-X1 and X1'-X1', lines X2-X2 and X2'-X2' of FIG. 2A, in accordance with some embodiments of the disclosure.

FIGS. 2O-1, 2O-2, 2O-3 and 2O-4 are cross-sectional views of the semiconductor structure at an intermediate stage corresponding to line Y1-Y1, line Y2-Y2, lines X1-X1 and X1'-X1', lines X2-X2 and X2'-X2' of FIG. 2A, in accordance with some embodiments of the disclosure.

FIGS. 2P-1, 2P-2, 2P-3 and 2P-4 are cross-sectional views of the semiconductor structure at an intermediate stage corresponding to line Y1-Y1, line Y2-Y2, lines X1-X1 and X1'-X1', lines X2-X2 and X2'-X2' of FIG. 2A, in accordance with some embodiments of the disclosure.

FIGS. 2Q-1, 2Q-2, 2Q-3 and 2Q-4 are cross-sectional views of the semiconductor structure at an intermediate stage corresponding to line Y1-Y1, line Y2-Y2, lines X1-X1 and X1'-X1', lines X2-X2 and X2'-X2' of FIG. 2A, in accordance with some embodiments of the disclosure.

FIGS. 2R-1, 2R-2, 2R-3 and 2R-4 are cross-sectional views of the semiconductor structure at an intermediate stage corresponding to line Y1-Y1, line Y2-Y2, lines X1-X1 and X1'-X1', lines X2-X2 and X2'-X2' of FIG. 2A, in accordance with some embodiments of the disclosure.

FIGS. 2S-1, 2S-2, 2S-3 and 2S-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2T-1, 2T-2, 2T-3 and 2T-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

FIGS. 2U-1, 2U-2, 2U-3 and 2U-4 are cross-sectional views of the semiconductor structure at an intermediate stage corresponding to line Y1-Y1, line Y2-Y2, line X1-X1 and line X2-X2 of FIG. 2A, in accordance with some embodiments of the disclosure.

DETAILED DESCRIPTION

Figure 1:
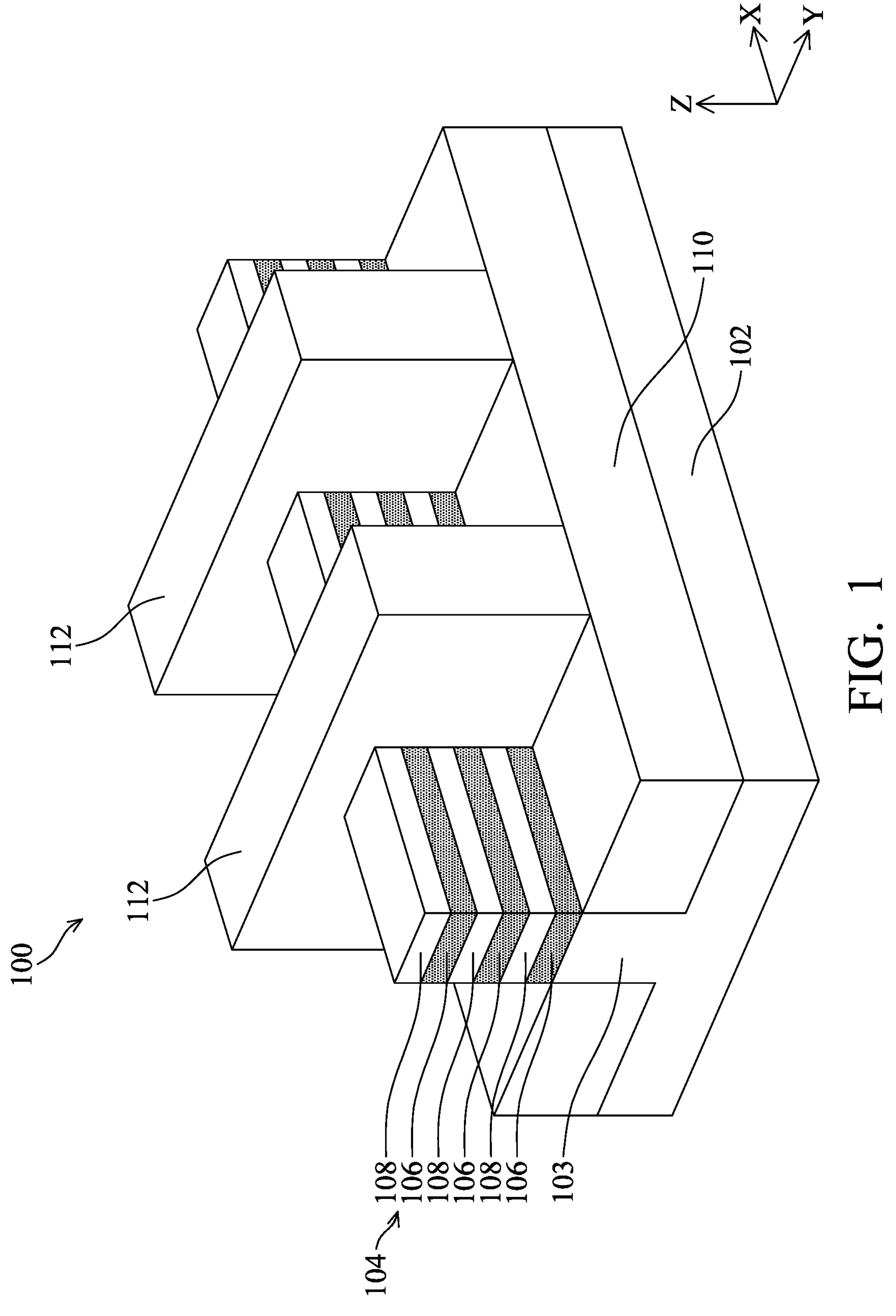
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to a semiconductor structure including fin spacers. The semiconductor structure may include a first fin structure and a second fin structure that is wider than the first fin structure. First fin spacers may be formed on opposite sides of the first fin structure, and second fin spacers may be formed on opposite sides of the second fin structure. The second fin spacers may be taller than the first fin spacers. The first fin spacers are relatively short, which may help to completely remove a dielectric material for inner spacers from a source/drain recess between the first fin spacers, thereby improving the manufacturing yield of the resulting semiconductor structure. In addition, the second fin spacers are relatively tall, and thus a source/drain feature formed between the second fin spacers may have a high proportion of a narrow body portion, thereby enhancing the performance of the resulting semiconductor device.

FIG. 1 is a perspective view of a semiconductor structure 100, in accordance with some embodiments of the disclosure.

The semiconductor structure 100 includes a substrate 102 and a fin structure 104 and an isolation structure 110 over the substrate 102, as shown in FIG. 1, in accordance with some embodiments. For a better understanding of the semiconductor structure 100, the X-Y-Z coordinate reference is provided in the figures of the present disclosure. The X-axis and the Y-axis are generally orientated along the lateral (or horizontal) directions that are parallel to the main surface (e.g., top surface) of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104 includes a lower fin element 103 surrounded by the isolation structure 110, and an upper fin element formed from an epitaxial stack including alternating first semiconductor layers 106 and second semiconductor layers 108, in accordance with some embodiments. The second semiconductor layers 108 will form nanostructures (e.g., nanowires or nanosheets) and serve as the channel for the resulting semiconductor devices, in accordance with some embodiments.

The fin structure 104 extends in the X direction, in accordance with some embodiments. That is, the fin structure 104 has a longitudinal axis parallel to the X direction, in accordance with some embodiments. The X direction may also be referred to as the channel-extending direction. The current of the resulting semiconductor device (i.e., nanostructure transistor) flows in the X direction through the channel. The fin structure 104 is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same.

Gate structures 112 are formed with longitudinal axes parallel to the Y direction and extending across and/or surrounding the channel regions of the fin structure 104, in accordance with some embodiments. The source/drain regions of the fin structure 104 are exposed from the gate structures 112, in accordance with some embodiments. The Y direction may also be referred to as a gate-extending direction, in accordance with some embodiments.

Figure 2A:
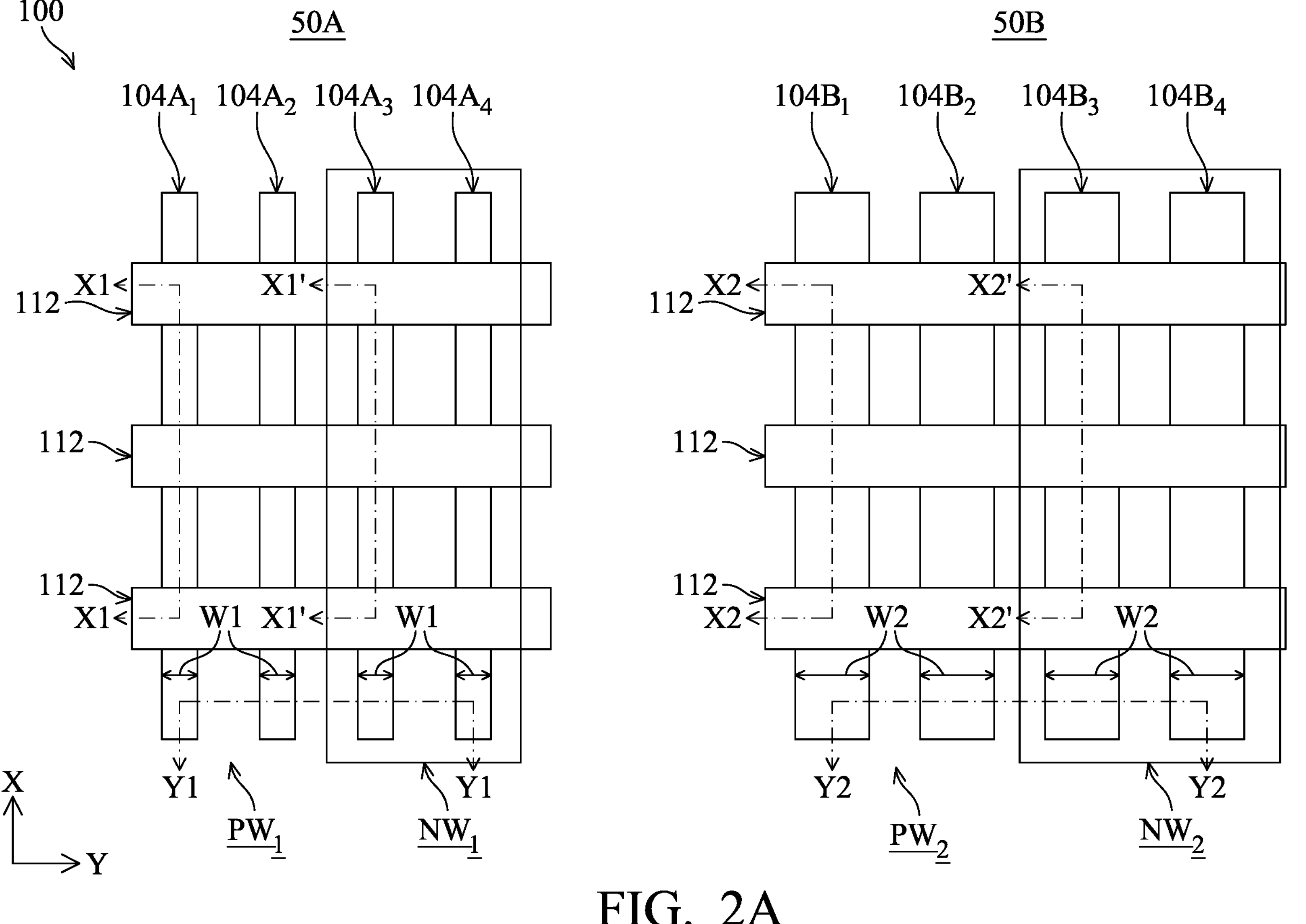
FIGS. 2A, 2I and 2T are plan views illustrating the formation of a semiconductor structure at various intermediate stages, in accordance with some embodiments of the disclosure.
Figures 2, 2A:
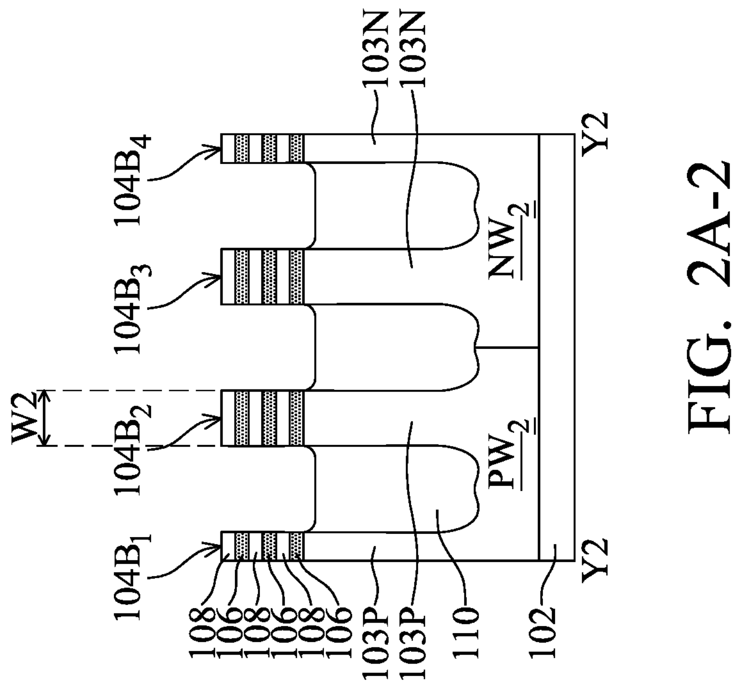
Figures 1, 2A:
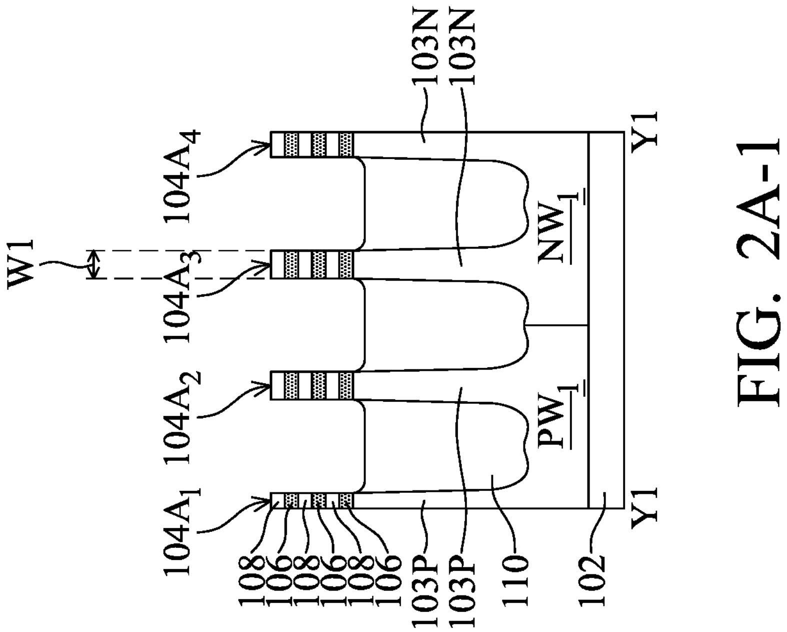
Figures 2, 2A, 3, 4:
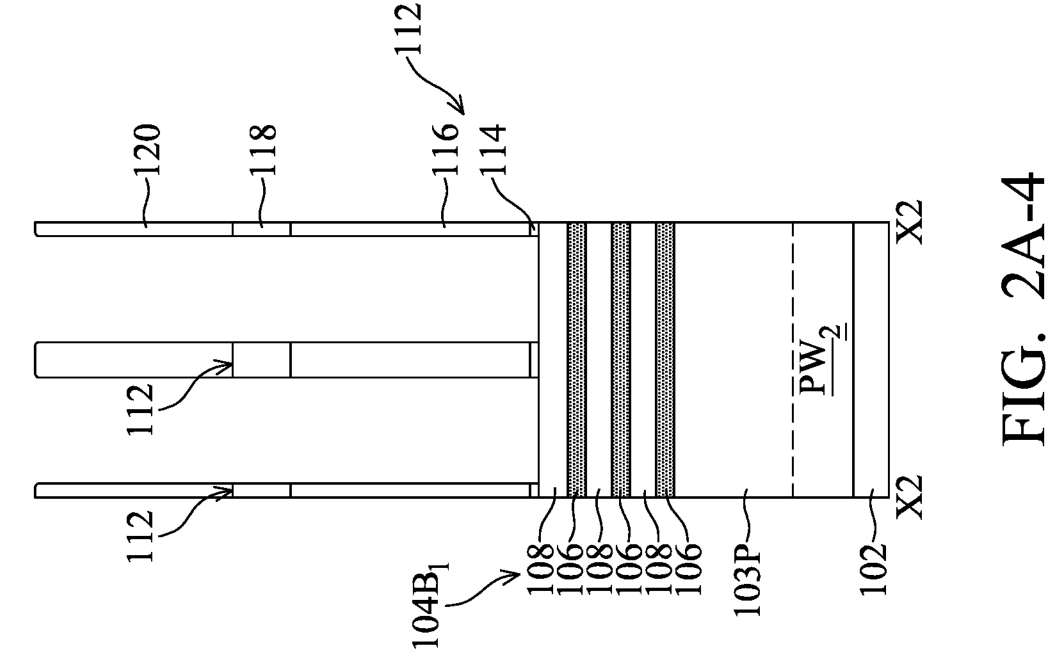
Figures 2, 2A, 3:
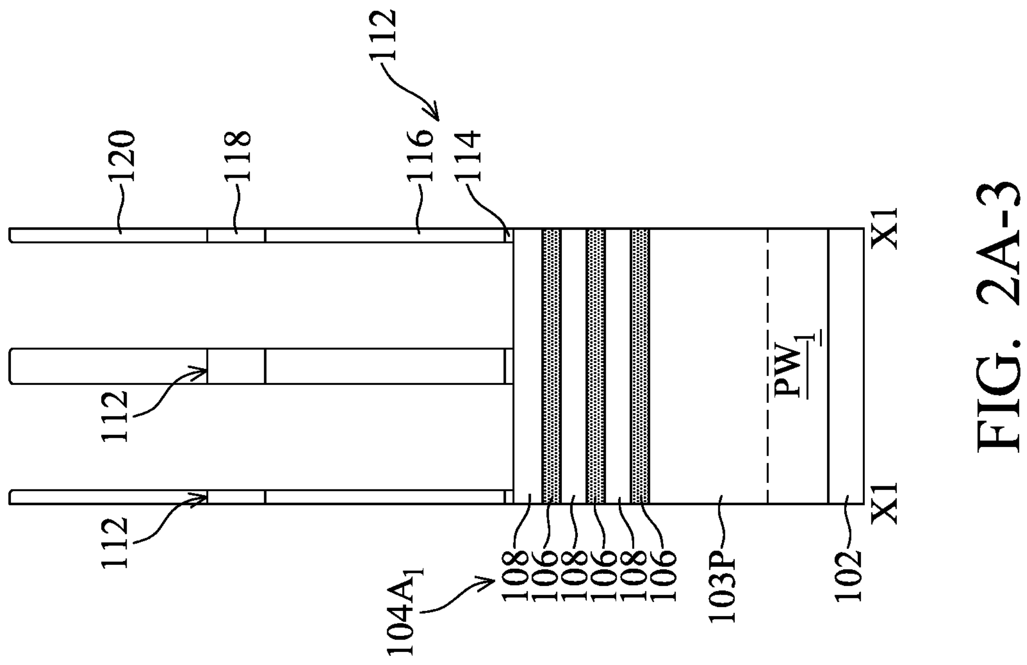
Figures 1, 2, 2B:
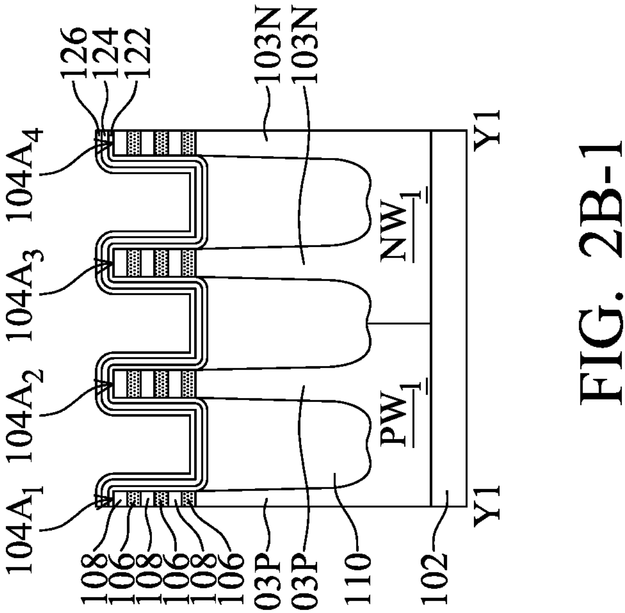
Figures 2, 2B, 3, 4:
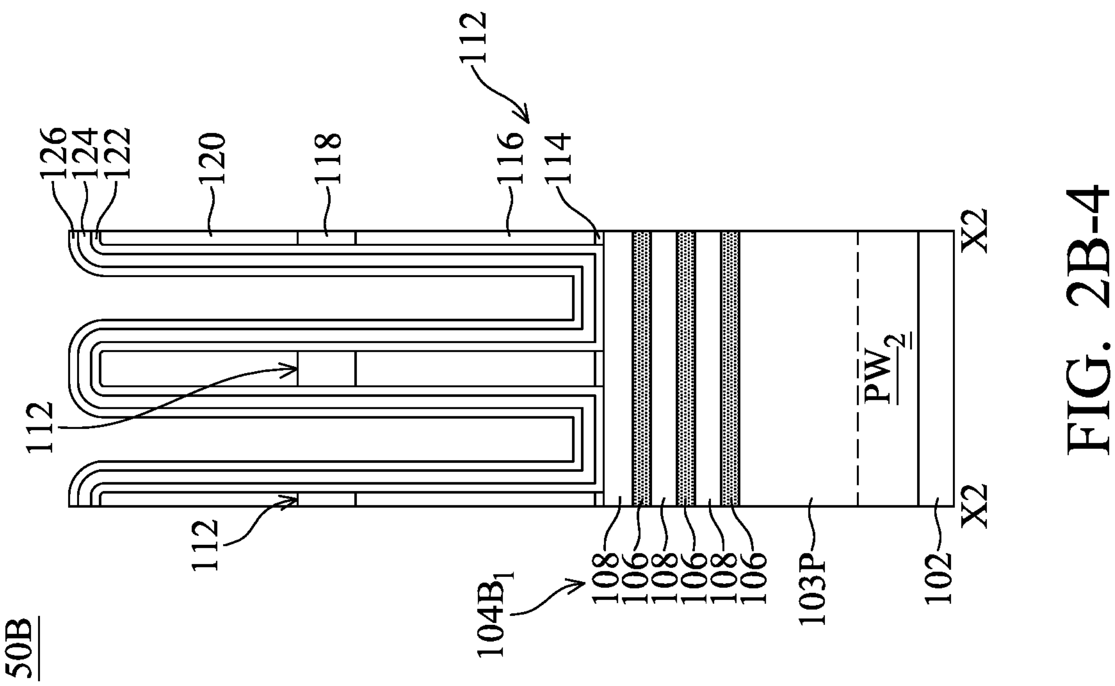
Figures 2, 2B, 3:
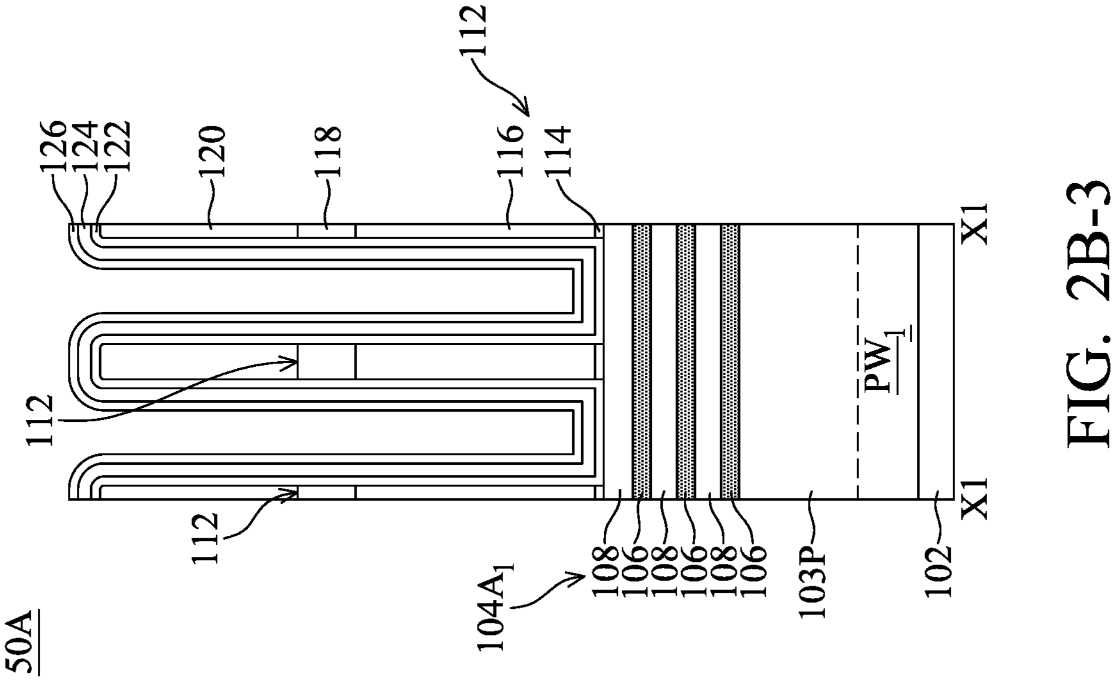
Figures 2, 2C:
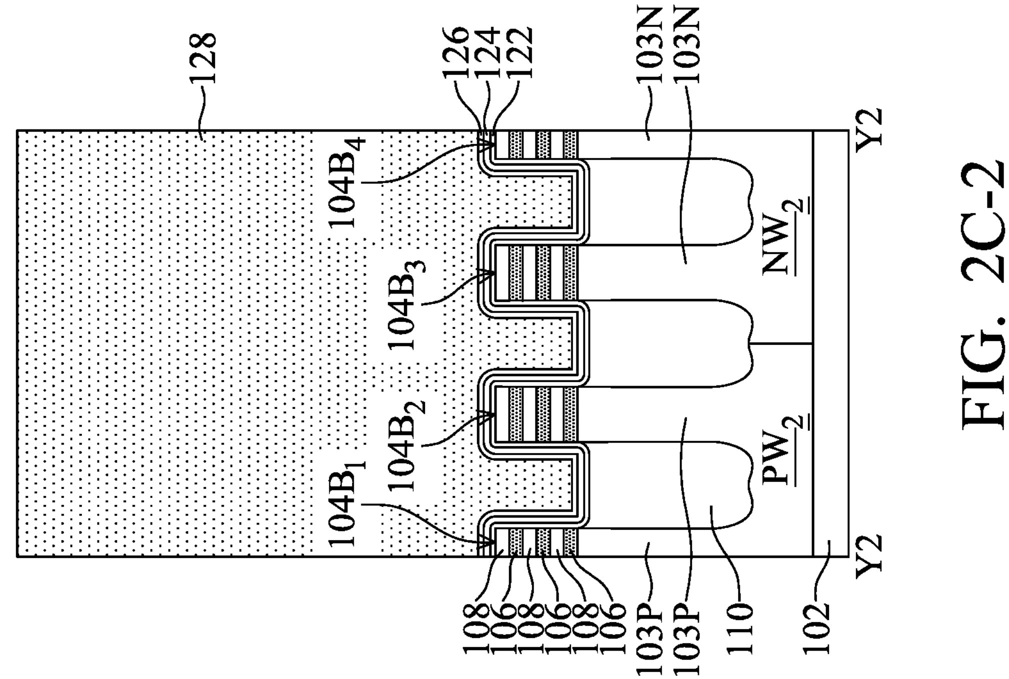
Figures 1, 2C:
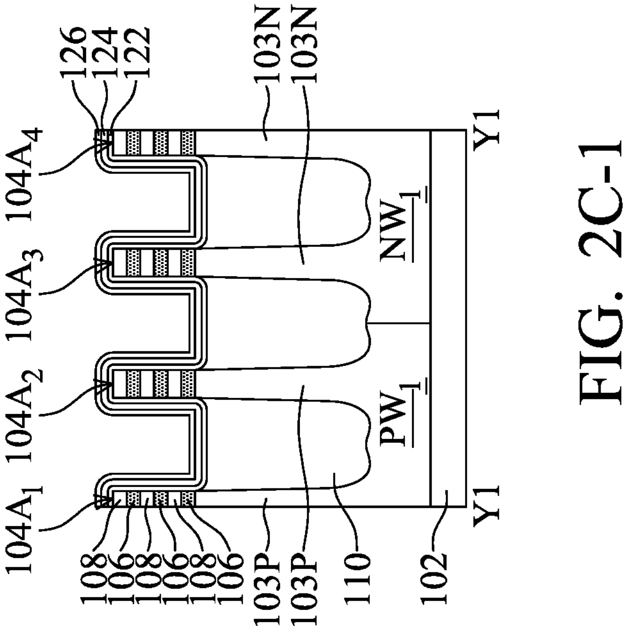
Figures 2, 2C, 3, 4:
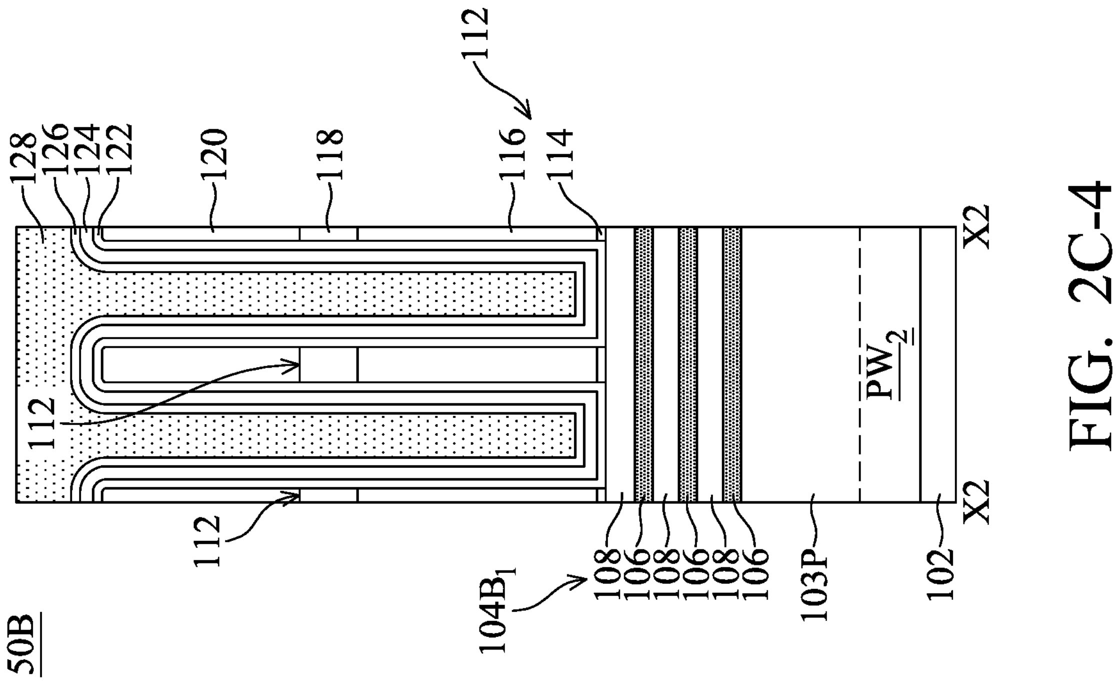
Figures 2, 2C, 3:
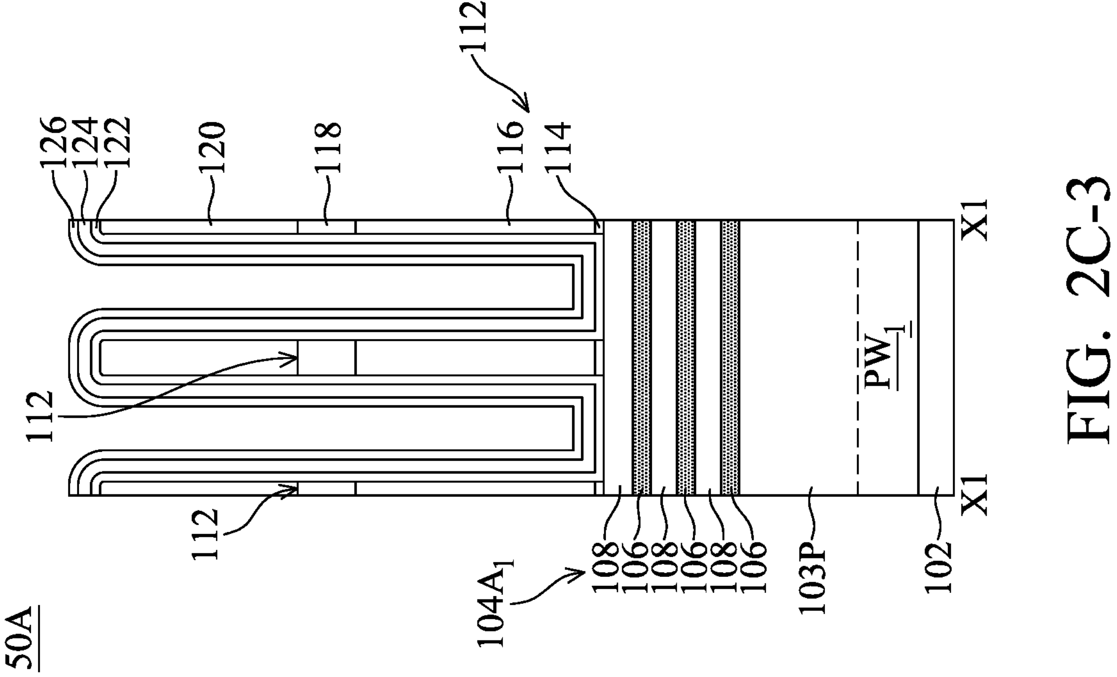
Figures 1, 2, 2D:
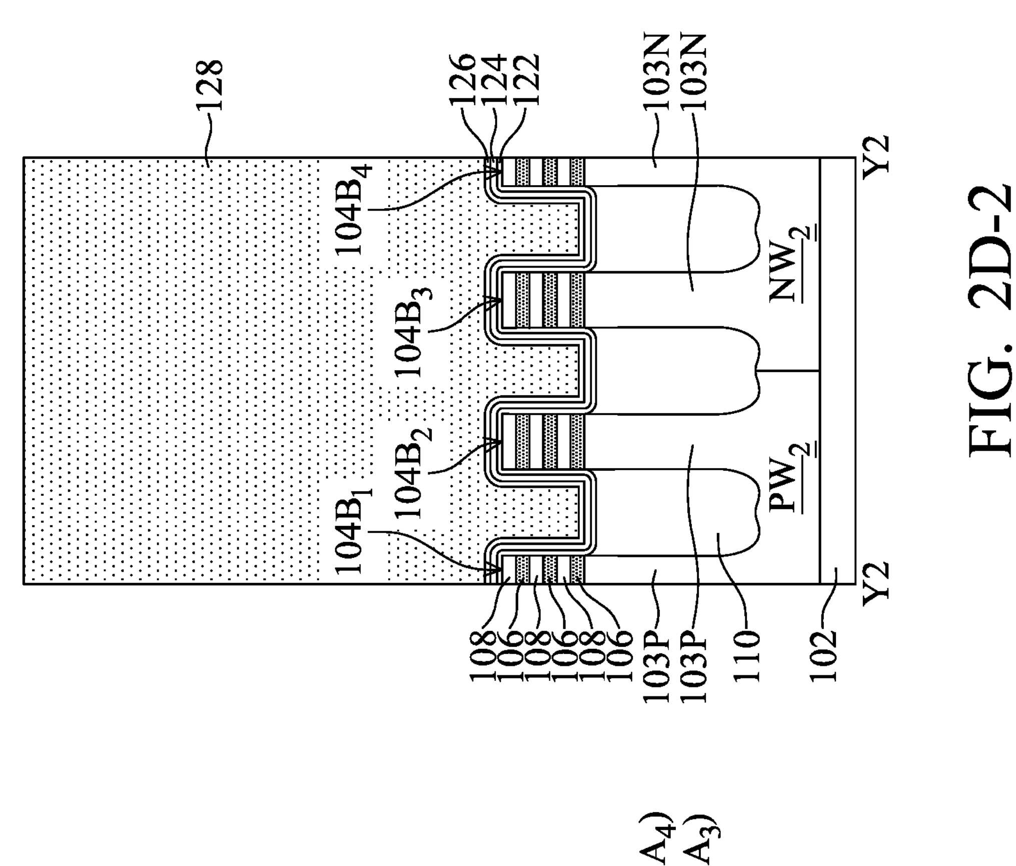
Figures 2, 2D, 3, 4:
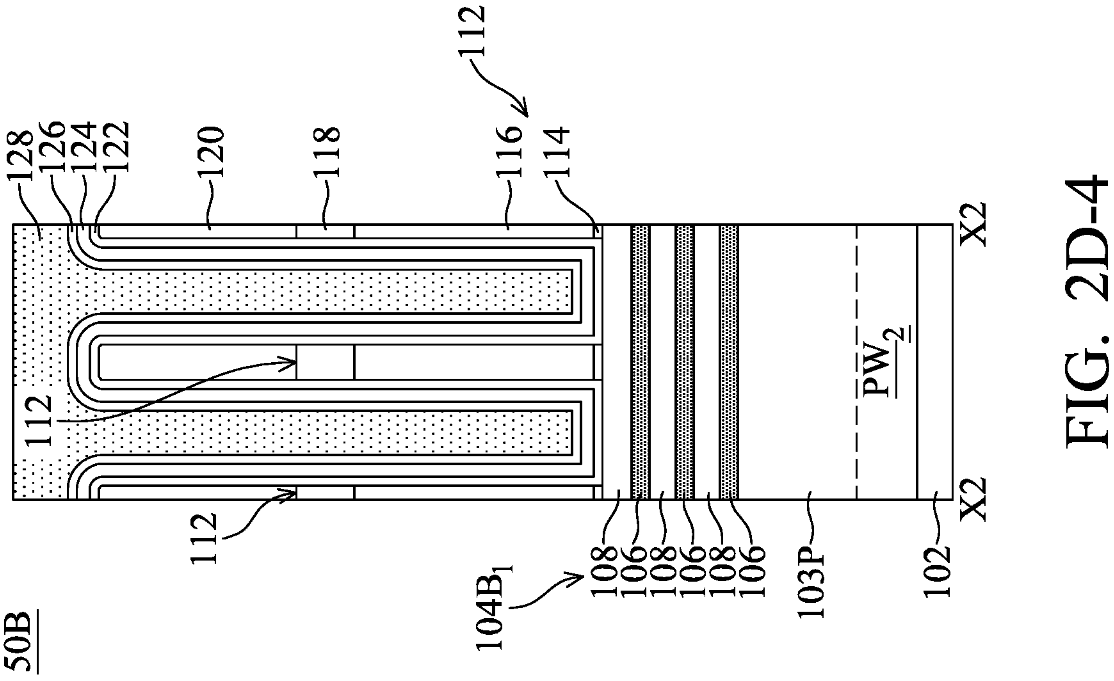
Figures 2, 2D, 3:
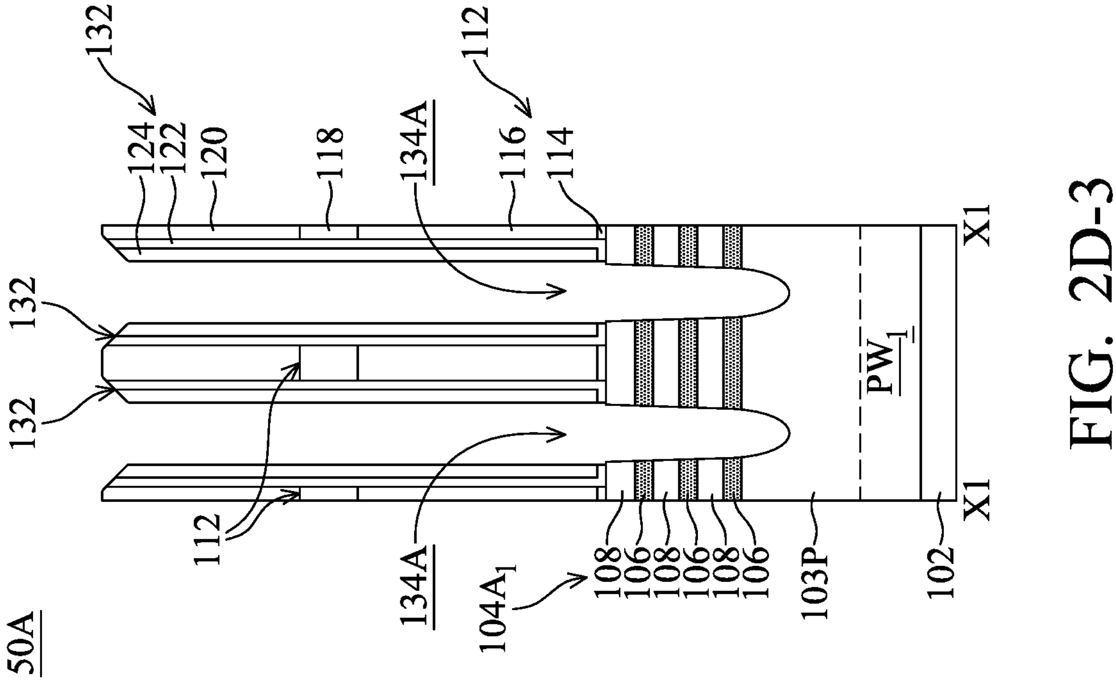
Figures 2, 2E:
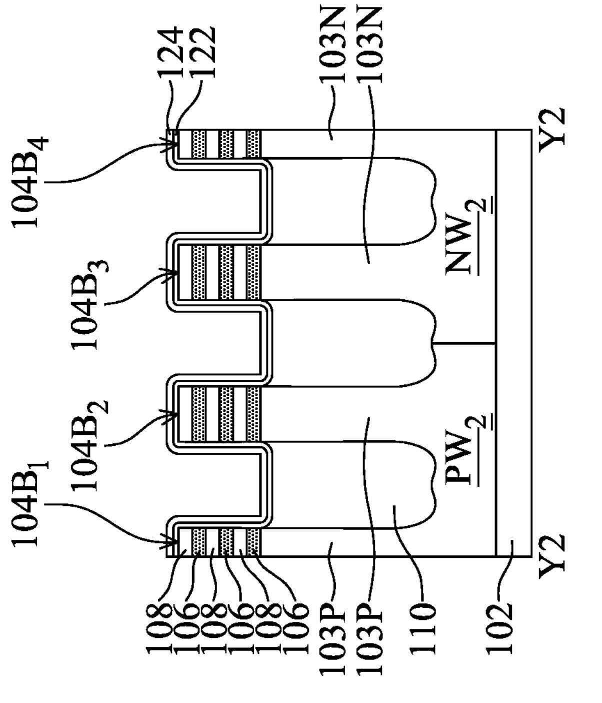
Figures 1, 2E:
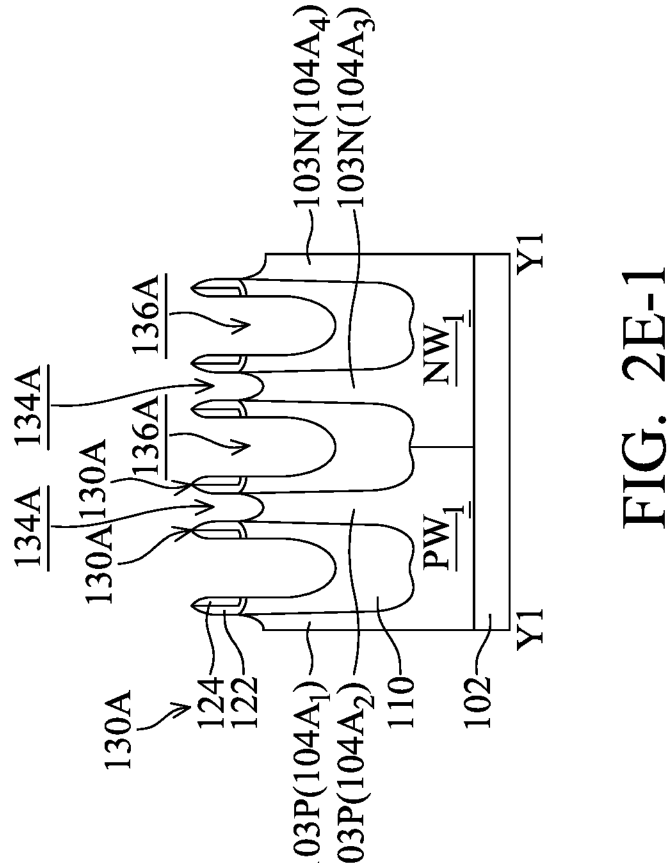
Figures 2, 2E, 3, 4:
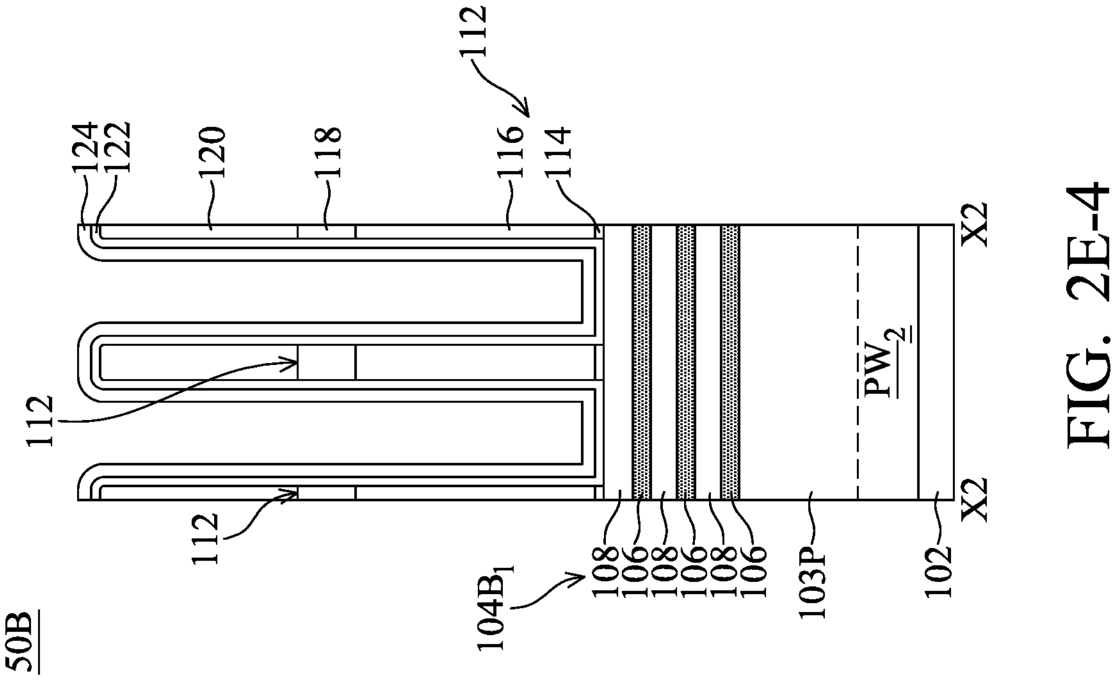
Figures 2, 2E, 3:
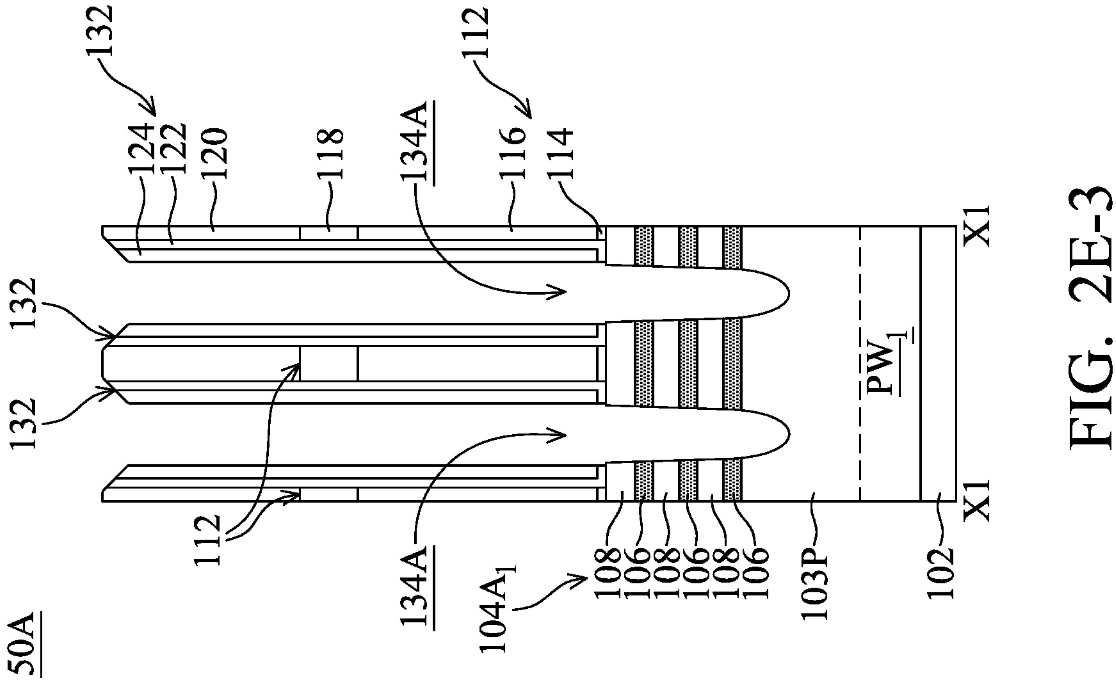
Figures 2, 2F:
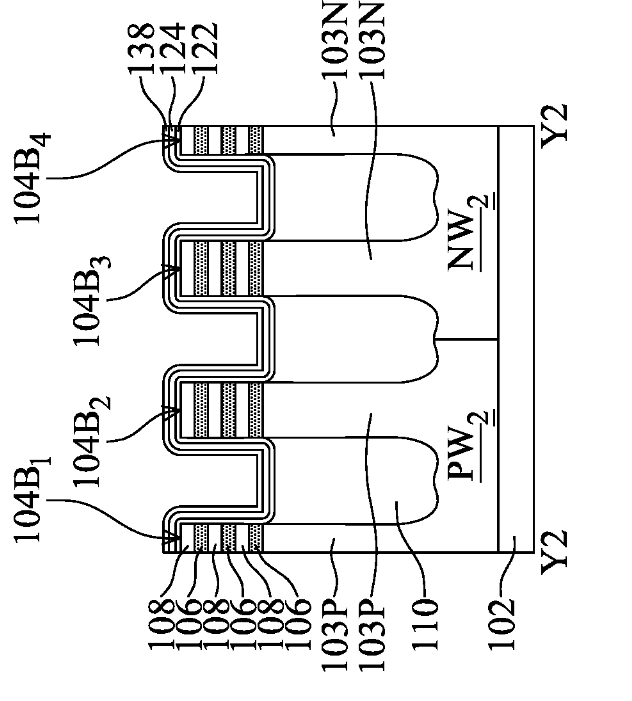
Figures 1, 2F:
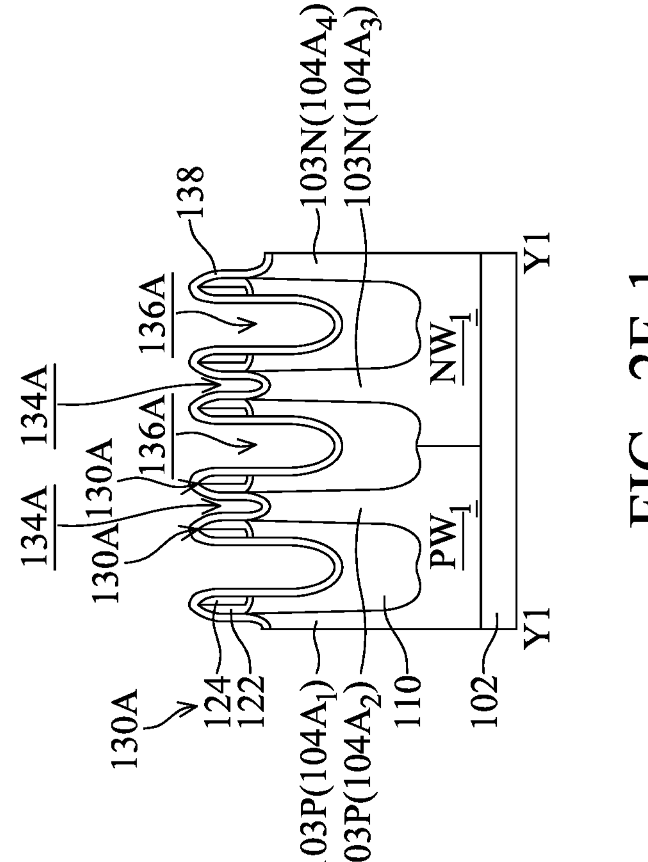
Figures 2, 2F, 3, 4:
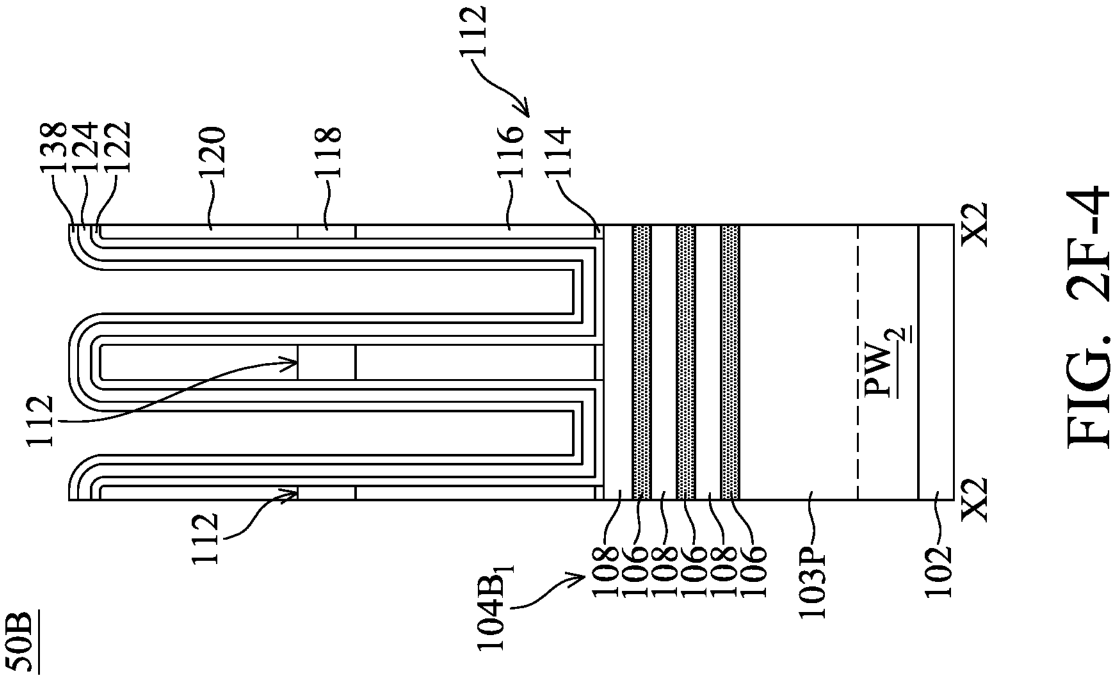
Figures 2, 2F, 3:
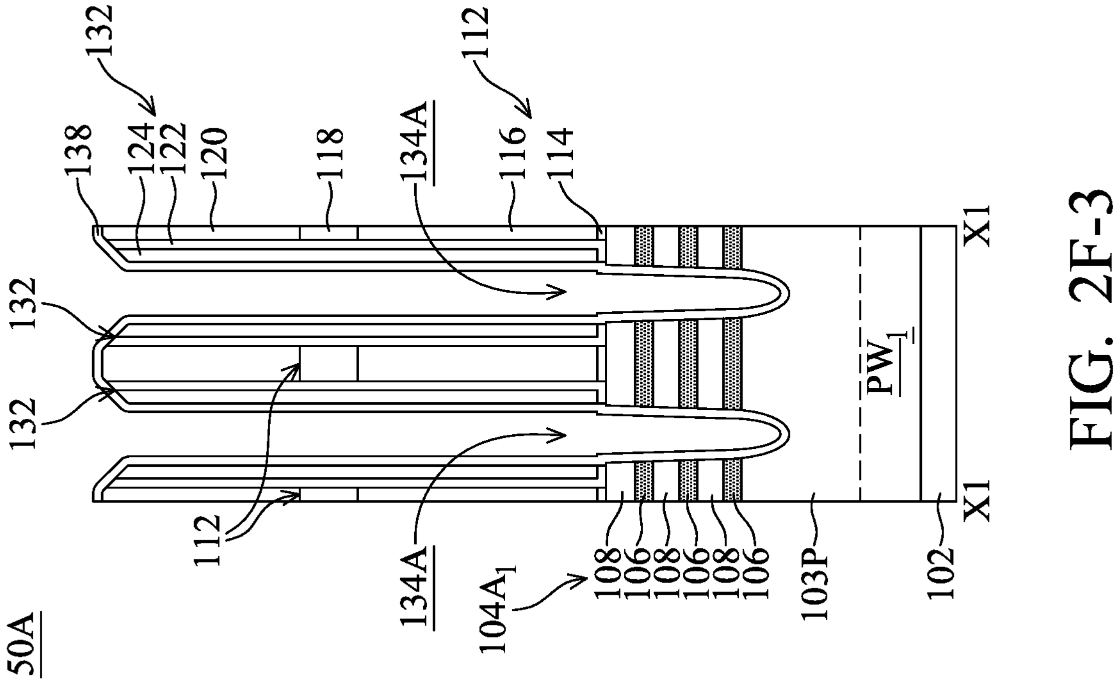
Figures 1, 2, 2G:
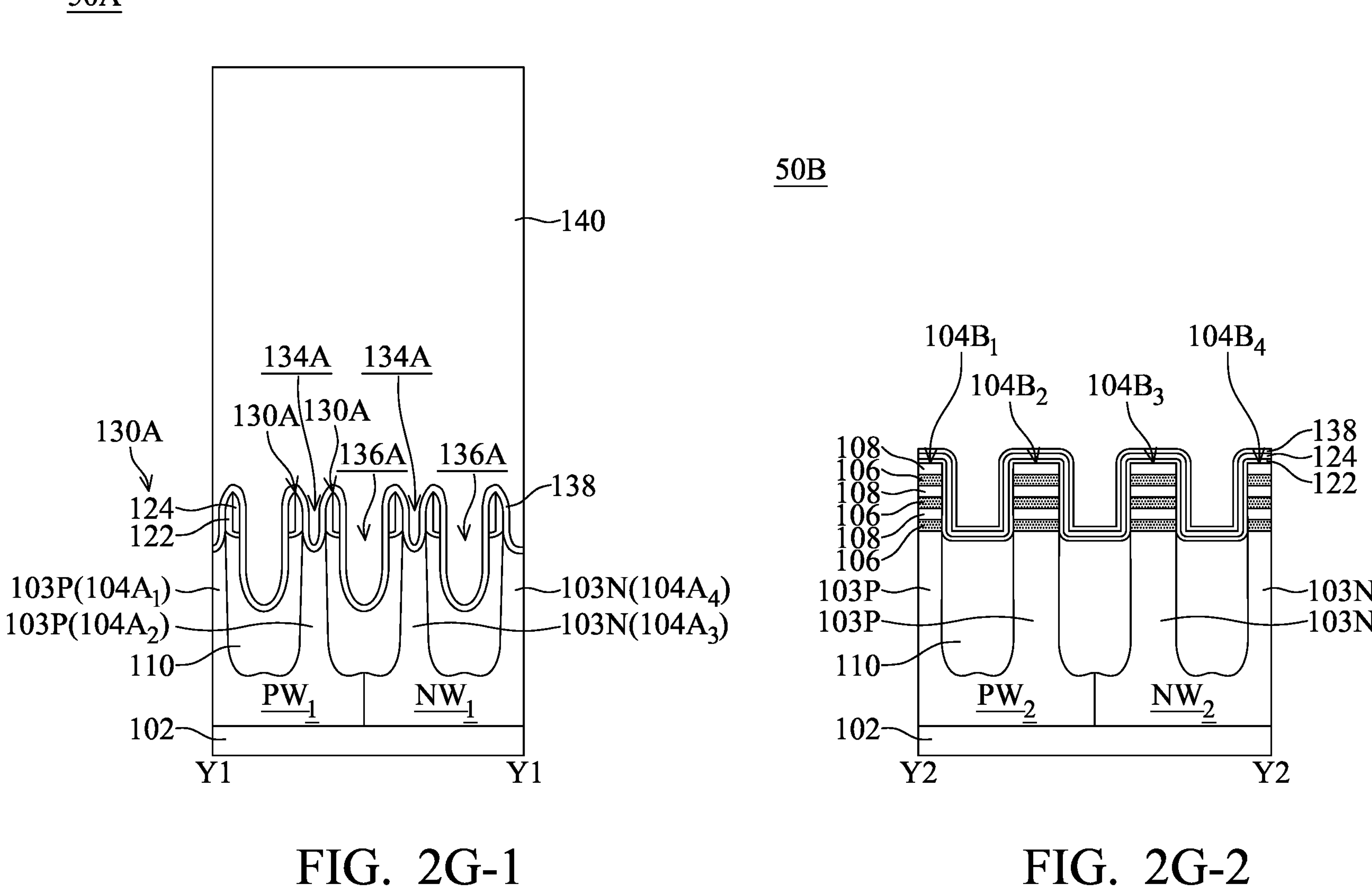
Figures 2, 2G, 3, 4:
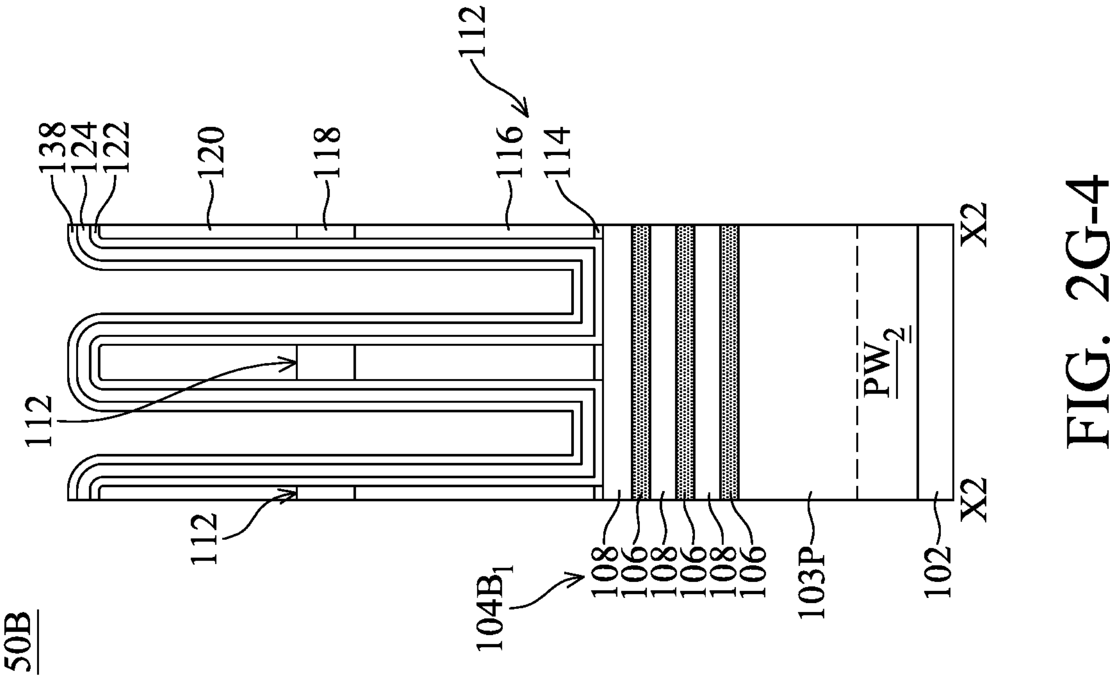
Figures 2, 2G, 3:
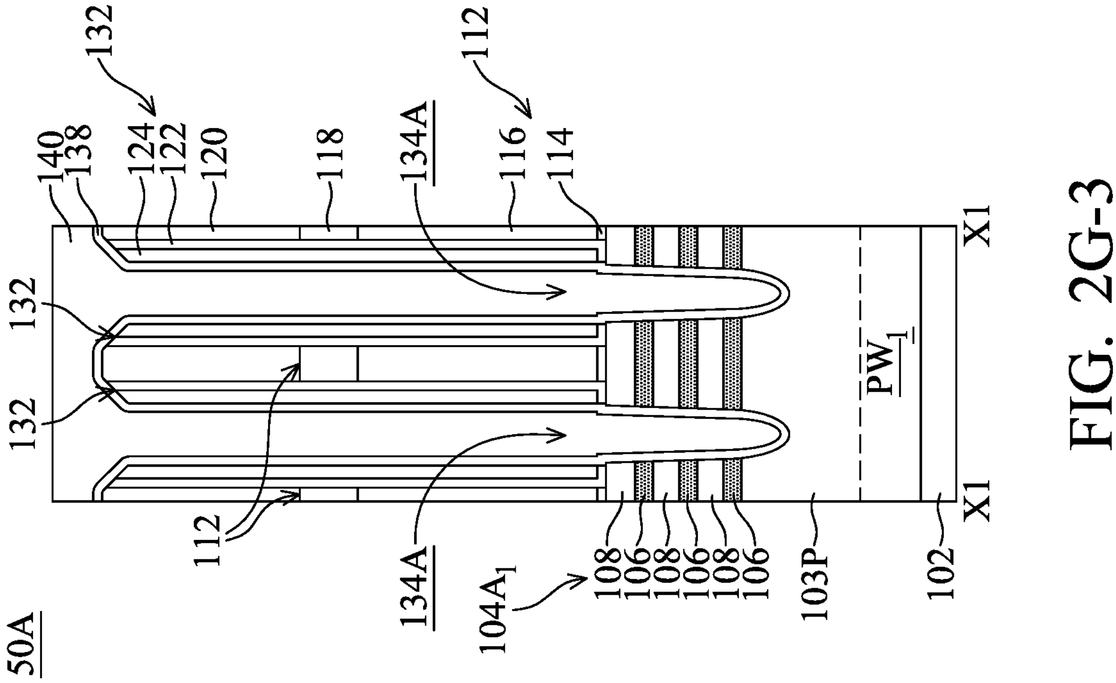
Figures 1, 2, 2H:
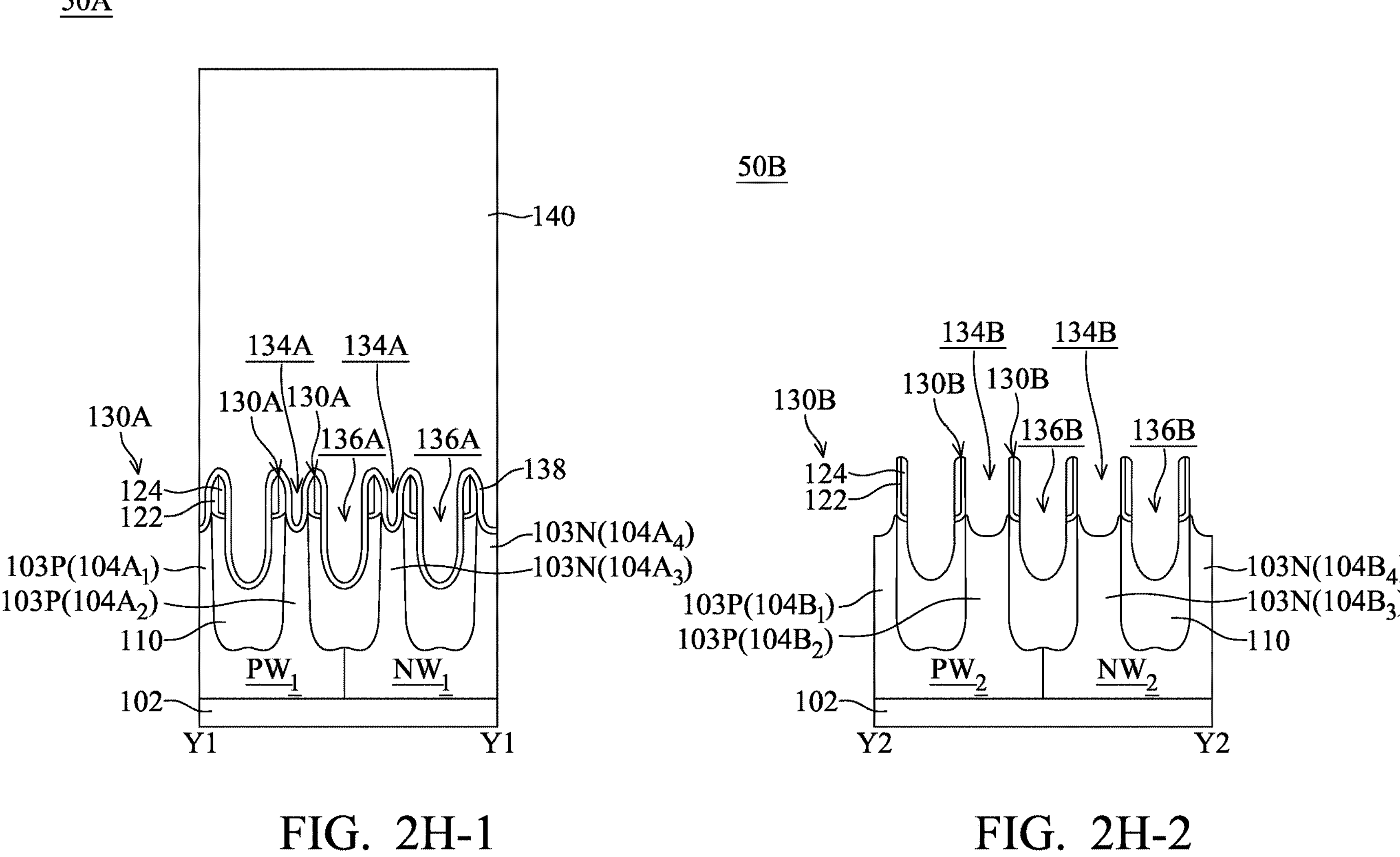
Figures 2, 2H, 3, 4:
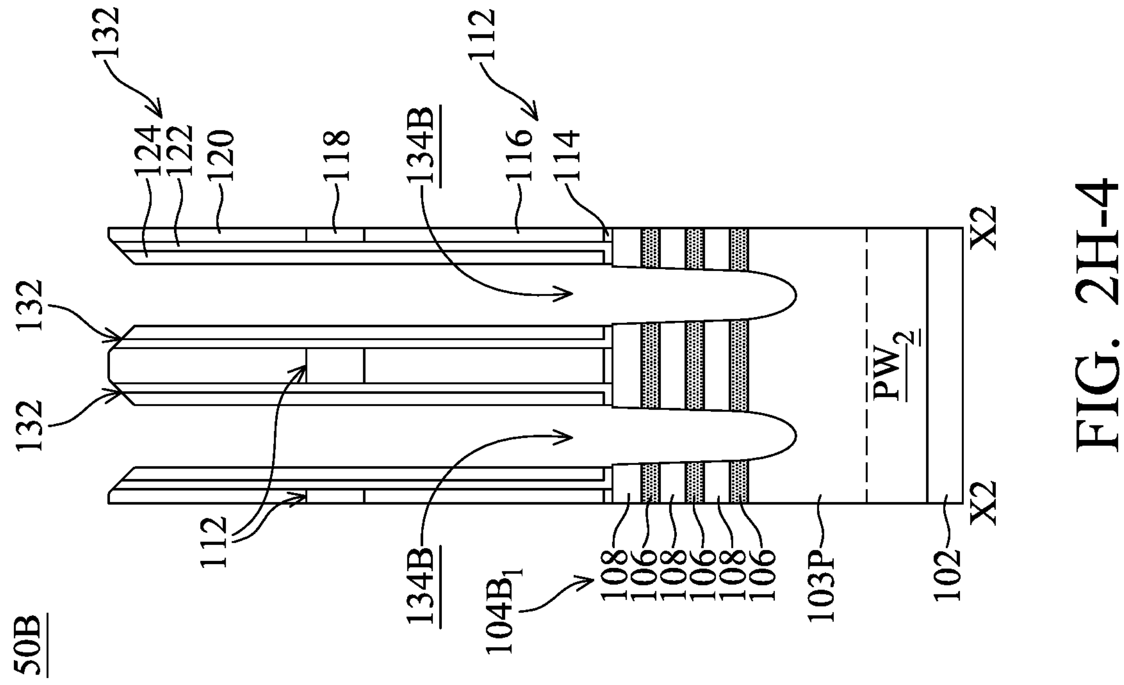
Figures 2, 2H, 3:
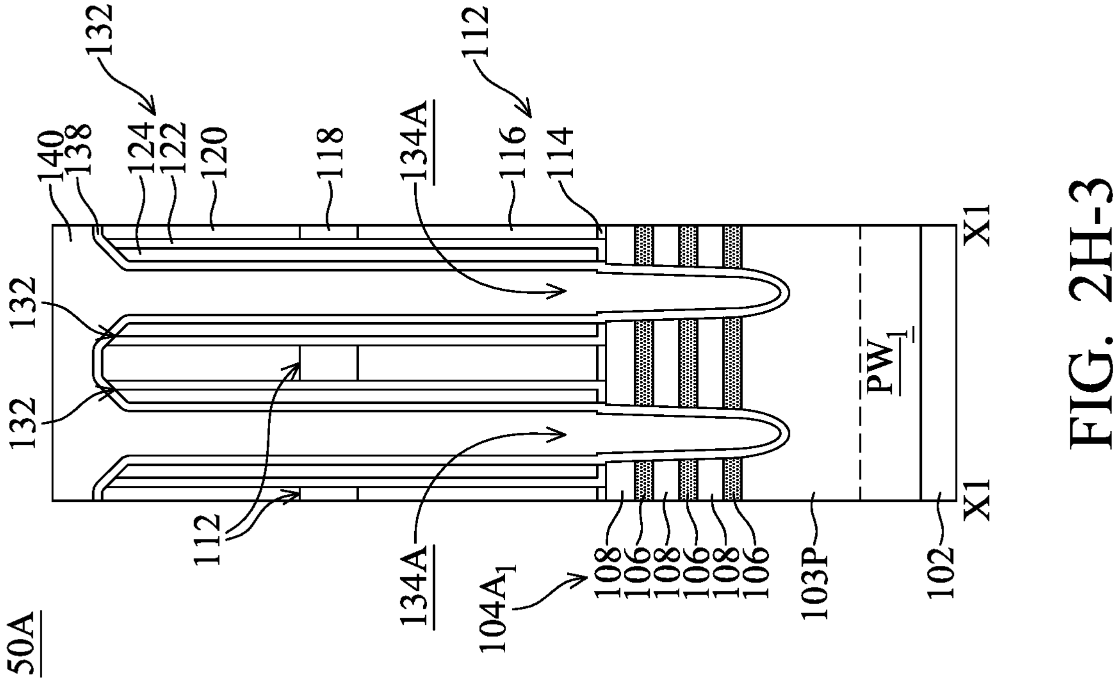
Figure 2I:
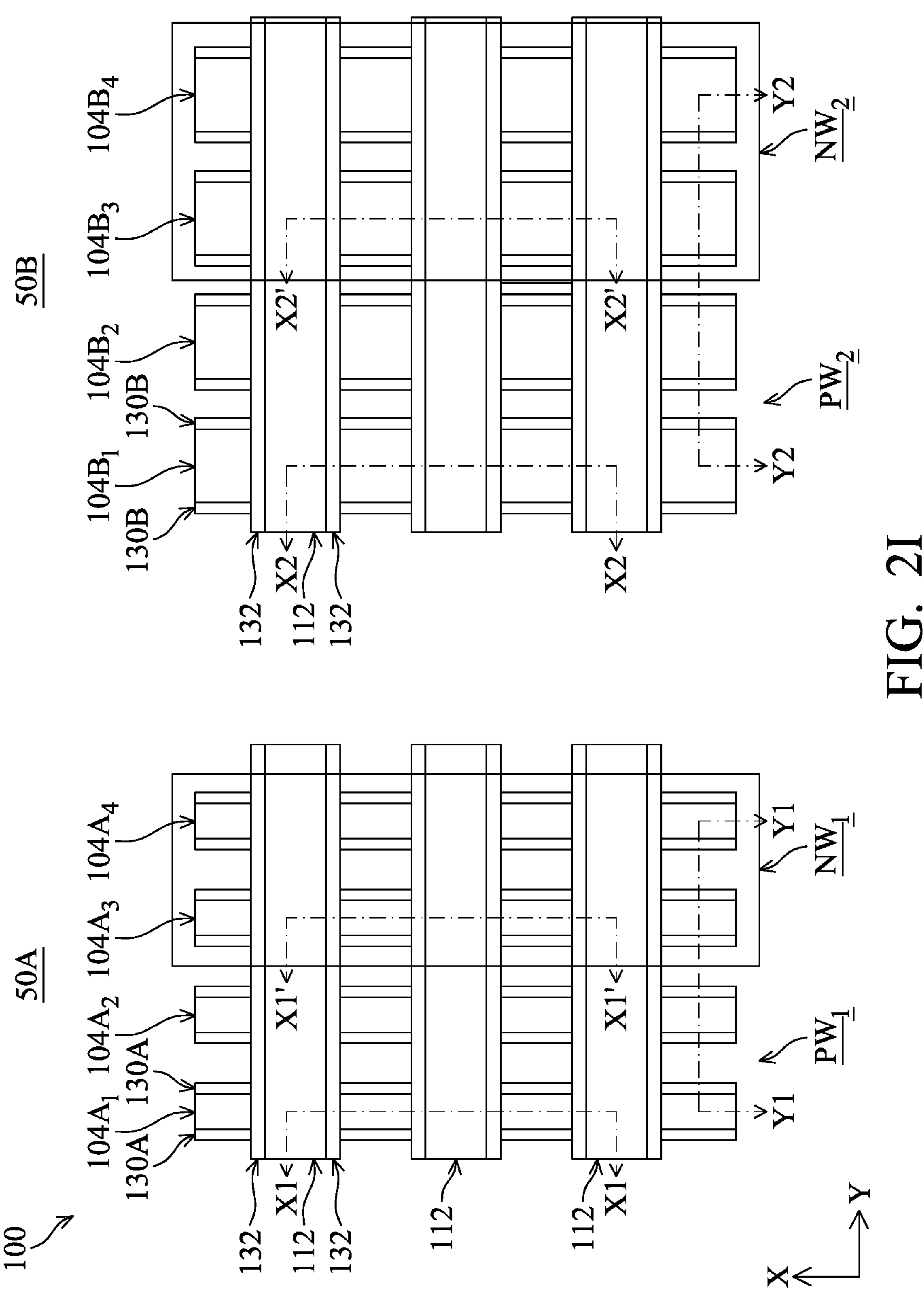
Figures 1, 2, 2I:
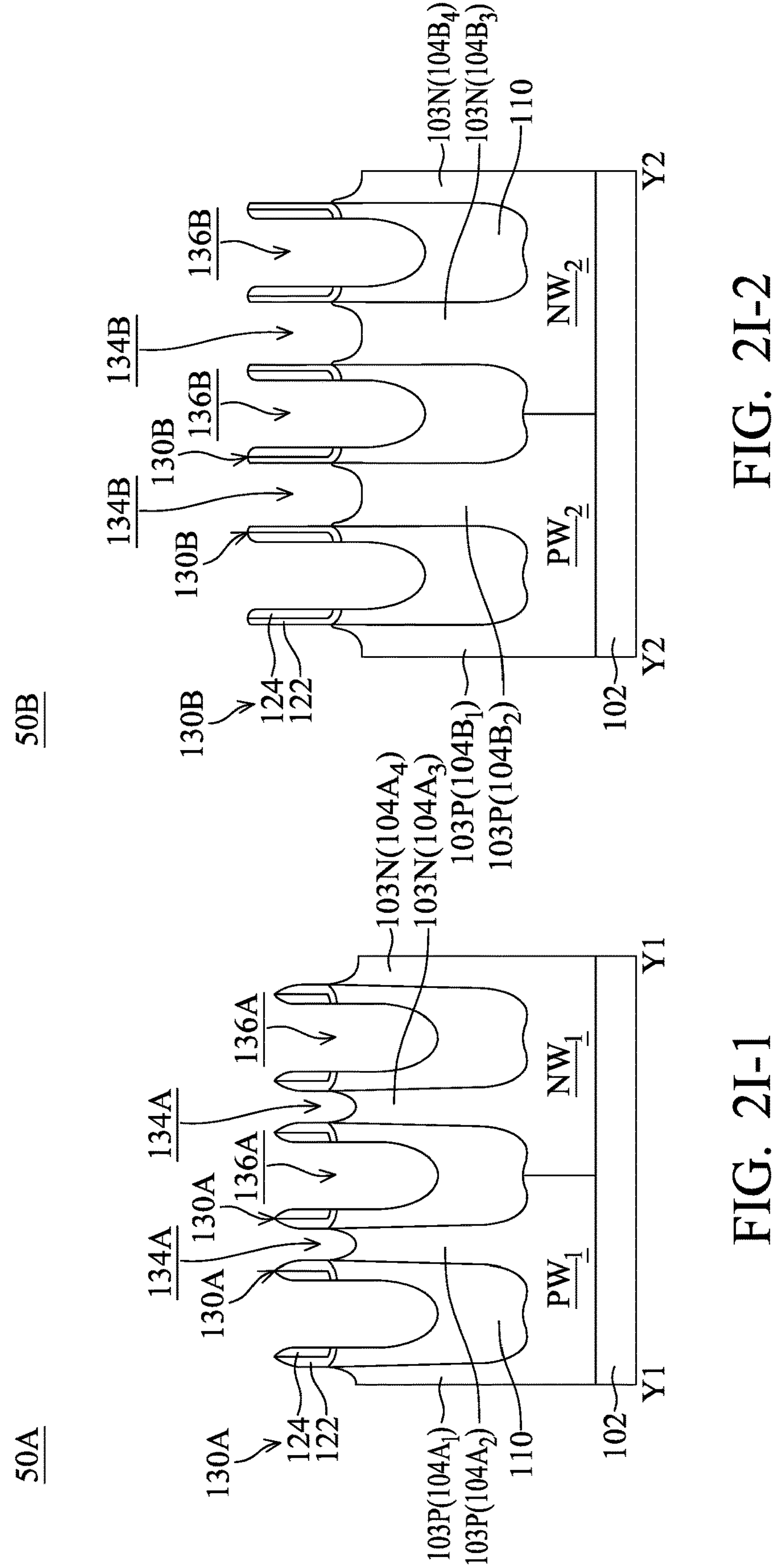
Figures 2, 2I, 3, 4:
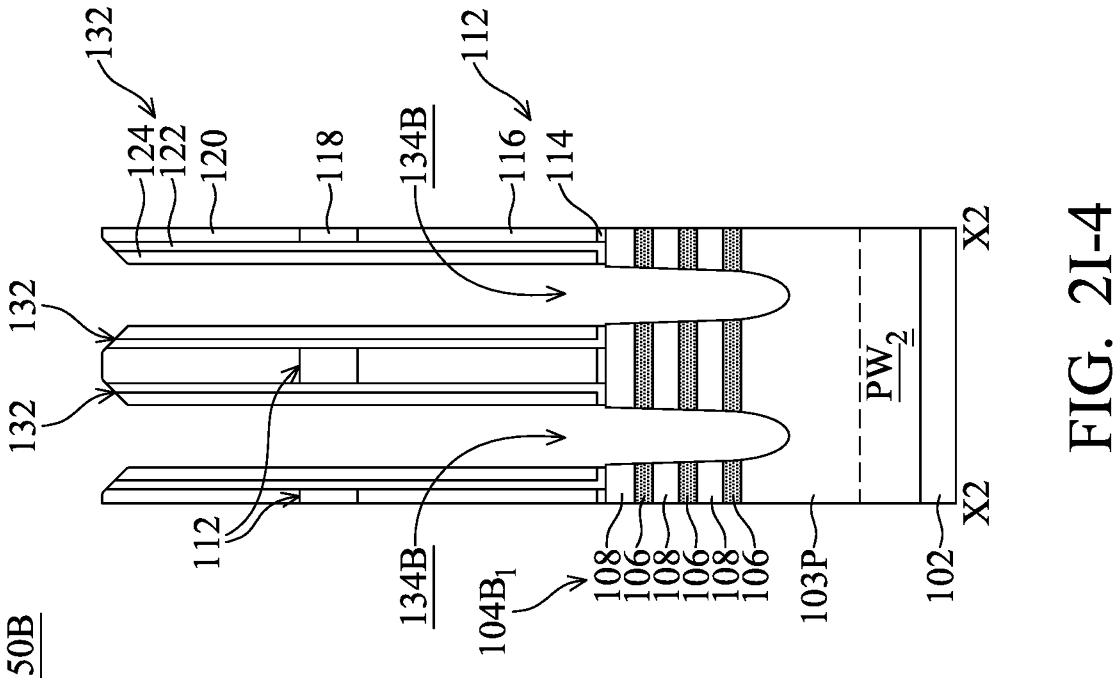
Figures 2, 2I, 3:
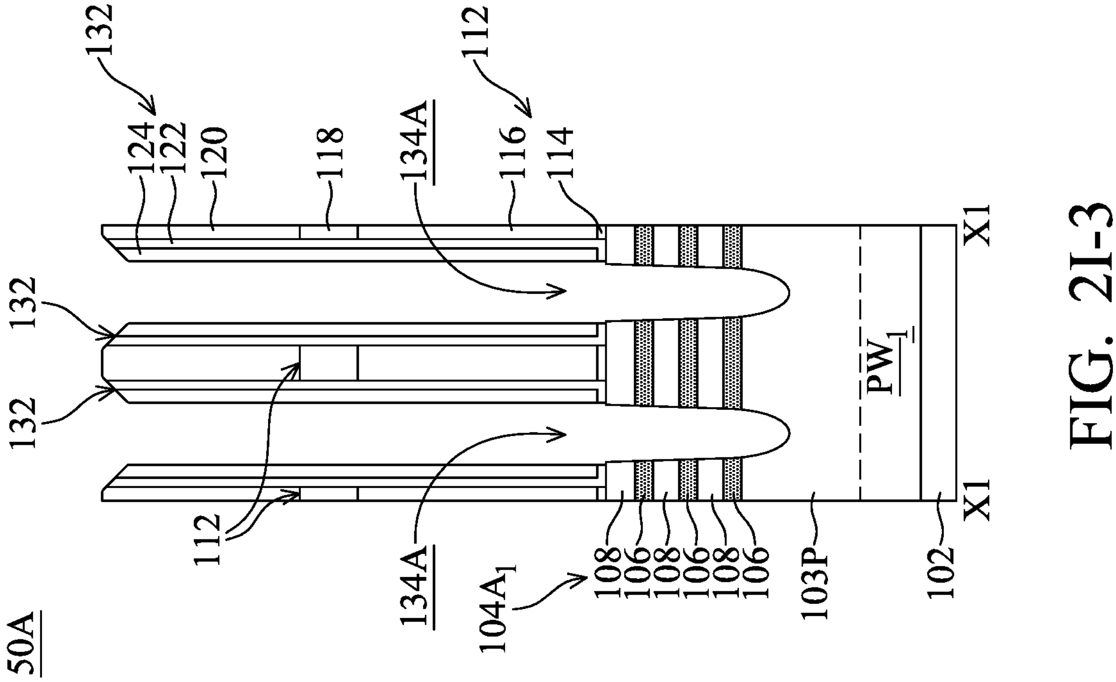
Figures 1, 2, 2J:
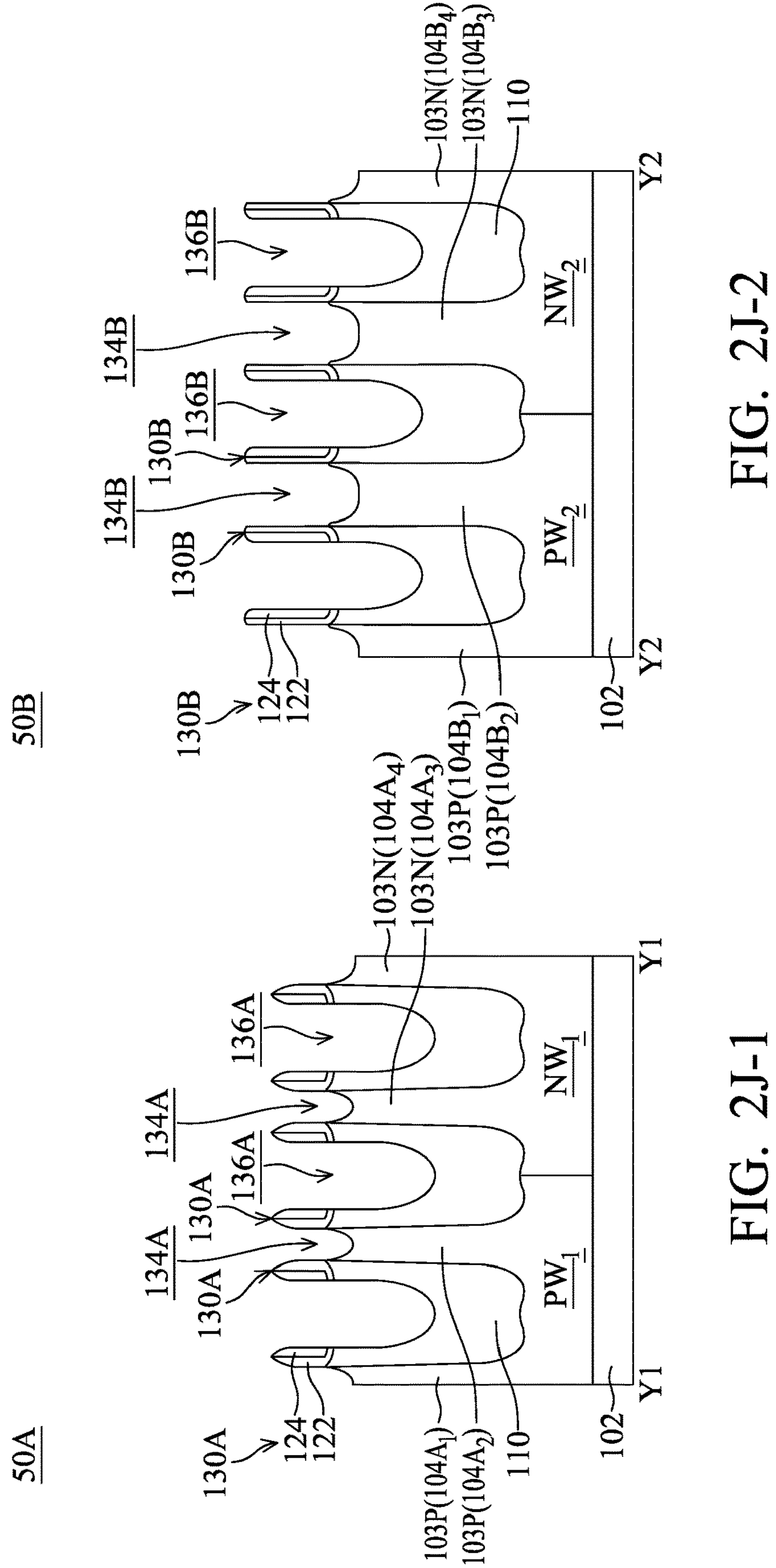
Figures 2, 2J, 3, 4:
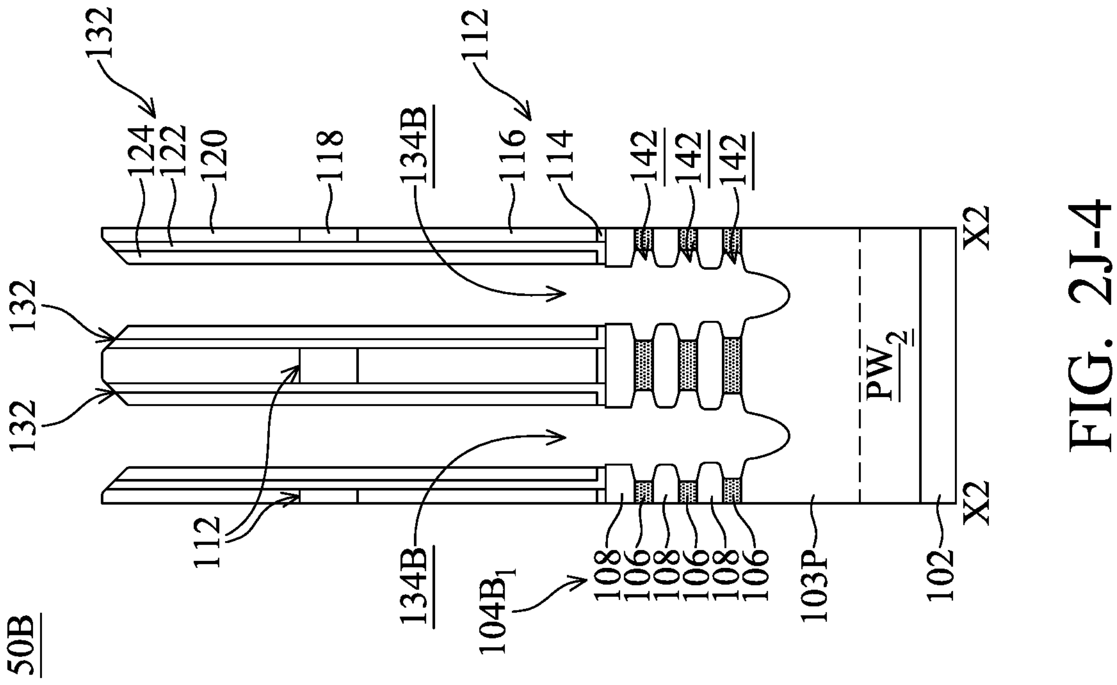
Figures 2, 2J, 3:
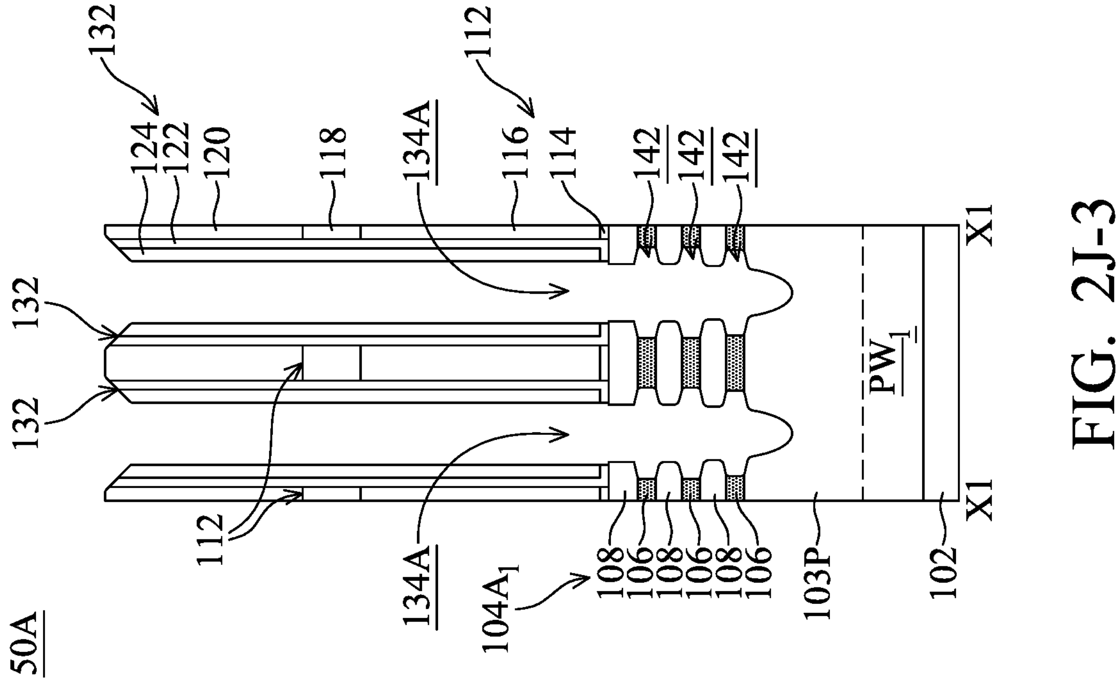
Figures 1, 2, 2K:
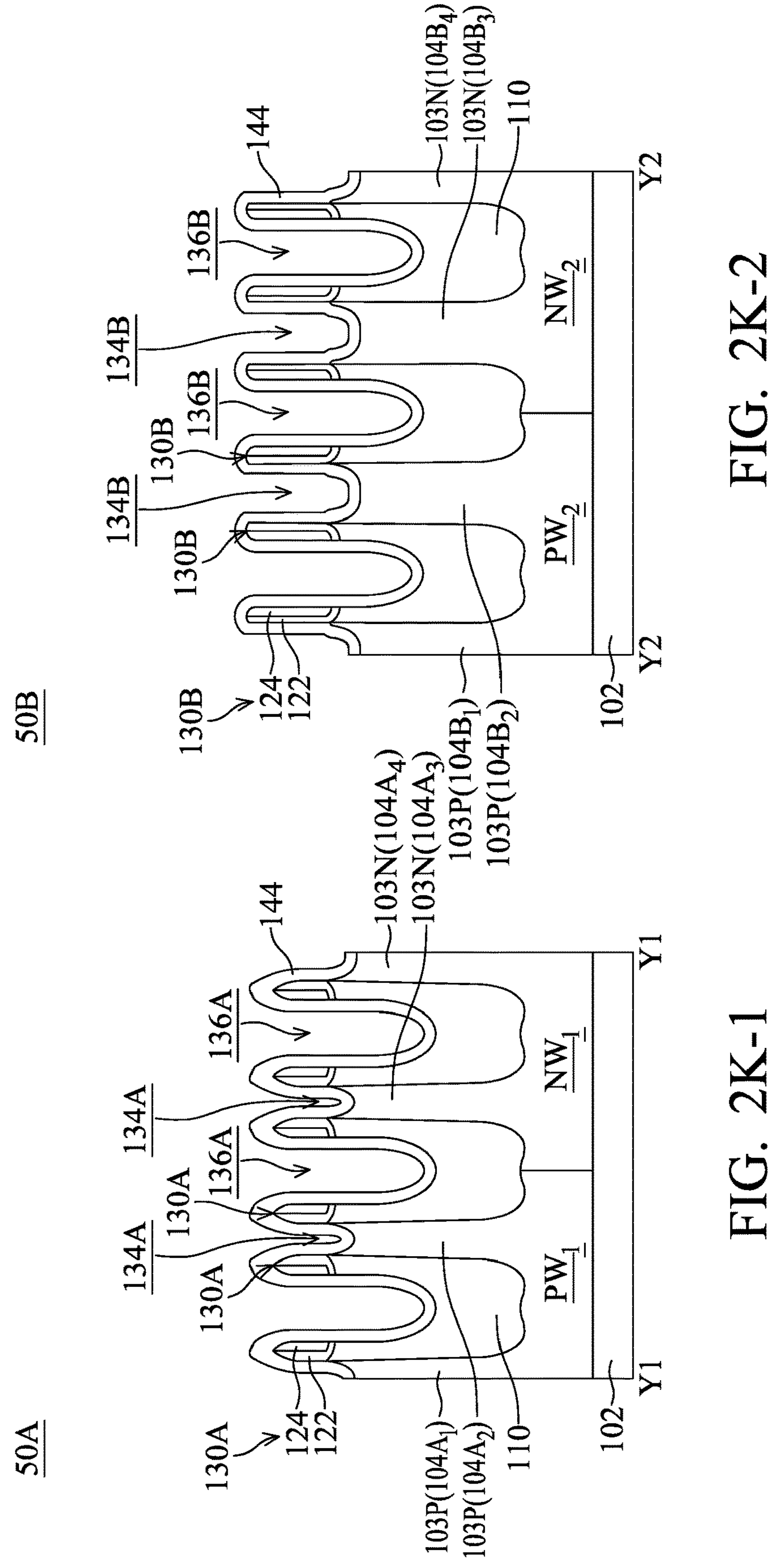
Figures 2, 2K, 3, 4:
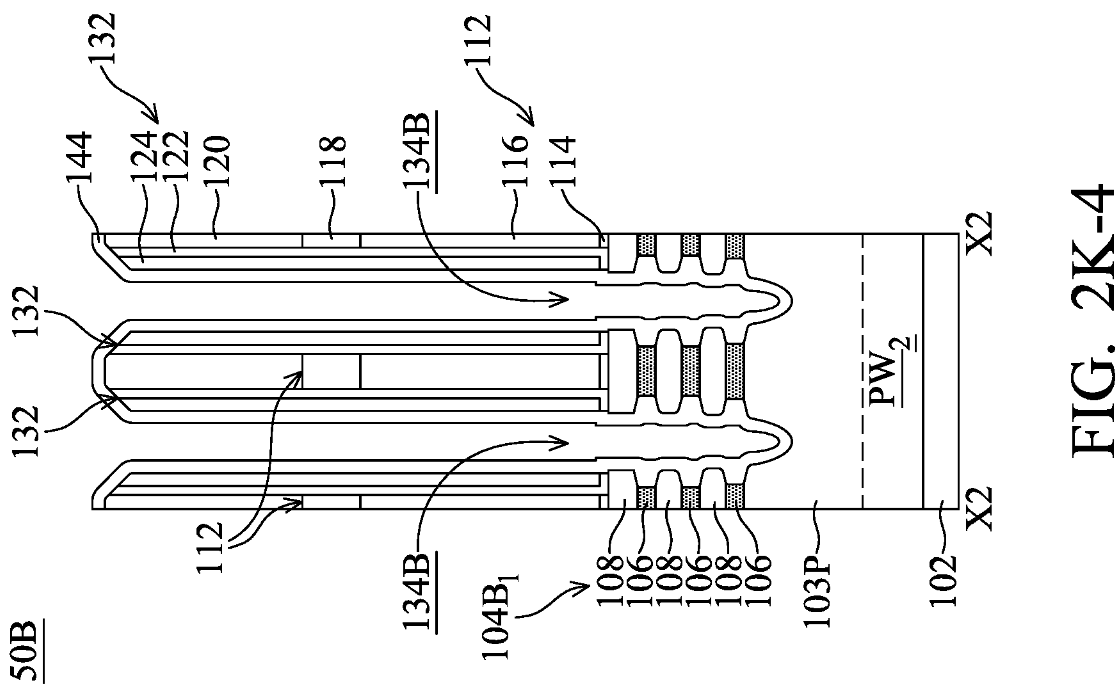
Figures 2, 2K, 3:
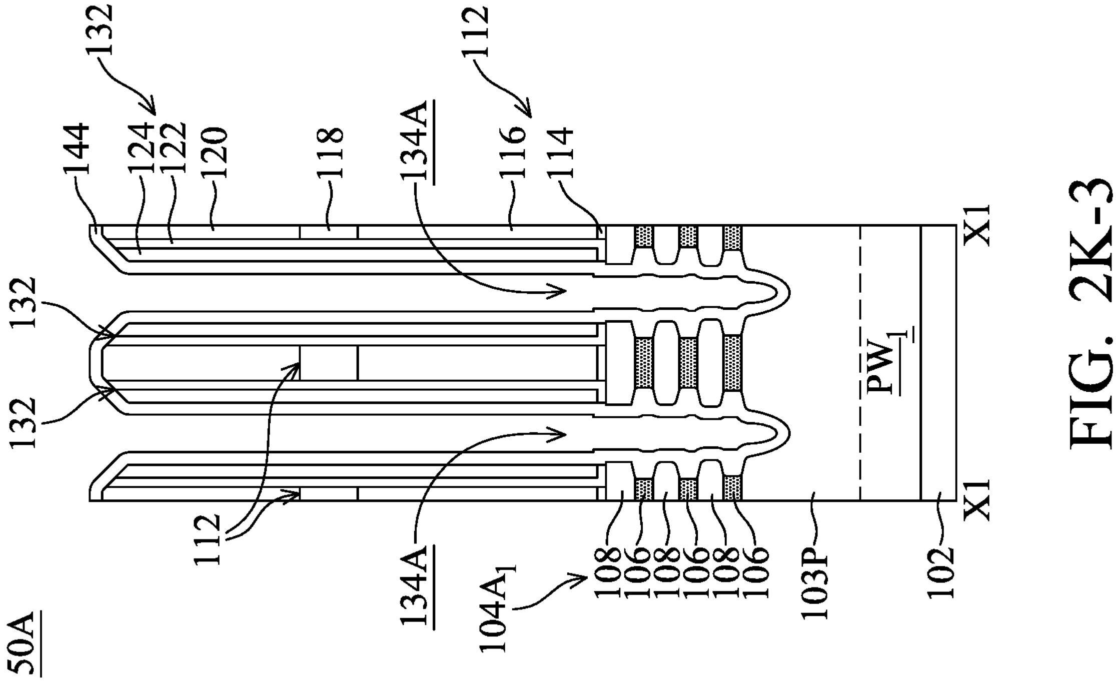
Figures 1, 2, 2L:
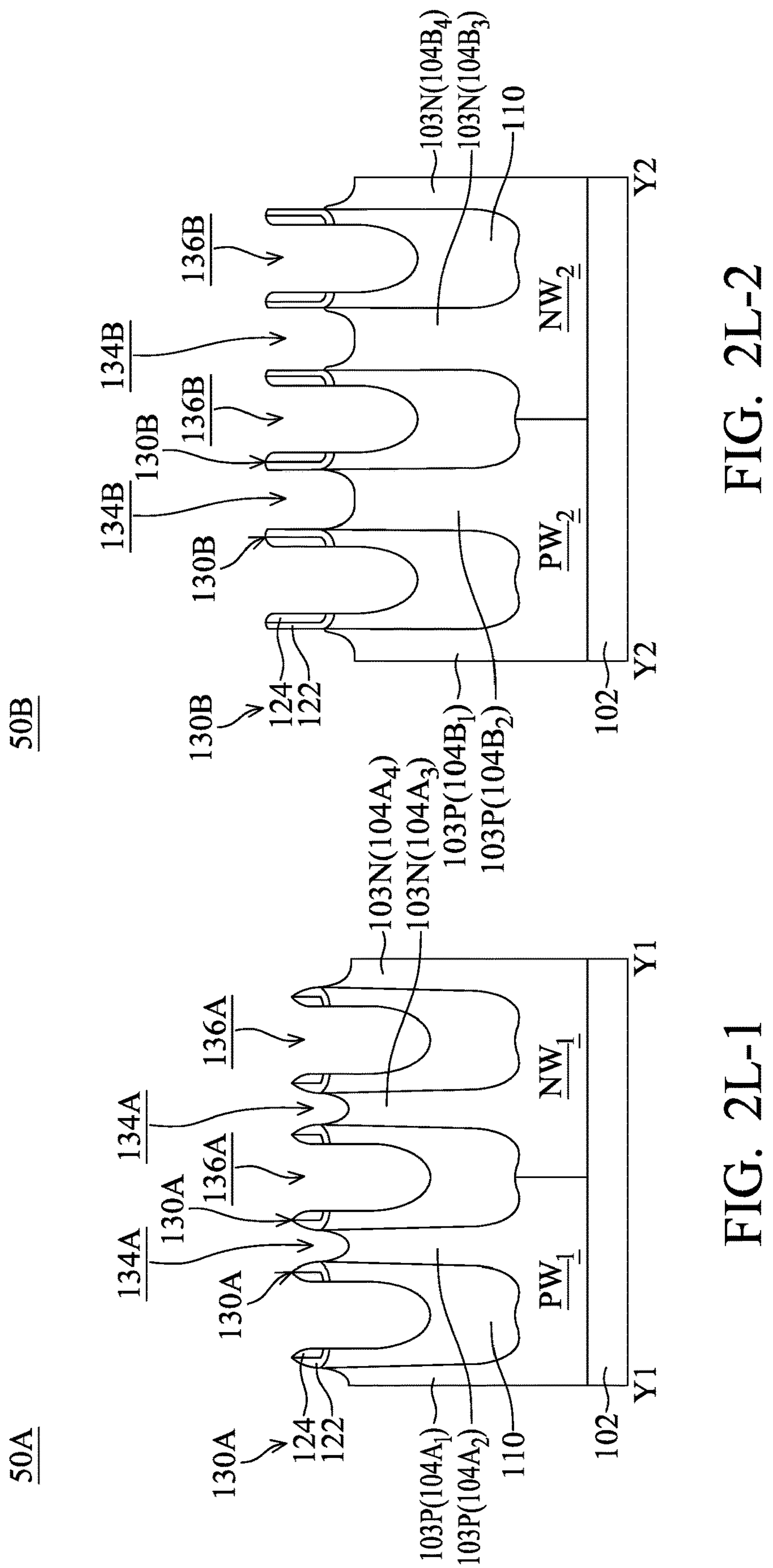
Figures 2, 2L, 3, 4:
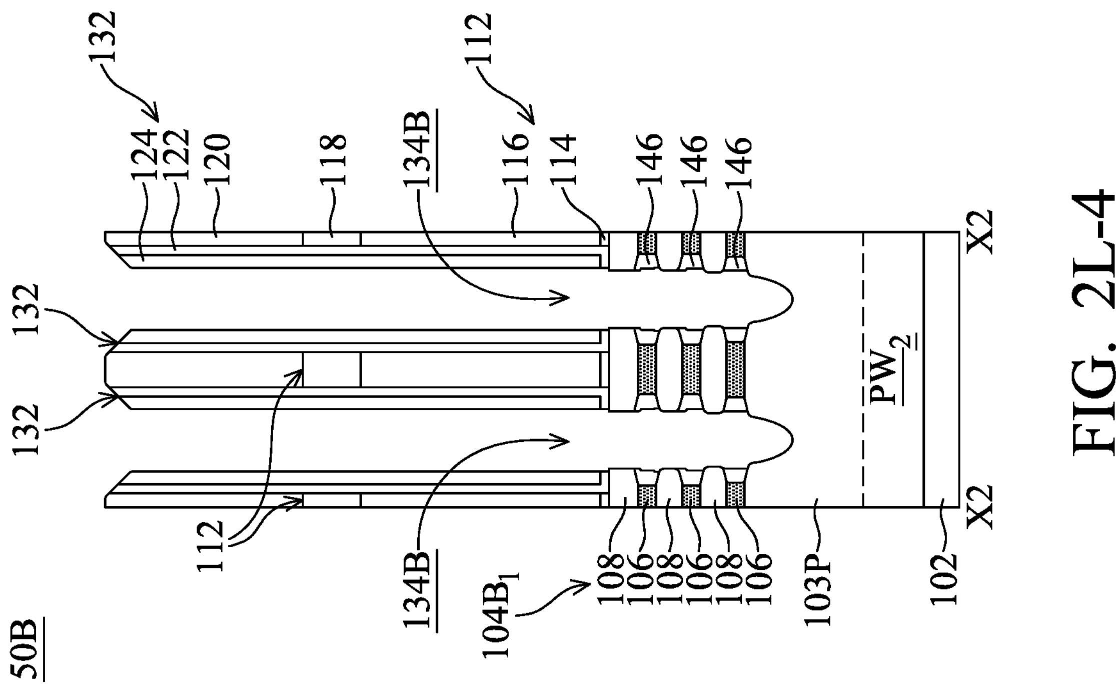
Figures 2, 2L, 3:
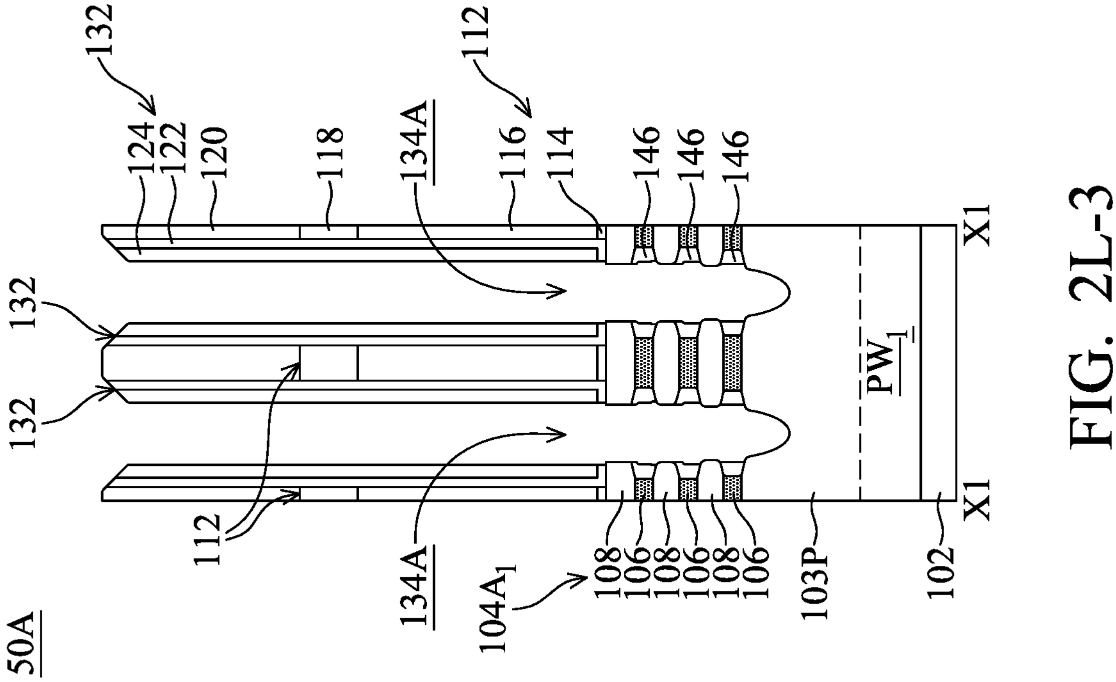
Figures 1, 2, 2M:
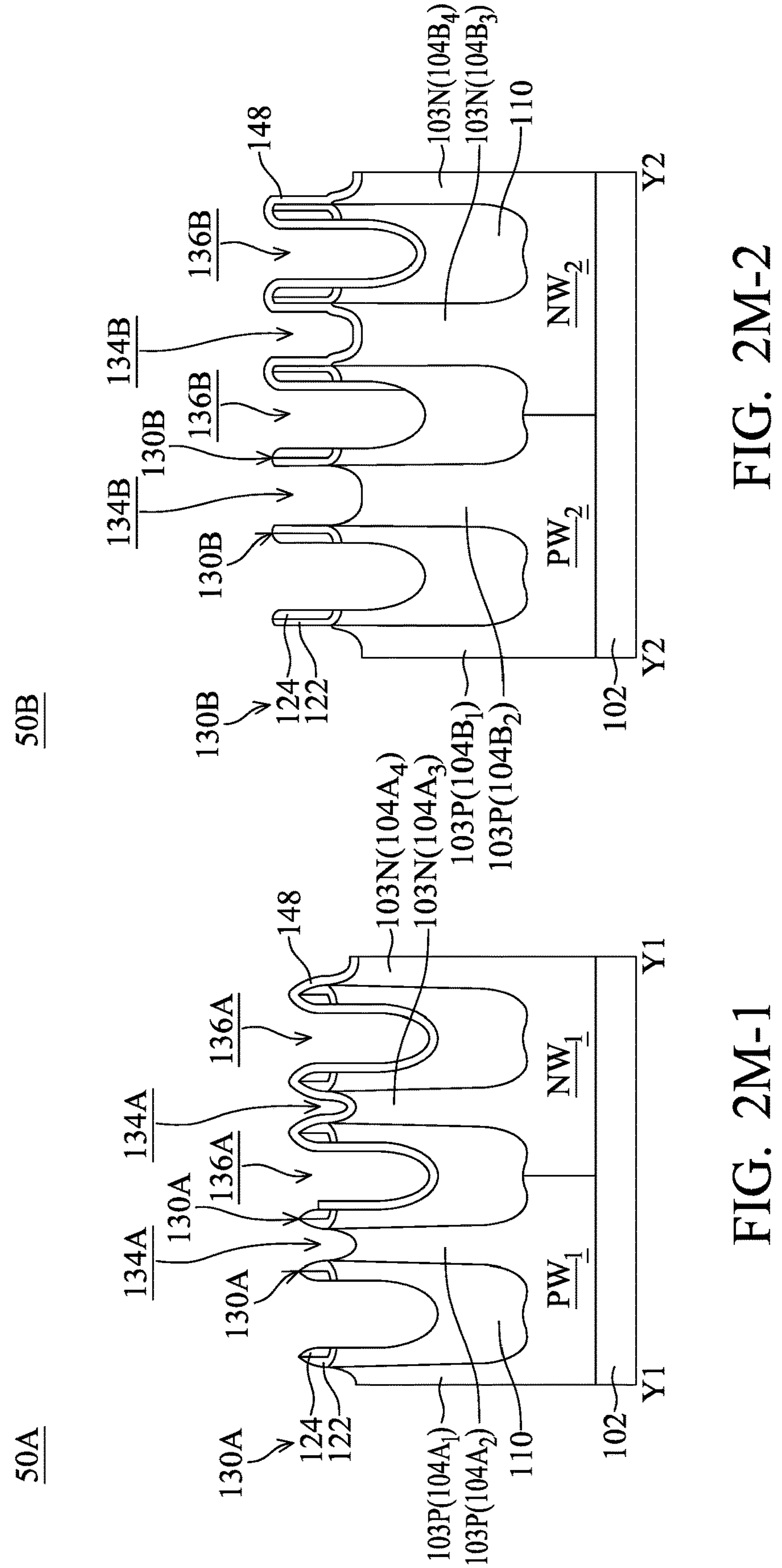
Figures 2, 2M, 3, 4:
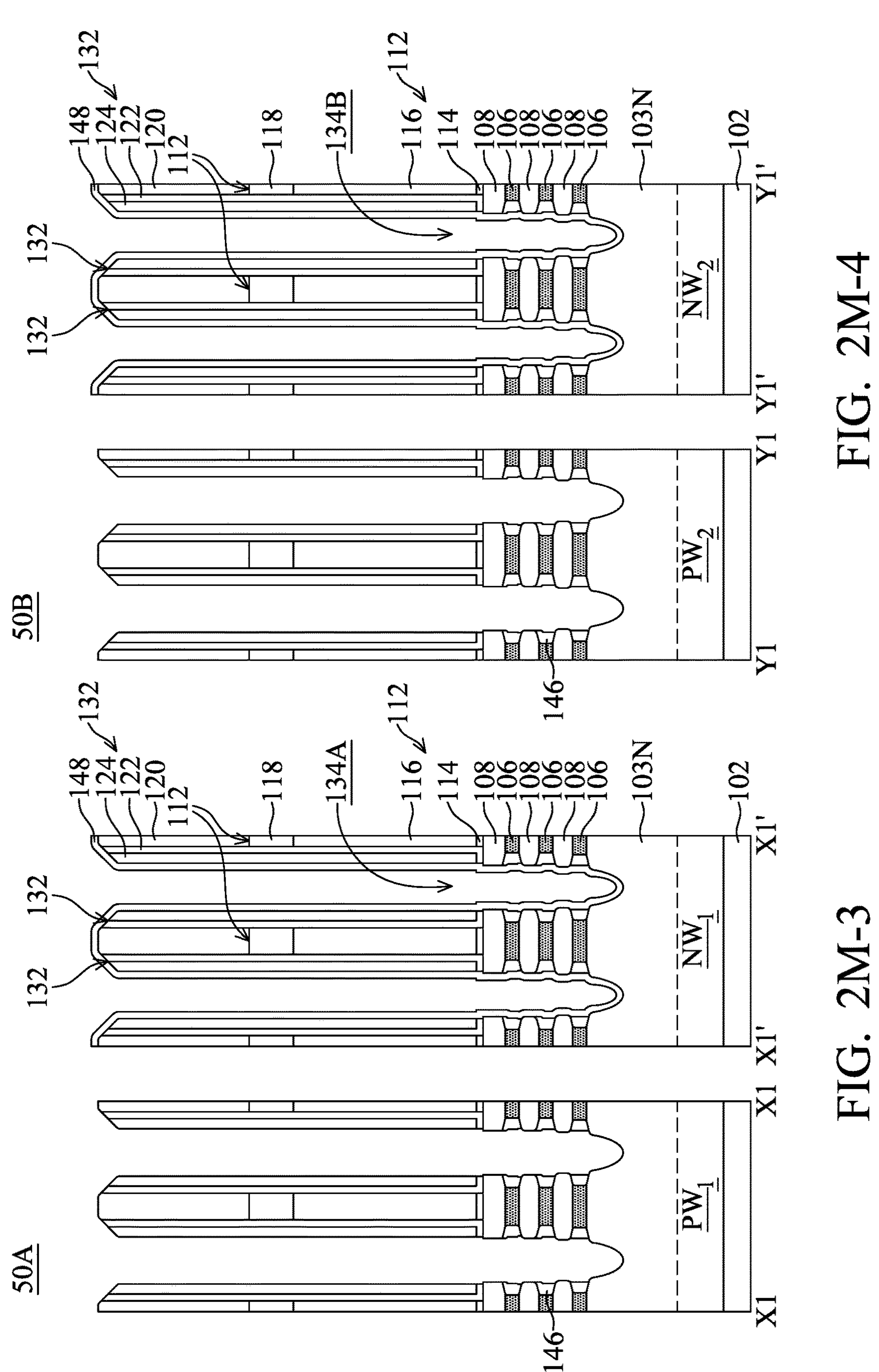
Figures 1, 2, 2N:
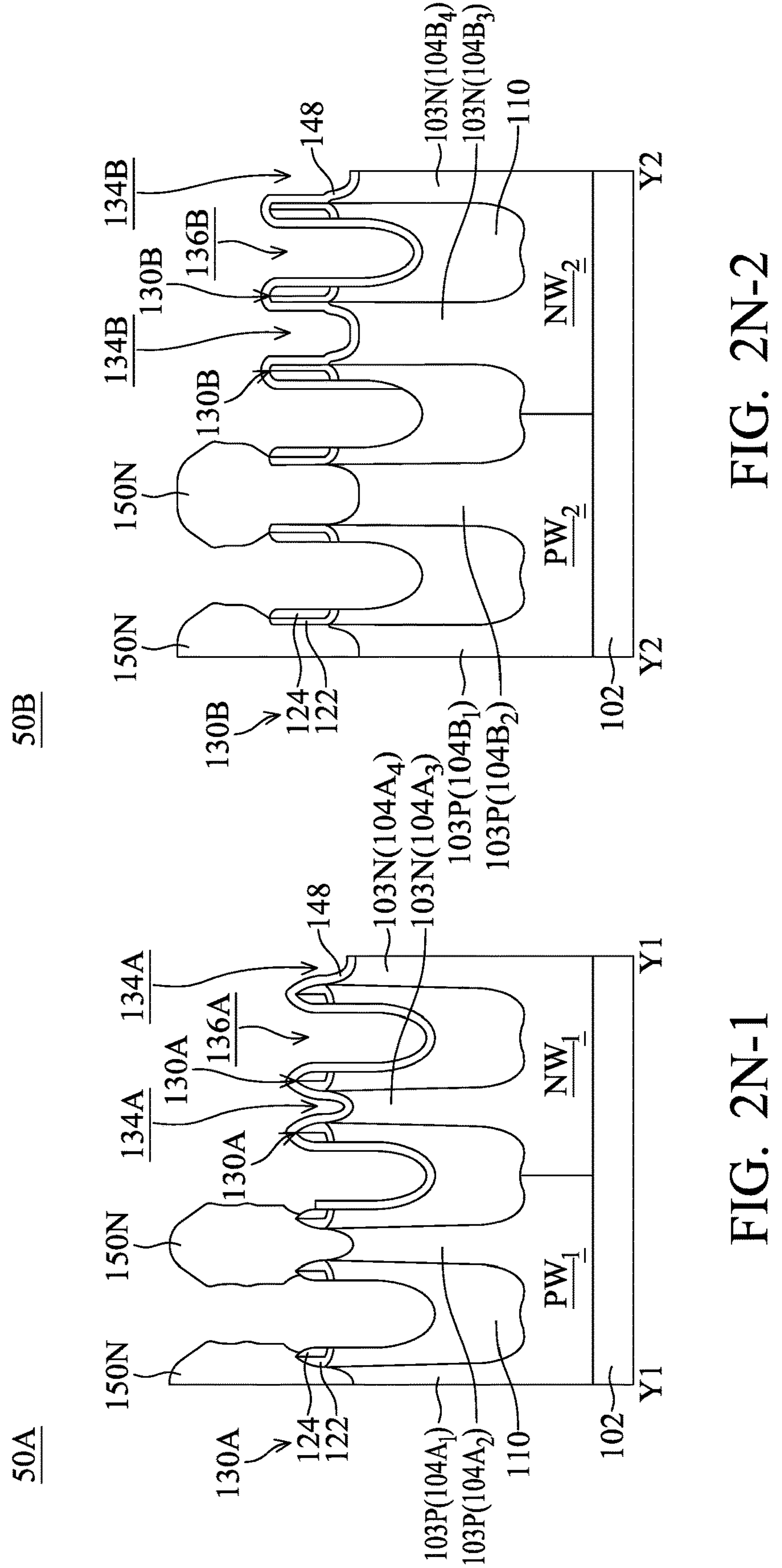
Figures 2, 2N, 3, 4:
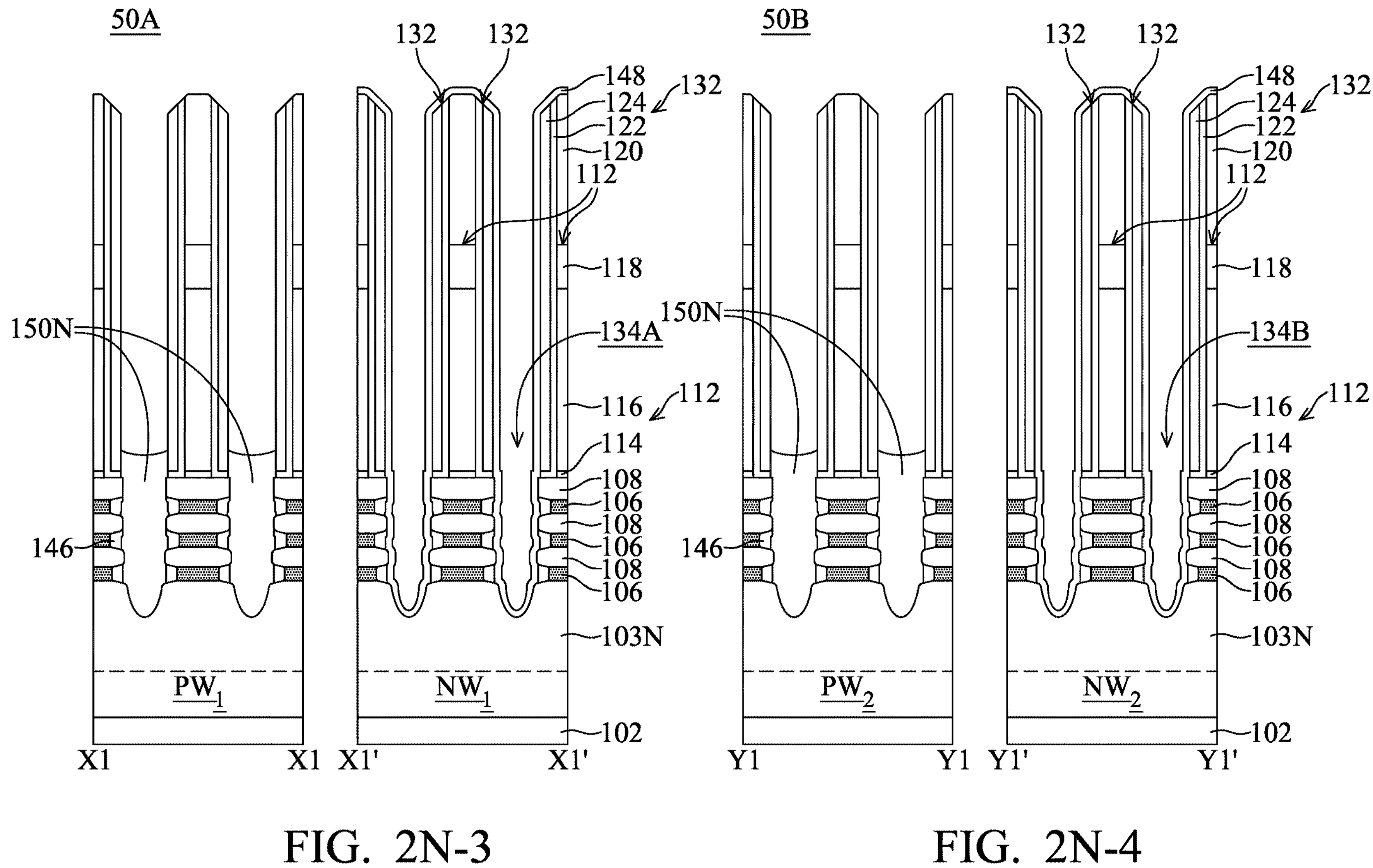
Figures 1, 2, 2O:
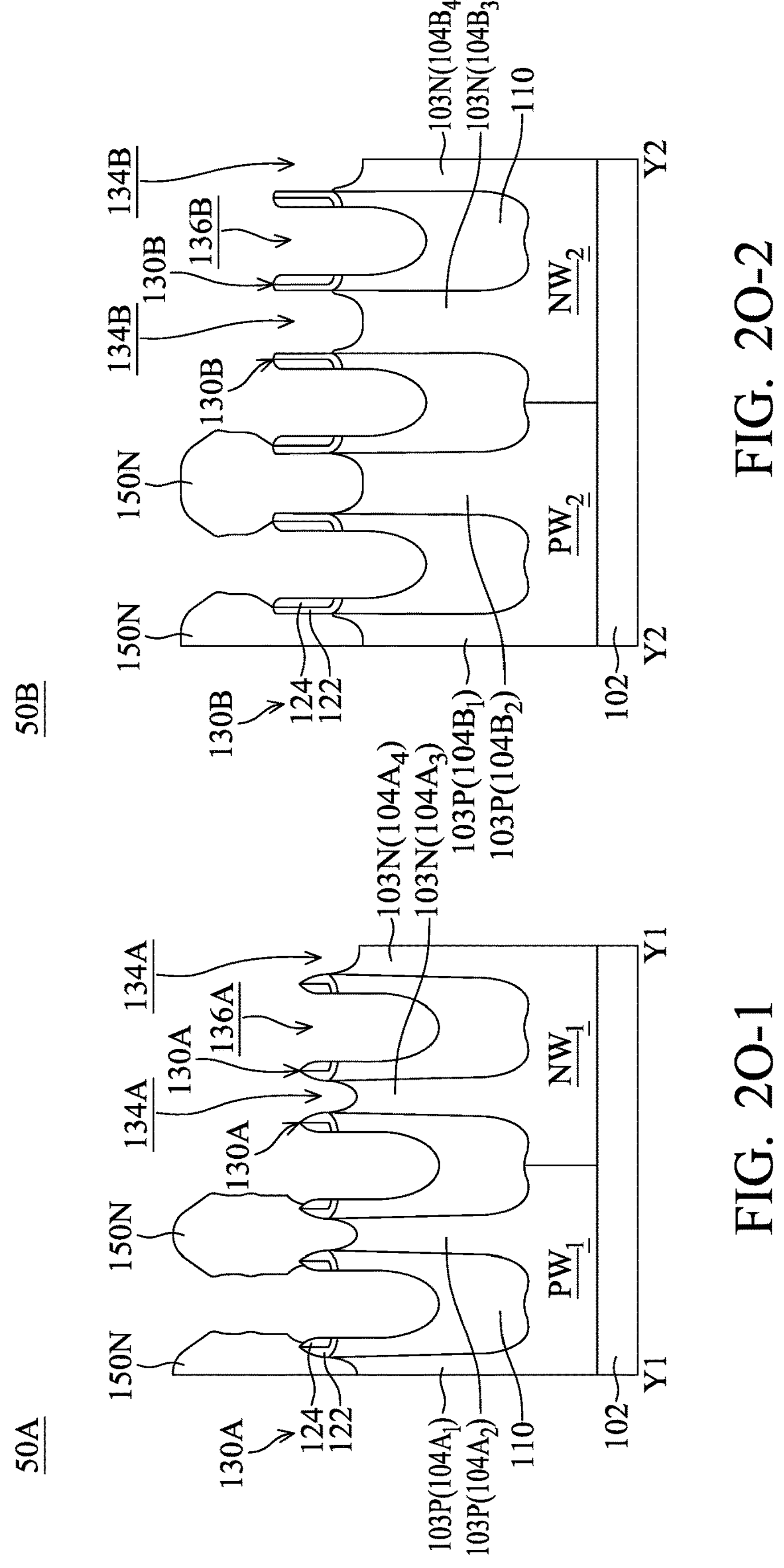
Figures 2, 2O, 3, 4:
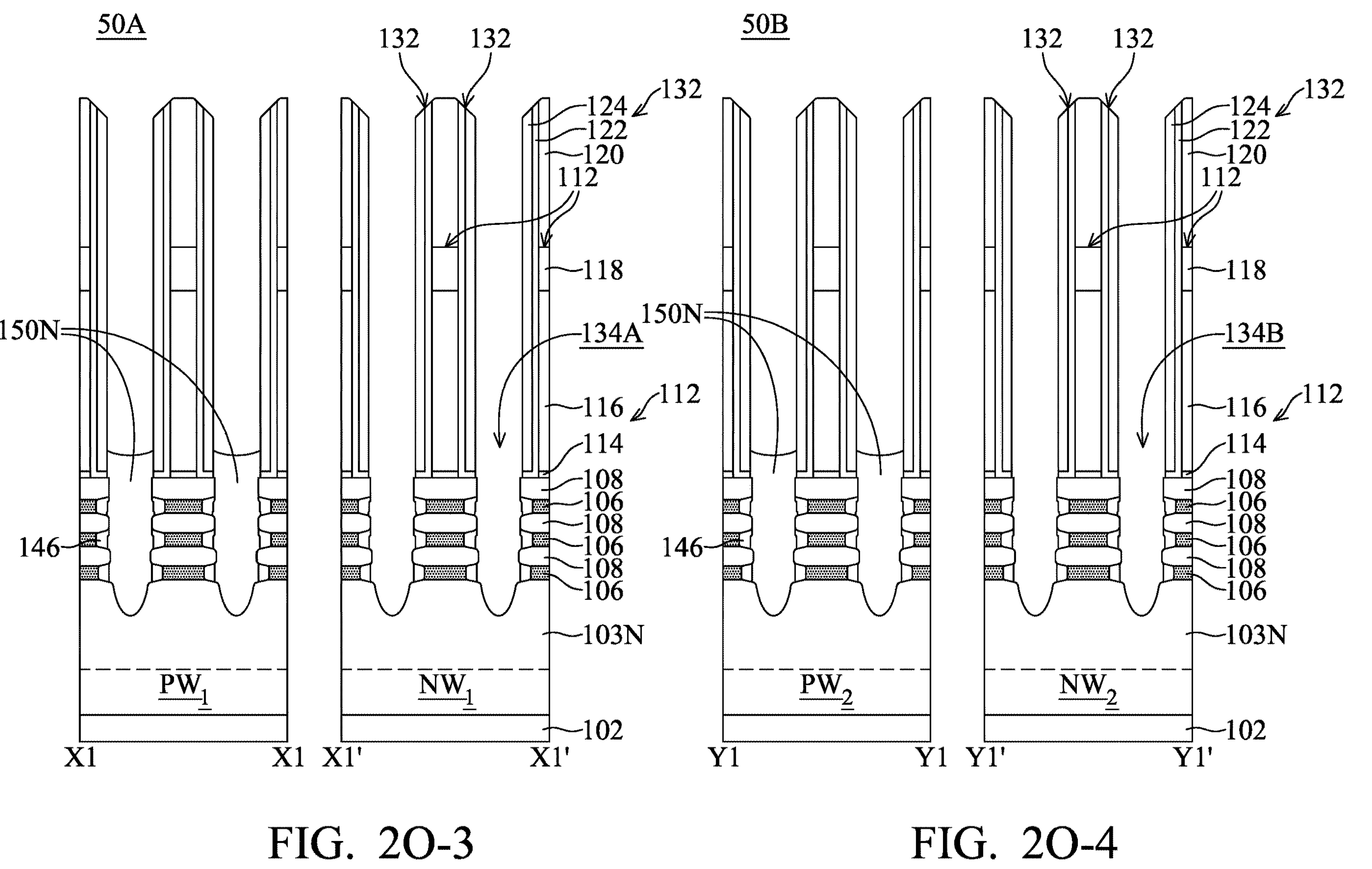
Figures 1, 2, 2P:
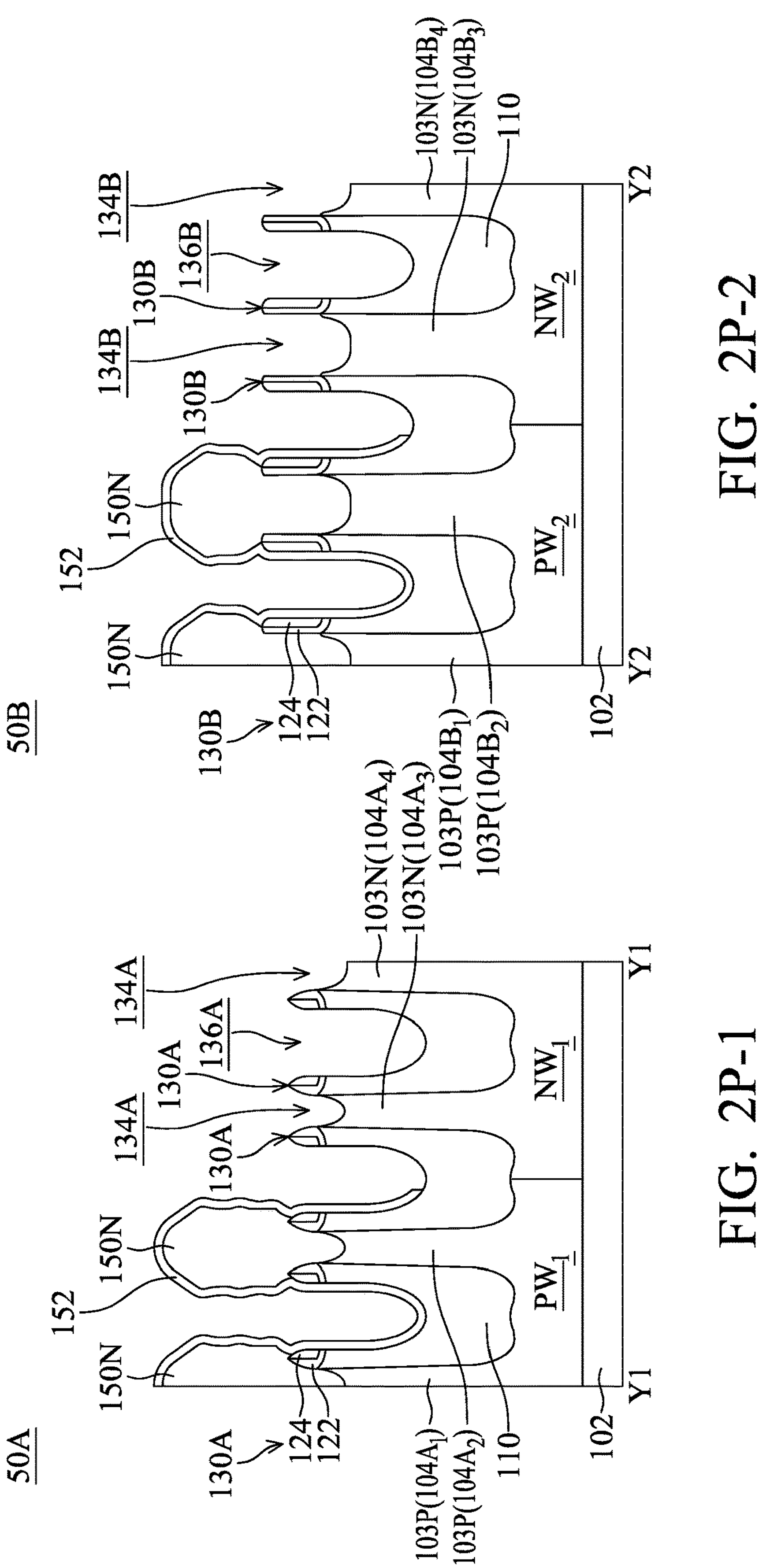
Figures 2, 2P, 3, 4:
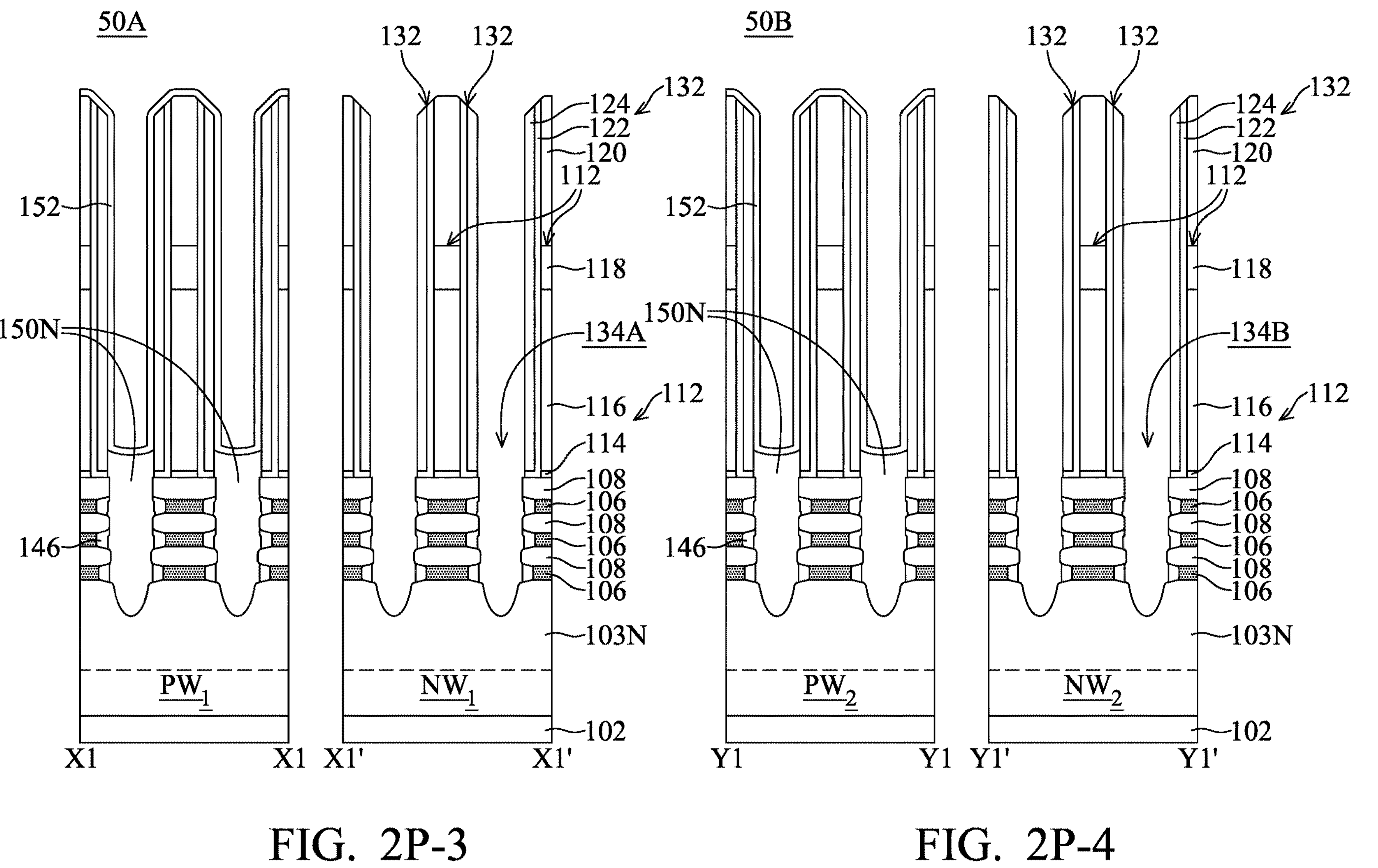
Figures 1, 2, 2Q:
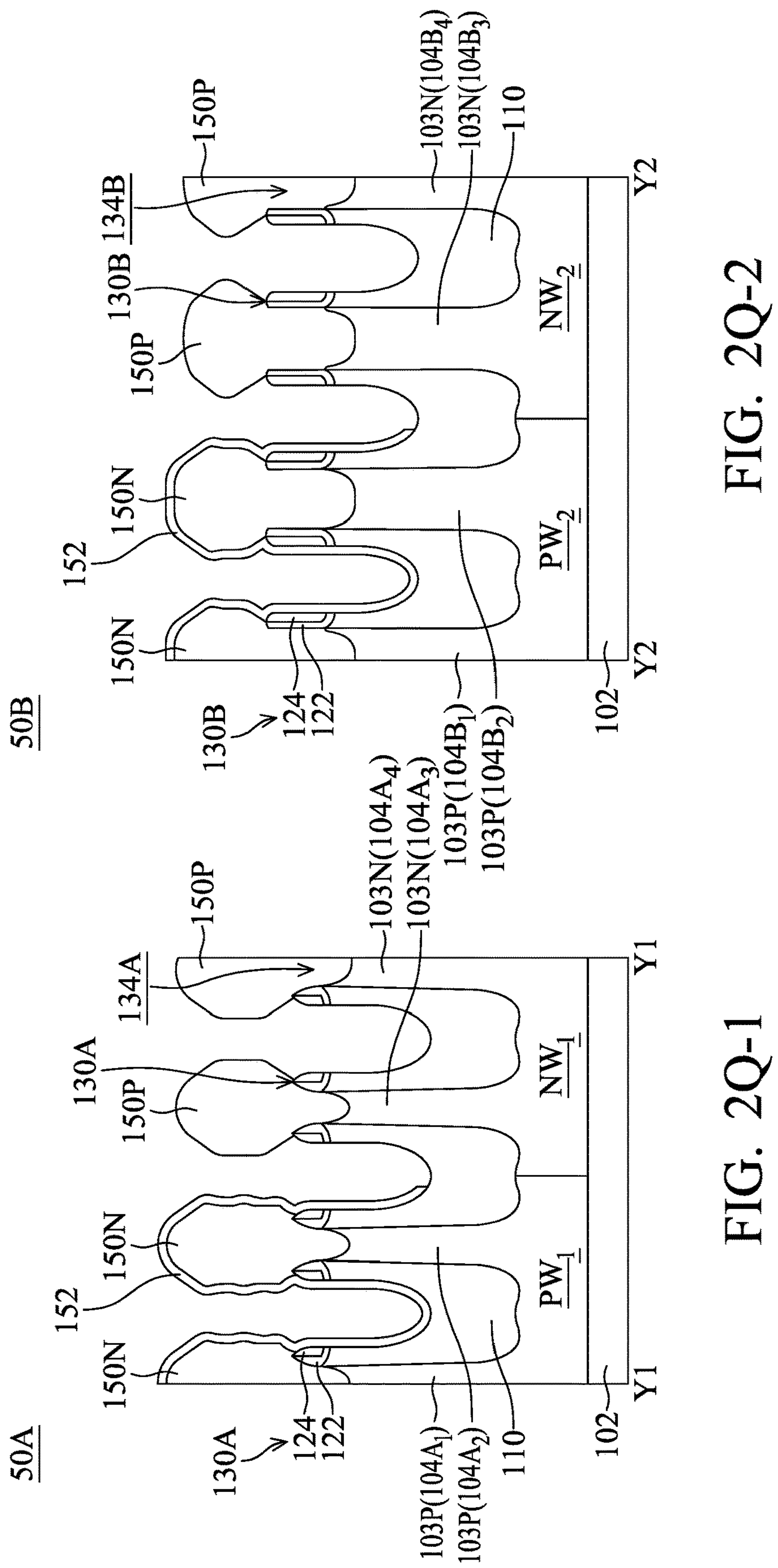
Figures 2, 2Q, 3, 4:
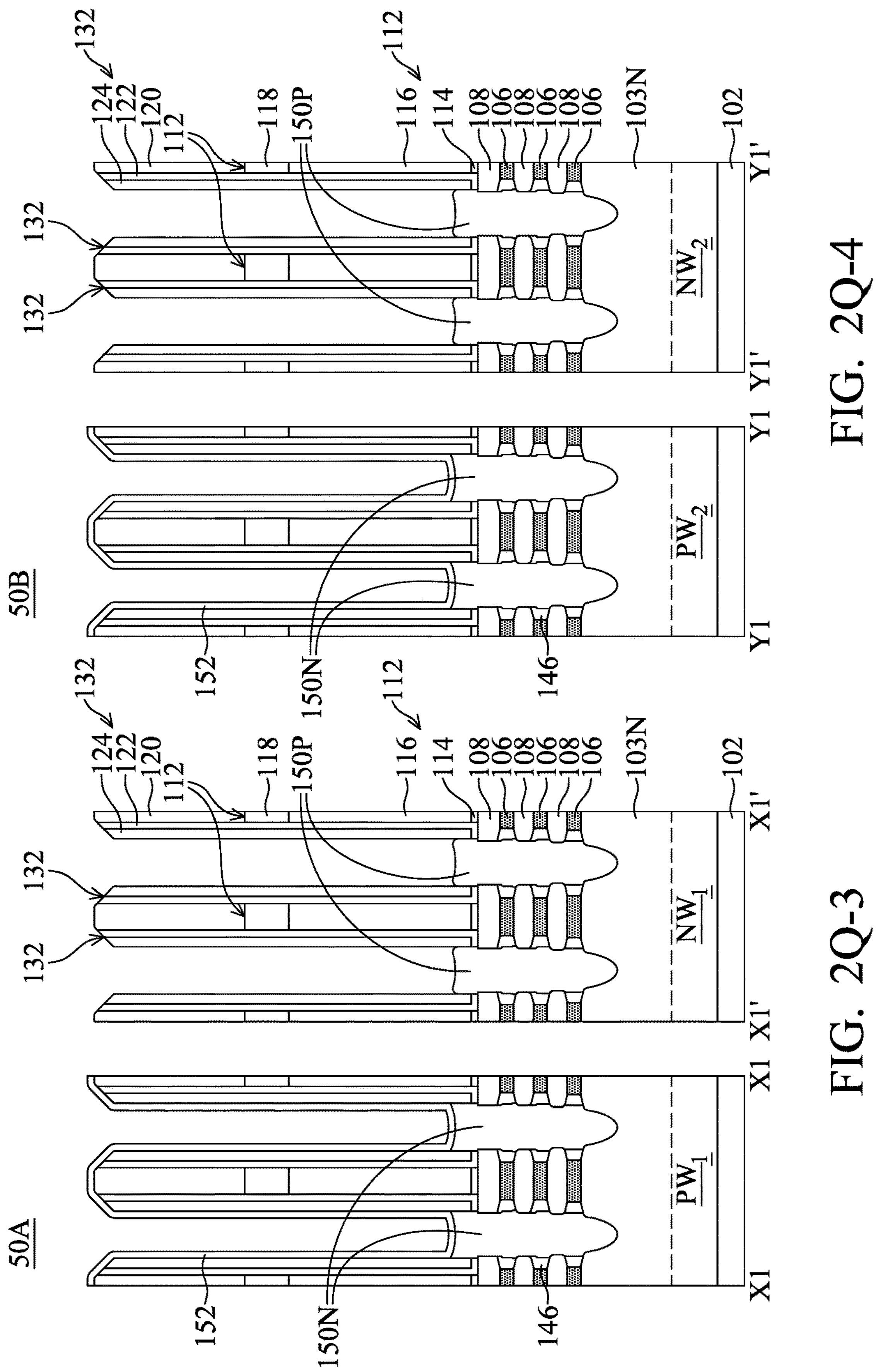
Figures 1, 2, 2R:
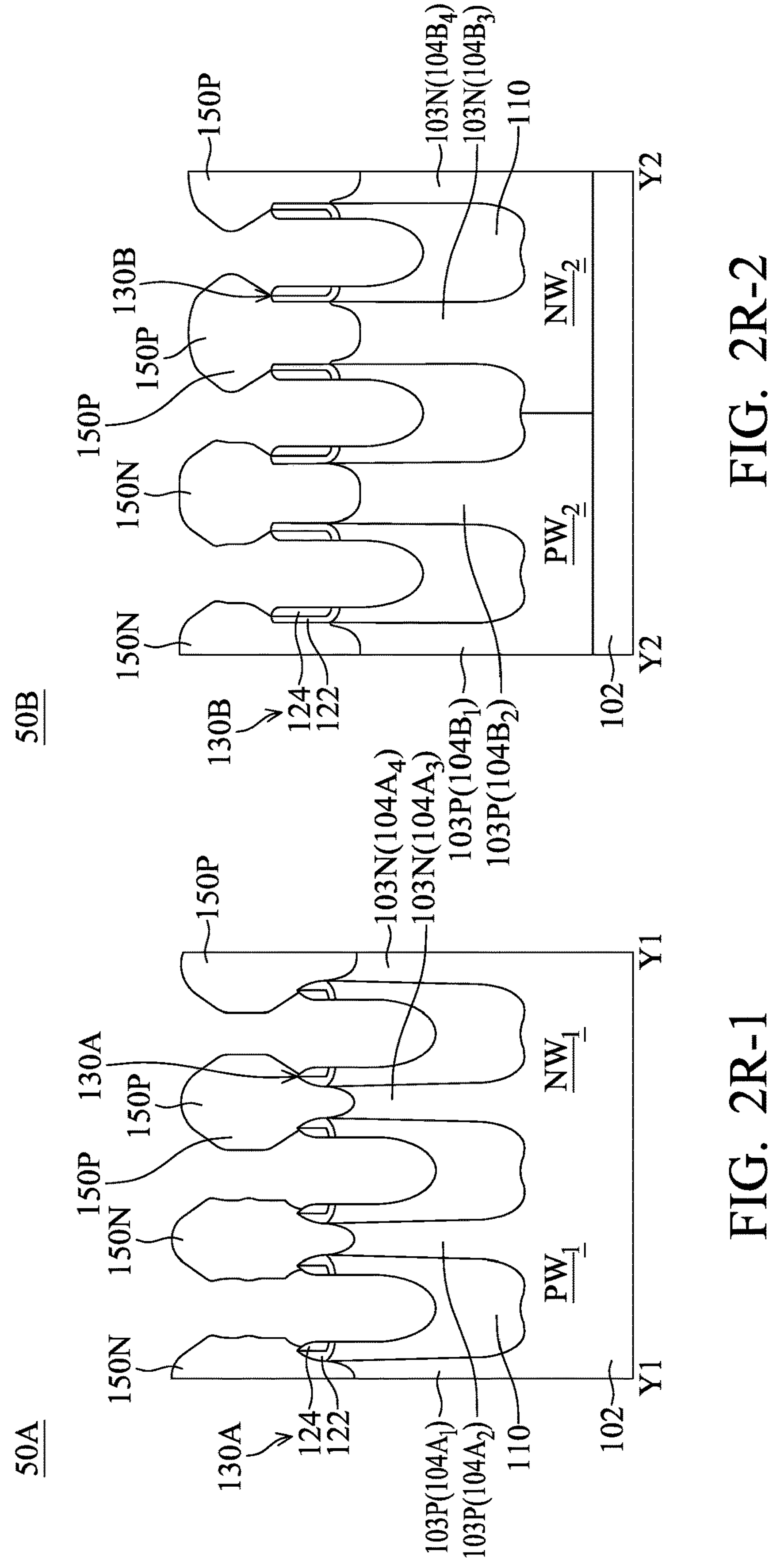
Figures 2, 2R, 3, 4:
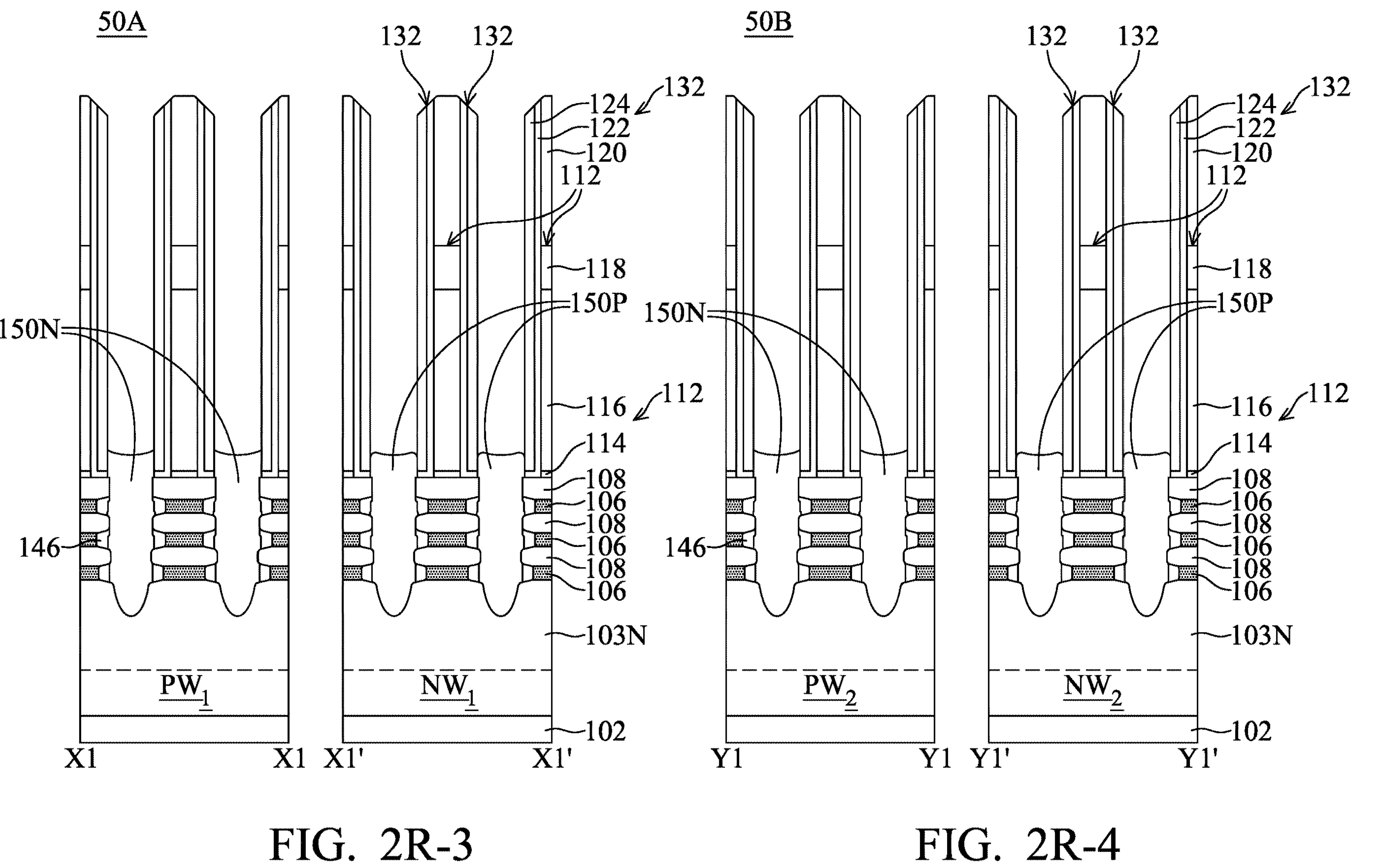
Figures 1, 2, 2S:
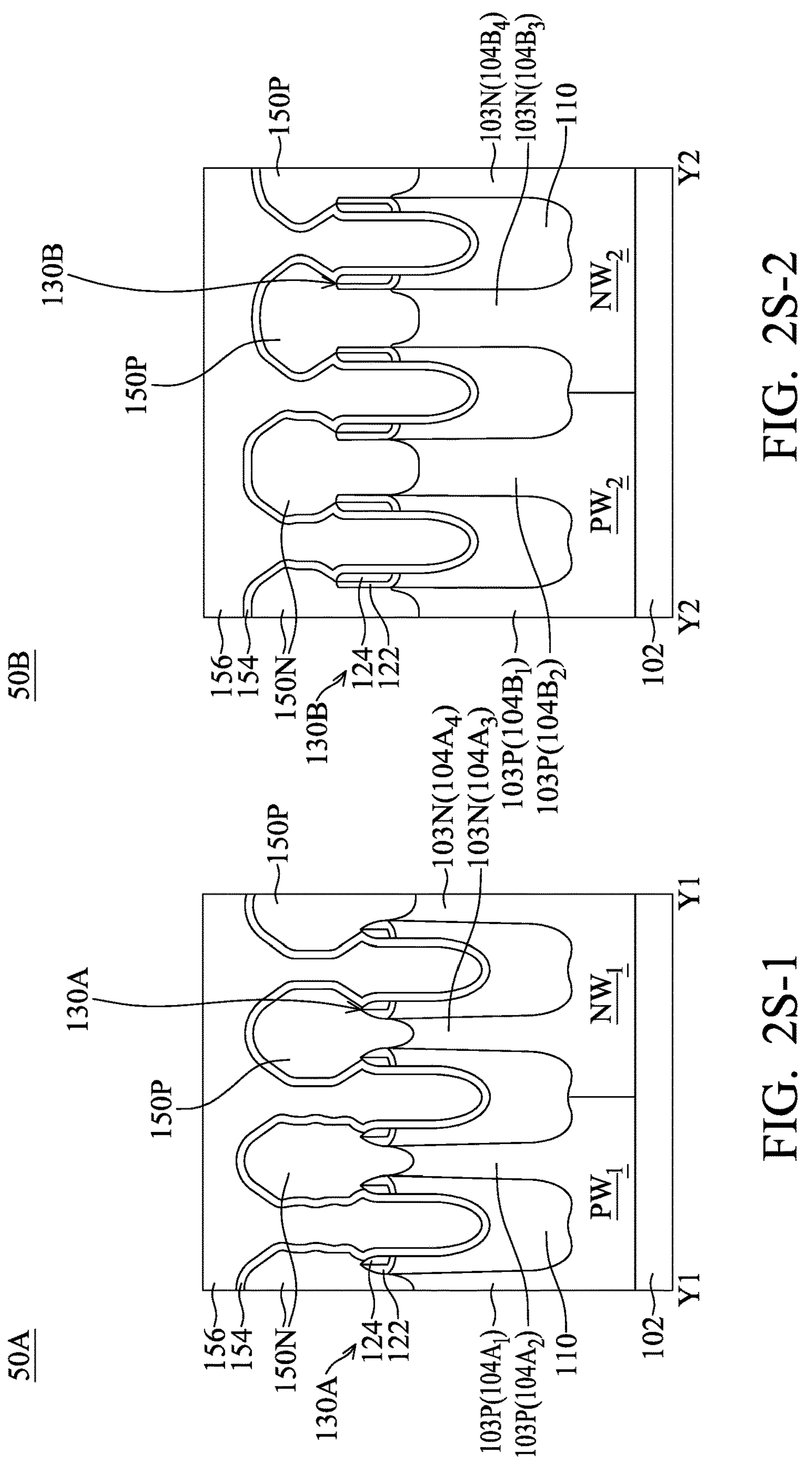
Figures 2, 2S, 3, 4:
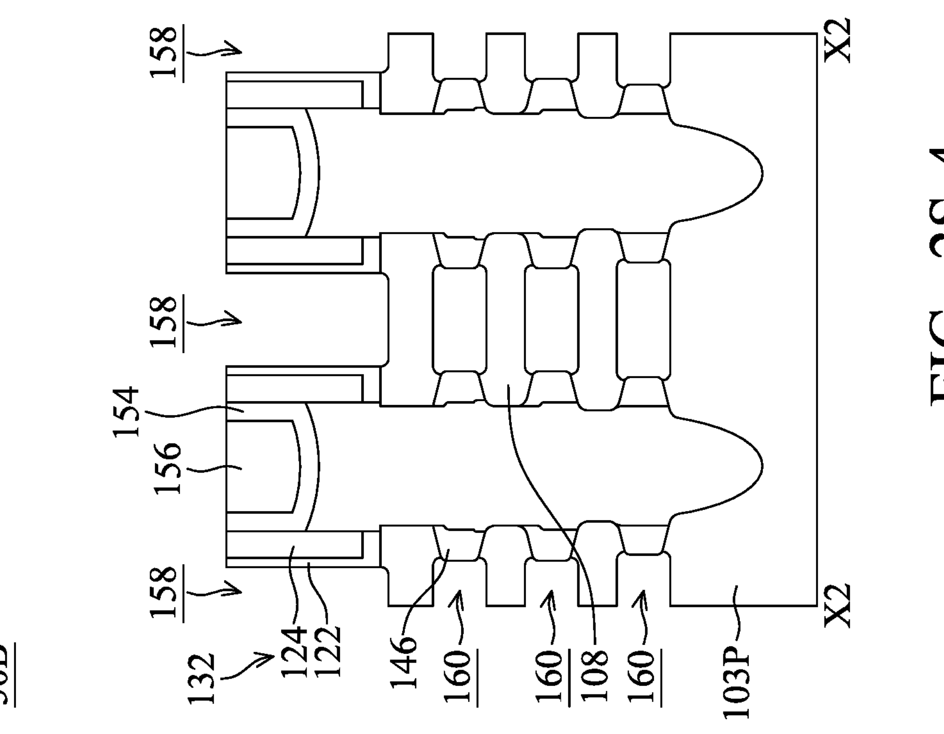
Figure 2T:
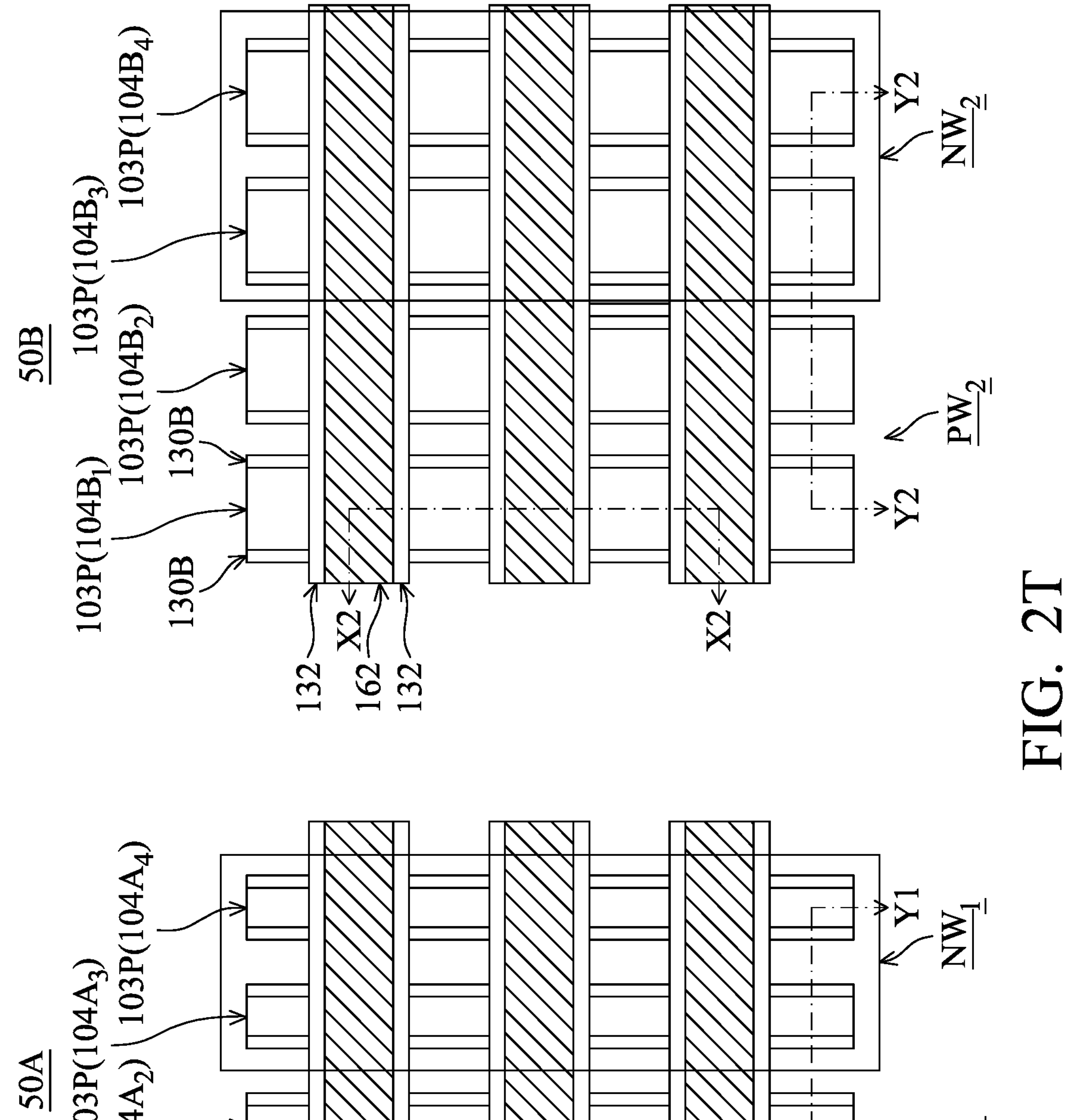
Figures 1, 2, 2T:
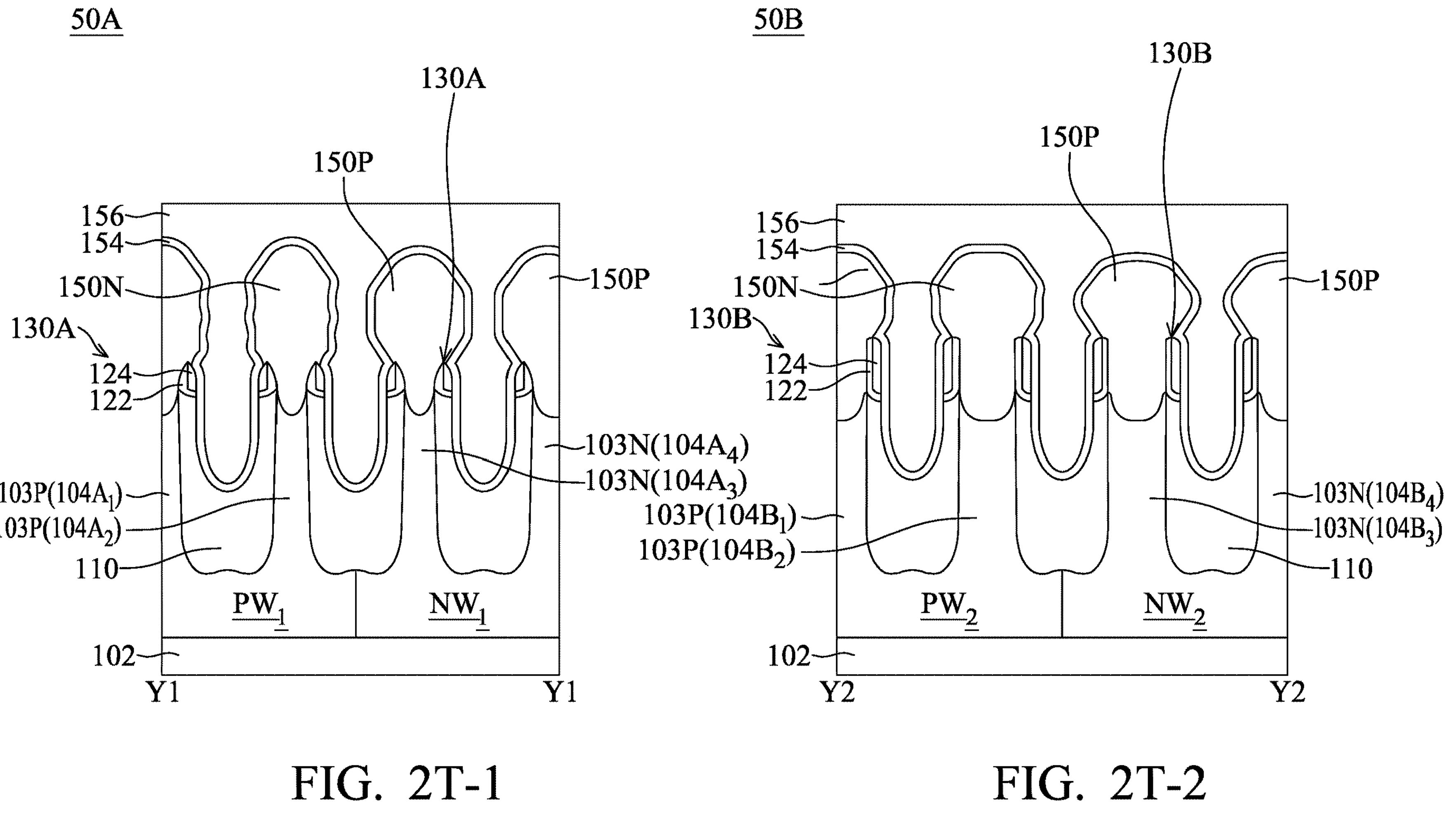
Figures 2, 2T, 3, 4:
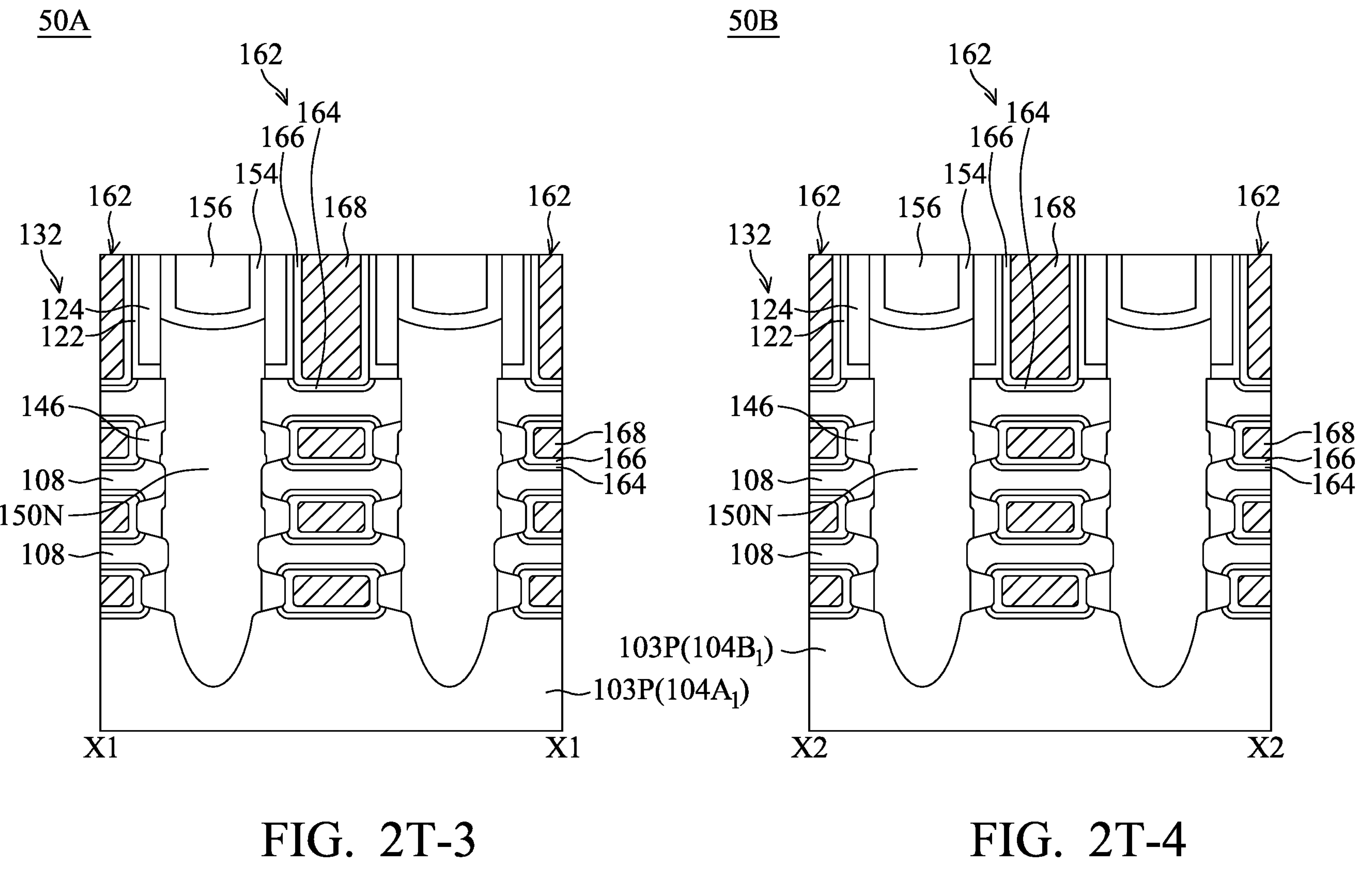
Figures 1, 2, 2U:
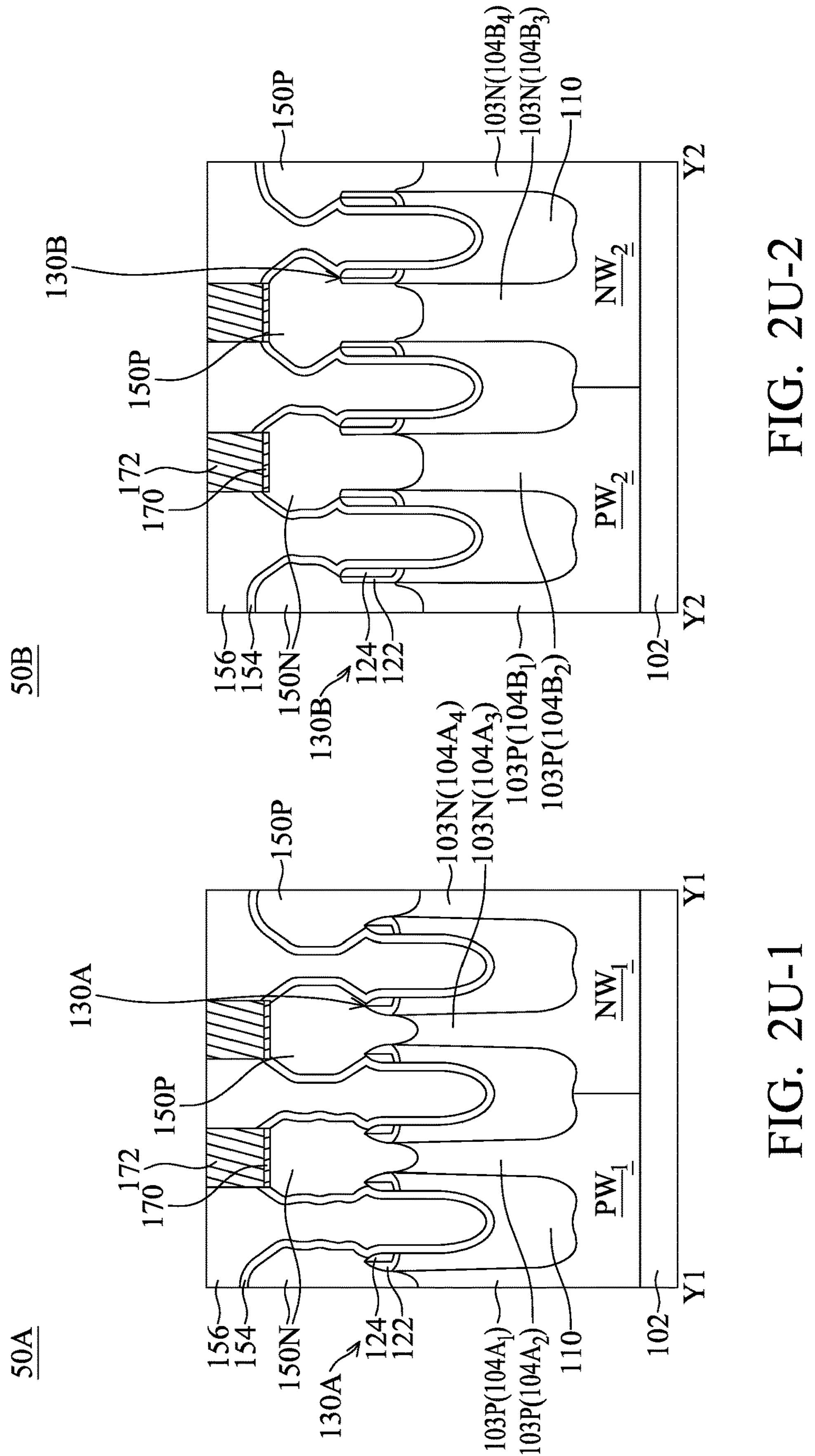
Figures 2, 2U, 3, 4:
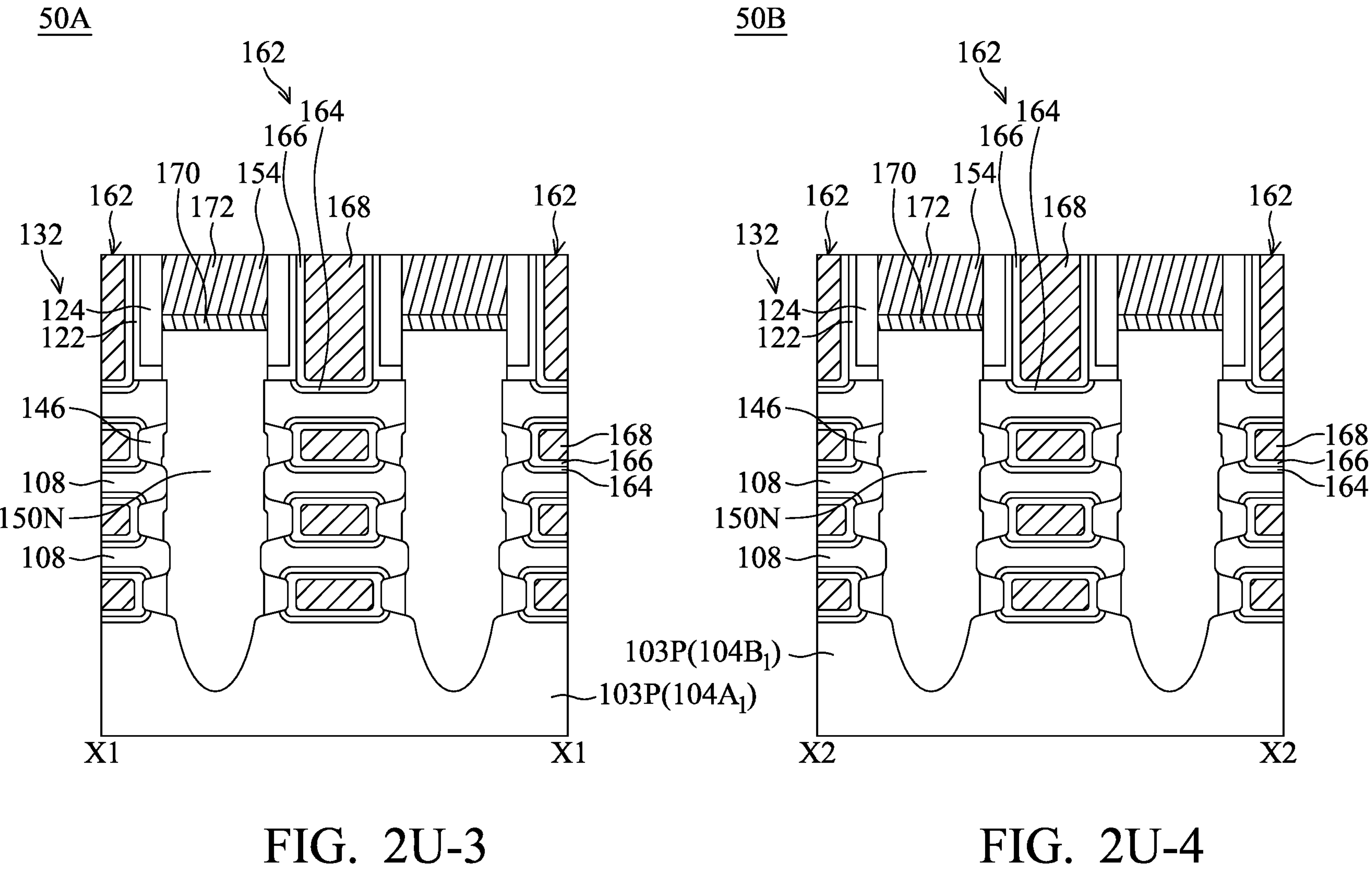

FIGS. 2A through 2U-4 are schematic views illustrating the formation of a semiconductor structure 100 at various intermediate stages, in accordance with some embodiments of the disclosure.

FIGS. 2A through 2A-4 illustrate a semiconductor structure 100 after the formation of fin structures 104, an isolation structure 106 and dummy gate structures 112, in accordance with some embodiments. FIG. 2A is a plan view of the semiconductor structure 100. It should be noted that the plan views in the present disclosure only illustrate some components of the semiconductor structure 100 for illustrative purposes, some other components of the semiconductor structure 100 may be shown in the cross-sectional views.

FIG. 2A illustrates reference cross-sections that are used in later figures. Cross-section Y1-Y1 is in a plane parallel to the Y direction and across the source/drain regions of fin structures 104A. Cross-section Y2-Y2 is in a plane parallel to the Y direction and across the source/drain regions of fin structures 104B. Cross-section X1-X1 is in a plane parallel to the X direction and through a fin structure 104A in a p-type well $PW_1$. Cross-section X1'-X1' is in a plane parallel to the X direction and through a fin structure 104A in an n-type well $NW_1$. Cross-section X2-X2 is in a plane parallel to the X direction and through a fin structure 104B in a p-type well $PW_2$. Cross-section X2'-X2' is in a plane parallel to the X direction and through a fin structure 104B in an n-type well $NW_2$. FIGS. 2A-1, 2A-2, 2A-3 and 2A-4 are cross-sectional views corresponding to line Y1-Y1, line Y2-Y2, line X1-X1 and line X2-X2, respectively.

A semiconductor structure 100 including a substrate 102 and active regions 104 (including 104A and 104B) is provided, as shown in FIGS. 2A through 2A-4, in accordance with some embodiments. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GalnAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

In some embodiments, the active regions 104A are formed in a first device region 50A of the substrate 102, and the active regions 104B are formed in a second device region 50B of the substrate 102. The active regions 104A in the first device region 50A are narrower in width than the active regions 104B in the second device region 50B, in accordance with some embodiments. In some embodiments, the devices formed in the second device region 50B may focus more on device performance, e.g., on-state current, speed, etc., while the devices formed in the first device region 50A may focus more on device density. For example, the device formed on the active regions 104A may be a device requiring low on-state current, while the device formed on the active regions 104A may be a device requiring high on-state current, in accordance with some embodiments.

FIG. 1 shows four active regions 104A in the first device region 50A and four active regions 104B in the second device region 50B, the number of the active regions 104A in the first device region 50A and/or the number of the active regions 104B in the second device region 50B is not limited thereto, and may be dependent on the demands on the design of the semiconductor device and/or performance considerations.

N-type wells NW and p-type wells PW are formed in the substrate 102, as shown in FIGS. 2A through 2A-4, in accordance with some embodiments. In some embodiments, the wells $NW_1$ and $PW_1$ are formed in the first device region 50A, and the wells $NW_2$ and $PW_2$ are formed in the second device region 50B. In some embodiments, the wells NW and PW are formed by ion implantation processes. For example, a patterned mask layer (such as a photoresist layer and/or a hard mask layer) is formed to cover regions of the substrate 102 where the p-type wells are predetermined to be formed, and then n-type dopants (such as phosphorus or arsenic) are implanted into the substrate 102, thereby forming the n-type wells $NW_1$ and $NW_2$, in accordance with some embodiments. Afterward, the patterned mask layer may be removed.

Similarly, a patterned mask layer (such as photoresist layer and/or hard mask layer) is formed to cover regions of the substrate 102 where the n-type wells are predetermined to be formed, and then p-type dopants (such as boron or $BF_2$) are implanted into the substrate 102, thereby forming the p-type wells $PW_1$ and $PW_2$, in accordance with some embodiments. Afterward, the patterned mask layer may be removed.

In some embodiments, the respective concentrations of the dopants in the wells NW and PW are in a range from about $10^{16}/cm^{-3}$ to about $10^{18}/cm^{-3}$. In some embodiments, the ion implantation processes may be performed several times with different dosages and different energy intensities. In some embodiments, the ion implantation process may include anti-punch through (APT) implant.

The active regions 104A 1 and 104A 2 are formed over the p-type well $PW_1$, and active regions 104A 3 and 104A 4 are formed over the n-type well $NW_1$, in accordance with some embodiments. The active regions 104B 1 and 104B 2 are formed over the p-type well $PW_2$, and active regions 104B 3 and 104B 4 are formed over the n-type well $NW_2$, in accordance with some embodiments. The number of the fin structures in the wells may be dependent on the demands on the design of the semiconductor device and/or performance considerations In some embodiments, the active regions 104A and 104B extend in the X direction. The fin structures 104A and 104B have longitudinal axes parallel to the X direction, in accordance with some embodiments. That is, the dimensions (lengths) of the fin structures 104A and 104B in the X direction are greater than the dimensions (widths) of the fin structures 104A and 104B in the Y direction.

The formation of the active regions 104A and 104B includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor devices (such as nanostructure transistors), in accordance with some embodiments. Although three first semiconductor layers 106 and three second semiconductor layers 108 are shown in FIGS. 2B-1 and 2B-2, the number is not limited to three, and can be two or four, and is less than ten.

The formation of the active regions 104A and 104B further includes patterning the epitaxial stack and underlying wells PW and NW using photolithography and etching processes, thereby forming trenches and the active regions 104A and 104B protruding from between trenches, in accordance with some embodiments. The portion of the p-type wells $PW_1$ and $PW_2$ protruding from between the trenches serves as lower fin elements 103P of the active regions 104$A_1$, 104$A_2$, 104$B_1$ and 104$B_2$, and the portion of the n-type wells $NW_1$ and $NW_2$ protruding from between the trenches serves as lower fin elements 103N of the active regions 104$A_3$, 104$A_4$, 104$B_3$ and 104$B_4$, in accordance with some embodiments. A remainder of the epitaxial stack (including the first semiconductor layers 106 and the second semiconductor layers 108) serves as the upper fin elements of the active regions 104A and 104B, in accordance with some embodiments. In some embodiments, the active regions 104A and 104B are the fin structure 104 as shown in FIG. 1.

In some embodiments, the fin structures 104A have a width W1 (e.g., the dimension in the X direction) as measured at the top surface of the topmost second semiconductor layer 108. In some embodiments, the dimension W1 is less than about 18 nm, e.g., in a range from about 5 nm to about 18 nm. In some embodiments, the fin structures 104B are wider than the fin structures 104A and have a width (e.g., the dimension in the X direction) as measured at the top surface of the topmost second semiconductor layer 108. In some embodiments, the dimension W2 is greater than about 18 nm, e.g., in a range from about 20 nm to about 100 nm. In some embodiments, the ratio of the dimension W2 to the dimension W1 is in a range from about 1.1 to about 20.

An isolation structure 110 is formed to surround the lower fin elements 103P and 103N of the active regions 104A and 104B, as shown in FIGS. 2A-1 and 2A-2, in accordance with some embodiments. The bottom surface of the isolation structure 110 is illustrated as a dashed line in FIGS. 2A-3 and 2A-4. The isolation structure 110 is configured to electrically isolate active regions the active regions 104 of the semiconductor structure 100 and is also referred to as shallow trench isolation (STI) feature, in accordance with some embodiments.

The formation of the isolation structure 110 includes forming an insulating material to overfill the trenches, in accordance with some embodiments. In some embodiments, the insulating material is made of silicon oxide ($SiO_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as flowable CVD (FCVD), low-pressure CVD (LPCVD), plasma-enhanced CVD (PECVD), high density plasma CVD (HDP-CVD), or high aspect ratio process (HARP)), atomic layer deposition (ALD), another suitable technique, or a combination thereof.

A planarization process is performed on the insulating material to remove a portion of the insulating material above the active regions 104A and 104B, in accordance with some embodiments. The planarization may be chemical mechanical polishing (CMP), etching back process, or a combination thereof. The insulating material is then recessed by an etching process (such as dry plasma etching and/or wet chemical etching) until the sidewalls of the upper fin elements of the active regions 104A and 104B are exposed, in accordance with some embodiments. The recessed insulating material serves as the isolation structure 110, in accordance with some embodiments.

Dummy gate structures 112 are formed across the active regions 104, as shown in FIGS. 2A, 2A-3 and 2A-4. The dummy gate structures 112 are configured as sacrificial structures and will be replaced with the final gate stacks, in accordance with some embodiments. In some embodiments, the dummy gate structures 112 extend in the Y direction. That is, the dummy gate structures 112 have longitudinal axes parallel to the Y direction, in accordance with some embodiments. That is, the dimensions (lengths) of the dummy gate structures 112 in the Y direction are greater than the dimensions (widths) of the dummy gate structures 112 in the X direction. The dummy gate structures 112 surround the channel regions of the active regions 104, in accordance with some embodiments. The dummy gate structures 112 may be the gate structures 112 shown in FIG. 1.

Each of the dummy gate structures 112 includes a dummy gate dielectric layer 114 and a dummy gate electrode layer 116 formed over the dummy gate dielectric layer 114, as shown in FIGS. 2A-3 and 2A-4, in accordance with some embodiments. In some embodiments, the dummy gate dielectric layer 114 is conformally formed along the upper fin elements of the active regions 104A and 104B. In some embodiments, the dummy gate dielectric layer 114 is made of one or more dielectric materials, such as silicon oxide (SiO), silicon nitride (SiN), silicon oxynitride (SiON), $HfO_2$, HfZrO, HfSiO, HfTiO, HfAlO. In some embodiments, the dielectric material is deposited using ALD, CVD, thermal oxidation, physical vapor deposition (PVD), another suitable technique, or a combination thereof.

In some embodiments, the dummy gate electrode layer 116 is made of semiconductor material such as polysilicon or poly-silicon germanium. In some embodiments, the material for the dummy gate electrode layer 116 is deposited using CVD, ALD, another suitable technique, or a combination thereof.

In some embodiments, the formation of the dummy gate structures 112 includes globally and conformally depositing a dielectric material for the dummy gate dielectric layer 114 over the semiconductor structure 100, depositing a material for the dummy gate electrode layer 116 over the dielectric material, planarizing the material for the dummy gate electrode layer 116, and patterning the material for the dummy gate electrode layer 116 and the dielectric material into the dummy gate structures 112.

The patterning process includes forming patterned hard mask layers 118 and 120 over the material for the dummy gate electrode layer 116, in accordance with some embodiments. For example, the patterned hard mask layer 118 is made of nitride such as silicon nitride, and the patterned hard mask layer 120 is made of oxide such as silicon oxide. The patterned hard mask layers 118 and 120 correspond to and overlap the channel region of the active regions 104A and 104B, in accordance with some embodiments. The materials for dummy gate dielectric layer 114 and the dummy gate electrode layer 116, uncovered by the patterned hard mask layer, are etched away until the source/drain regions of the active regions 104A and 104B are exposed, in accordance with some embodiments.

FIGS. 2B-1 through 2B-4 illustrate a semiconductor structure 100 after the formation of spacer layers 122 and 124 and a mask layer 126, in accordance with some embodiments. FIGS. 2B-1, 2B-2, 2B-3 and 2B-4 are cross-sectional views corresponding to line Y1-Y1, line Y2-Y2, line X1-X1 and line X2-X2, respectively.

Spacer layers 122 and 124 are sequentially formed over the semiconductor structure 100, as shown in FIGS. 2B-1 through 2B-4, in accordance with some embodiments. The spacer layers 122 and 124 are formed along and cover the top surfaces and the sidewalls of the dummy gate structures 112 and the patterned mask layers 118 and 120, the top surfaces and the sidewalls of the upper fin elements of the active regions 104A and 104B, and the top surface of the isolation structure 110, in accordance with some embodiments.

In some embodiments, the spacer layers 122 and 124 are made of a dielectric material, such as silicon nitride (SiN), silicon oxynitride (SiON), silicon oxide ($SiO_2$), oxygen-doped silicon carbide (SiC:O), oxygen-doped silicon carbonitride (Si(O)CN), silicon carbide (SiC), or another suitable dielectric material. In some embodiments, the spacer layers 122 and 124 are globally and conformally deposited using atomic layer deposition (ALD), CVD (such as LPCVD, PECVD, HDP-CVD and HARP), another suitable method, and/or a combination thereof.

In some embodiments, the spacer layers 122 and 124 are made of low-k dielectric materials. For example, the dielectric constant (k) values of the spacer layers 122 and 124 may be lower than the k-value of silicon oxide (SiO), such as lower than 4.2, equal to or lower than about 3.9, such as in a range from about 3.5 to about 3.9. In some embodiments, the spacer layer 122 and the spacer layer 124 are made of different materials and have different dielectric constant values. For example, the spacer layer 122 is a SiOCN layer and the spacer layer 124 is a Si(O)CN layer. The oxygen concentration in the SiOCN layer may be greater than the oxygen concentration in the Si(O)CN layer. In some embodiments, the spacer layers 122 and 124 are the same material. In some embodiments, the spacer layer 122 has a thickness in a range from about 10 angstroms (Å) to about 60 Å. In some embodiments, the spacer layer 124 has a thickness in a range from about 15 Å to about 90 Å.

A mask layer 126 is formed over the spacer layer 124, as shown in FIGS. 2B-1 through 2B-4, in accordance with some embodiments. In some embodiments, the mask layer 126 is made of dielectric material, such as silicon oxide ($SiO_2$), silicon nitride (SiN), silicon carbide (SiC), silicon oxynitride (SiON), zinc oxide (ZnO), aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$), another suitable dielectric material, and/or a combination thereof. In some embodiments, the mask layer 126 is globally and conformally deposited using ALD, CVD (such as LPCVD, PECVD, HDP-CVD and HARP), another suitable method, and/or a combination thereof.

FIGS. 2C-1 through 2C-4 illustrate a semiconductor structure 100 after the formation of a photoresist mask 128, in accordance with some embodiments. FIGS. 2C-1, 2C-2, 2C-3 and 2C-4 are cross-sectional views corresponding to line Y1-Y1, line Y2-Y2, line X1-X1 and line X2-X2, respectively.

A photoresist mask 128 is formed over the mask layer 126 and covers the second device region 50B, as shown in FIGS. 2C-1 through 2C-4, in accordance with some embodiments. The first device region 50A is uncovered by the photoresist mask 128, in accordance with some embodiments. The photoresist mask 128 is formed by a photolithography process, in accordance with some embodiments.

The photolithography process can include forming a photoresist layer (for example, by spin coating), performing a pre-exposure baking process, performing an exposure process using a mask (or a reticle), performing a post-exposure baking process, and performing a developing process. During the exposure process, the photoresist layer is exposed to radiation energy (such as ultraviolet (UV) light, deep UV (DUV) light, or extreme UV (EUV) light), where the mask blocks, transmits, and/or reflects radiation to the photoresist layer depending on a mask pattern of the mask and/or mask type, such that an image is projected onto the photoresist layer that corresponds with the mask pattern. Since the photoresist layer is sensitive to radiation energy, exposed portions of the resist layer chemically change, and exposed (or non-exposed) portions of the resist layer are dissolved during the developing process depending on the characteristics of the resist layer and the characteristics of the developing solution used in the developing process. After development, the patterned photoresist layer forms the photoresist mask 128 which includes a resist pattern that corresponds with the mask.

FIGS. 2D-1 through 2D-4 illustrate a semiconductor structure 100 after an etching process, in accordance with some embodiments. FIGS. 2D-1, 2D-2, 2D-3 and 2D-4 are cross-sectional views corresponding to line Y1-Y1, line Y2-Y2, line X1-X1 and line X2-X2, respectively.

An etching process is performed on the semiconductor structure 100 using the photoresist mask 128, in accordance with some embodiments. The etching process removes the portion of the mask layer 126 in the first device region 50A, and then removes the horizontal portions of the spacer layers 122 and 124 in the first device region 50A, and further recesses the source/drain regions of the active regions 104A, thereby forming source/drain recesses 134A in the first device region 50A, as shown in FIGS. 2D-1 through 2D-4, in accordance with some embodiments. The etching process may be an anisotropic etching process such as dry plasma etching, an isotropic etching process such as dry chemical etching, remote plasma etching or wet chemical etching, and/or a combination thereof. The photoresist mask 128 protects the components of the semiconductor structure 100 in the second device region 50B from being removed, in accordance with some embodiments.

The vertical portions of the spacer layers 122 and 124 left remaining on the opposite sides of the active regions 104A serve as fin spacers 130A in the first device region 50A, as shown in FIG. 2D-1, in accordance with some embodiments. The vertical portions of the spacer layers 122 and 124 left remaining on the opposite sidewalls of the dummy gate structure 112 serve as gate spacers 132 in the first device region 50A, as shown in FIG. 2D-3, in accordance with some embodiments. In addition, the isolation structure 110 are also recessed in the etching process to form recesses 136A in the first device region 50A, as shown in FIG. 2D-1, in accordance with some embodiments.

Figures 3A, 3B:
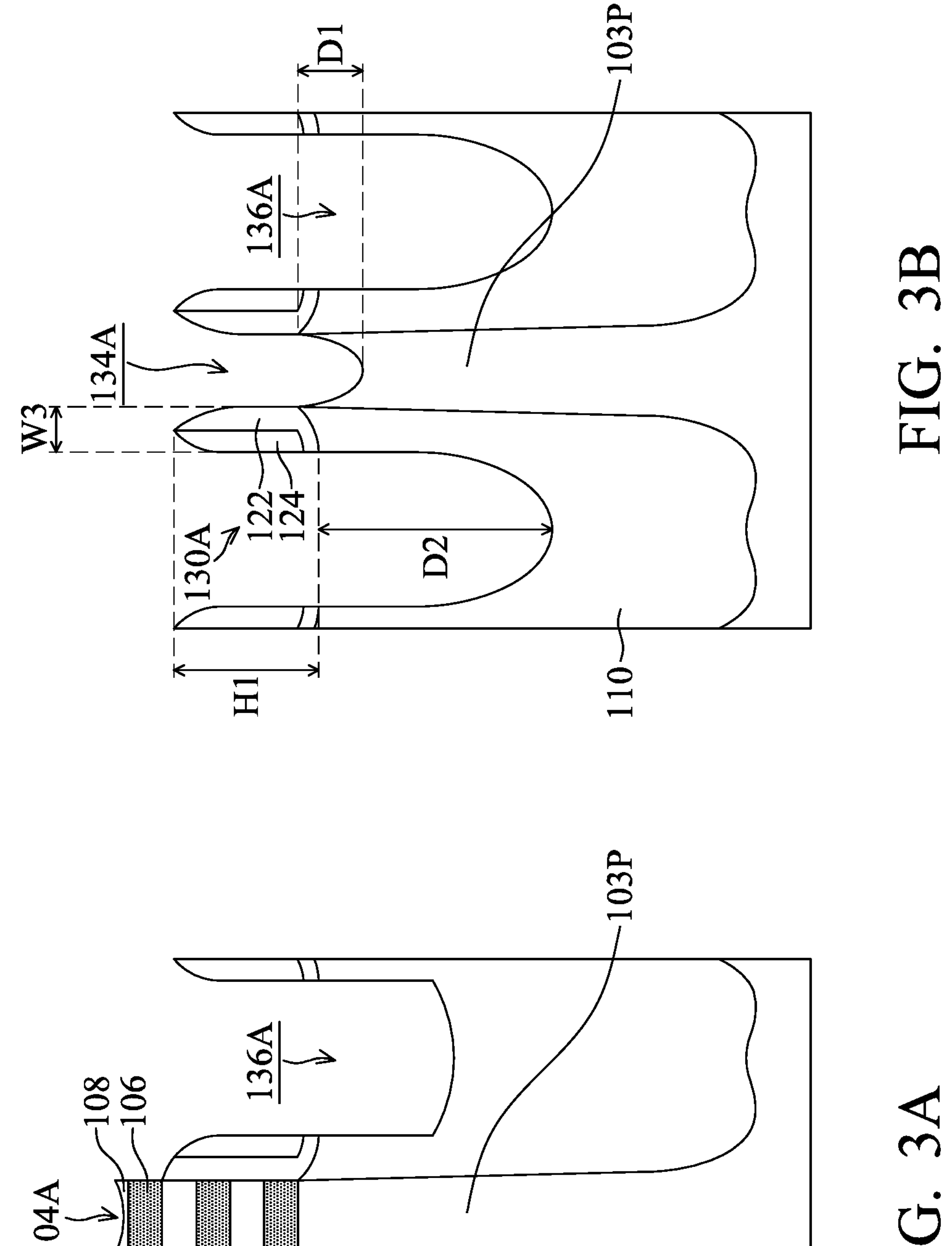
FIGS. 3A and 3B are cross-sectional views illustrating an etching process for forming source/drain recess 134A, in accordance with some embodiments of the disclosure.

FIGS. 3A and 3B are cross-sectional views illustrating an etching process for forming the source/drain recess 134A, in accordance with some embodiments of the disclosure.

In some embodiments, the etching process for forming the source/drain recess 134A may be performed in a plasma etch chamber. The etching process includes a first main etching step mainly etching the spacer layers 122 and 124 and a second main etching step mainly etching the active regions 104A, in accordance with some embodiments.

The first main etching step removes the horizontal portions of the spacer layers 122 and 124 along lateral surfaces (such as the top surface of the dummy gate structure 112, the top surface of the upper fin elements of the active regions 104A, and the top surface of the isolation structure 110), as shown in FIG. 3A, in accordance with some embodiments. During the first main etching step, the etching chamber provides a bias voltage in a range from about 100 V to about 1000 V, and an RF source power in a range from about 100 W to about 10000 W, in accordance with some embodiments. The first main etching step uses a fluorine-containing etchant (e.g., $CF_4$, $SF_6$, $CH_2F_2$, $CHF_3$, and/or $C_2F_6$), and is performed for the first time period, which lasts about 10 seconds to about 1000 seconds.

In the first main etching step, the vertical portions of the spacer layers 122 and 124 on the opposite sidewalls of the active regions 104A are also greatly recessed, so that the active regions 104A protrude from the vertical portions of the spacer layers 122 and 124 (i.e., the fin spacers 130A), in accordance with some embodiments. The first time period of the first main etching step is determined by the desired height of the fin spacer layers 130A, in accordance with some embodiments. In the first main etching step, the topmost second semiconductor layer 108 and the isolation structure 110 are also recessed to have top surfaces with concave profiles.

The second main etching step recesses the source/drain regions of the active regions 104A, thereby forming the source/drain recess 134A, as shown in FIG. 3B, in accordance with some embodiments. During the second main etching step, the etching chamber provides a bias voltage in a range from about 100 V to about 1000 V, and an RF source power in a range from about 100 W to about 10000 W, in accordance with some embodiments. The second main etching step uses a bromine-containing etchant (e.g., HBr and/or $CHBr_3$), and is performed at for the second time period, which lasts about 10 seconds to about 1000 seconds.

The source/drain recesses 134A pass through the upper fin element of the active regions 104A and extend into the lower fin elements 103P and 103N, in accordance with some embodiments. The bottom of the source/drain recesses 134A is located at a position between the top point and the bottom point of the concaved top surface of the isolation structure 110, in accordance with some embodiments. The second time period of the second main etching step is determined by the desired depth of the source/drain recesses 134A, in accordance with some embodiments. In the second main etching step, the isolation structure 110 may be further recessed.

In some embodiments, the fin spacers 130A have a height H1 (i.e., the dimension in the Z direction) that is less than about 20 nm, e.g., in a range from about 3 nm to about 20 nm and a width W3 (i.e., the dimension in the Y direction) in a range from about 5 nm to about 15 nm. In some embodiments, the source/drain recesses 134A extend into the lower fin elements 103P and 103N by a depth D1 in a range from about 5 nm to about 15 nm. In some embodiments, the recesses 136A have a depth D2 in a range from about 30 nm to about 80 nm.

FIGS. 2E-1 through 2E-4 illustrate a semiconductor structure 100 after the removal of the photoresist mask 128 and the mask layer 126, in accordance with some embodiments. FIGS. 2E-1, 2E-2, 2E-3 and 2E-4 are cross-sectional views corresponding to line Y1-Y1, line Y2-Y2, line X1-X1 and line X2-X2, respectively.

The photoresist mask 128 and the mask layer 126 are removed from the second device region 50B, thereby exposing the spacer layer 124, the active regions 104B and the dummy gate structures 112 in the second device region 50B, as shown in FIGS. 2E-2 and 2E-4, in accordance with some embodiments. In some embodiments, the removal process may be an anisotropic etching process such as dry plasma etching, an isotropic etching process such as dry chemical etching, remote plasma etching or wet chemical etching, an ashing process, and/or a combination thereof.

FIGS. 2F-1 through 2F-4 illustrate a semiconductor structure 100 after the formation of a mask layer 138, in accordance with some embodiments. FIGS. 2F-1, 2F-2, 2F-3 and 2F-4 are cross-sectional views corresponding to line Y1-Y1, line Y2-Y2, line X1-X1 and line X2-X2, respectively.

A mask layer 138 is formed over the semiconductor structure 100, as shown in FIGS. 2E-1 through 2E-4, in accordance with some embodiments. In some embodiments, the mask layer 138 is made of dielectric material, such as silicon oxide ($SiO_2$), silicon nitride (SiN), silicon carbide (SiC), silicon oxynitride (SiON), zinc oxide (ZnO), aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$), another suitable dielectric material, and/or a combination thereof. In some embodiments, the mask layer 138 is globally and conformally deposited using ALD, CVD (such as LPCVD, PECVD, HDP-CVD and HARP), another suitable method, and/or a combination thereof.

FIGS. 2G-1 through 2G-4 illustrate a semiconductor structure 100 after the formation of a photoresist mask 140, in accordance with some embodiments. FIGS. 2G-1, 2G-2, 2G-3 and 2G-4 are cross-sectional views corresponding to line Y1-Y1, line Y2-Y2, line X1-X1 and line X2-X2, respectively.

A photoresist mask 140 is formed over the mask layer 138 and covers the first device region 50A, as shown in FIGS. 2G-1 through 2G-4, in accordance with some embodiments. The second device region 50B is uncovered by the photoresist mask 140, in accordance with some embodiments. The formation of the photoresist mask 140 may be similar to the formation of the photoresist mask 128 described above.

FIGS. 2H-1 through 2H-4 illustrate a semiconductor structure 100 after an etching process, in accordance with some embodiments. FIGS. 2H-1, 2H-2, 2H-3 and 2H-4 are cross-sectional views corresponding to line Y1-Y1, line Y2-Y2, line X1-X1 and line X2-X2, respectively.

An etching process is performed on the semiconductor structure 100 using the photoresist mask 140, in accordance with some embodiments. The etching process removes the portion of the mask layer 138 in the second device region 50B, and then removes the horizontal portions of the spacer layers 122 and 124 in the second device region 50B, and further recesses the source/drain regions of the active regions 104B, thereby forming source/drain recesses 134B in the second device region 50B, as shown in FIGS. 2H-1 through 2H-4, in accordance with some embodiments. The etching process may be an anisotropic etching process such as dry plasma etching, an isotropic etching process such as dry chemical etching, remote plasma etching or wet chemical etching, and/or a combination thereof. The photoresist mask 140 protects the components of the semiconductor structure 100 in the first device region 50A from being removed, in accordance with some embodiments.

The vertical portions of the spacer layers 122 and 124 left remaining on the opposite sides of the active regions 104B serve as fin spacers 130B in the second device region 50B, as shown in FIG. 2H-2, in accordance with some embodiments. The vertical portions of the spacer layers 122 and 124 left remaining on the opposite sidewalls of the dummy gate structure 112 serve as gate spacers 132 in the second device region 50B, as shown in FIG. 2H-4, in accordance with some embodiments. In addition, the isolation structure 110 are also recessed in the etching process to form recesses 136B in the second device region 50B, as shown in FIG. 2H-2, in accordance with some embodiments.

Figures 4A, 4B:
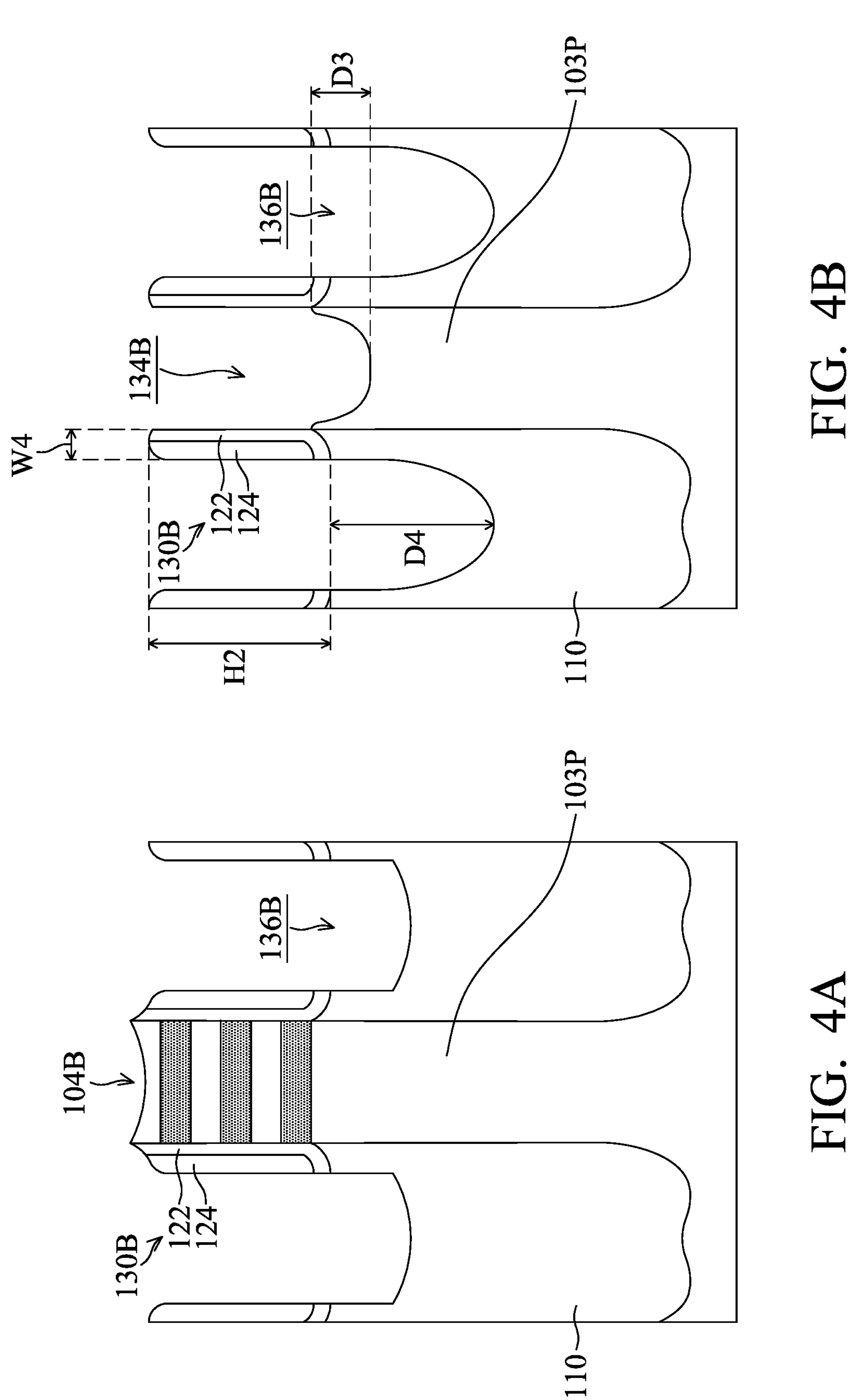
FIGS. 4A and 4B are cross-sectional views illustrating an etching process for forming source/drain recess 134B, in accordance with some embodiments of the disclosure.

FIGS. 4A and 4B are cross-sectional views illustrating an etching process for forming the source/drain recess 134B, in accordance with some embodiments of the disclosure.

In some embodiments, the etching process for forming the source/drain recess 134B may be performed in a plasma etch chamber. The etching process includes a first main etching step mainly etching the spacer layers 122 and 124 and a second main etching step mainly etching the active regions 104B, in accordance with some embodiments.

The first main etching step removes the horizontal portions of the spacer layers 122 and 124 along lateral surfaces (such as the top surface of the dummy gate structure 112, the top surface of the upper fin elements of the active regions 104B, and the top surface of the isolation structure 110), as shown in FIG. 4A, in accordance with some embodiments. During the first main etching step, the etching chamber provides a bias voltage in a range from about 100 V to about 1000 V, and an RF source power in a range from about 100 W to about 10000 W, in accordance with some embodiments. The first main etching step uses a fluorine-containing etchant (e.g., $CF_4$, $SF_6$, $CH_2F_2$, $CHF_3$, and/or $C_2F_6$), and is performed for the third time period, which lasts about 10 seconds to about 1000 seconds.

In the first main etching step, the vertical portions of the spacer layers 122 and 124 on the opposite sidewalls of the active regions 104B are only slightly recessed, in accordance with some embodiments. In some embodiments, the sidewalls of the active regions 104B remain covered by the spacer layer 122, in accordance with some embodiments. The third time period of the first main etching step is determined by the desired height of the fin spacer layers 130B, in accordance with some embodiments. In some embodiments, the first time period of the etching process for forming the source/drain recesses 134A is longer than the third time period of the etching process for forming the source/drain recesses 134B. In some embodiments, the ratio of the first time period to the third time period is in a range from about 1.5 to about 10.

In the first main etching step, the topmost second semiconductor layer 108 and the isolation structure 110 are also recessed to have top surfaces with concave profiles. In some embodiments, the remaining thickness of the topmost second semiconductor layers 108 of the active regions 104B (FIG. 4A) is thicker than the remaining thickness of the topmost second semiconductor layers 108 of the active regions 104A (FIG. 3A).

The second main etching step recesses the source/drain regions of the active regions 104B, thereby forming the source/drain recess 134B, as shown in FIG. 4B, in accordance with some embodiments. During the second main etching step, the etching chamber provides a bias voltage in a range from about 100 V to about 1000 V, and an RF source power in a range from about 100 W to about 10000 W, in accordance with some embodiments. The second main etching step uses a bromine-containing etchant (e.g., HBr and/or $CHBr_3$), and is performed at for the fourth time period, which lasts about 10 seconds to about 1000 seconds.

The source/drain recesses 134B pass through the upper fin element of the active regions 104B and extend into the lower fin elements 103P and 103N, in accordance with some embodiments. The bottom of the source/drain recesses 134B is located at a position between the top point and the bottom point of the concaved top surface of the isolation structure 110, in accordance with some embodiments. The second time period of the second main etching step is determined by the desired depth of the source/drain recesses 134B, in accordance with some embodiments. In some embodiments, the second time period of the etching process for forming the source/drain recesses 134A is shorter than the fourth time period of the etching process for forming the source/drain recesses 134B. In some embodiments, the ratio of the second time period to the fourth time period is in a range from about 0.5 to about 0.95. In the second main etching step, the isolation structure 110 may be further recessed.

In some embodiments, the fin spacers 130B have a height H2 (i.e., the dimension in the Z direction) that is greater than about 15 nm, e.g., in a range from about 20 nm to about 70 nm and a width W4 (i.e., the dimension in the Y direction) in a range from about 5 nm to about 15 nm. In some embodiments, the fin spacers 130B are taller than the fin spacers 130A (i.e., H3>H1). In some embodiments, the ratio (H2/H1) of the height H2 to the height H1 is in a range from about 1.5 to about 10. In some embodiments, the source/drain recesses 134B extend into the lower fin elements 103P and 103N by a depth D3 in a range from about 5 nm to about 15 nm. In some embodiments, the depth D3 of the source/drain recesses 134B is substantially the same as the depth D1 of the source/drain recesses 134A. In some embodiments, the recesses 136B have a depth D4 in a range from about 30 nm to about 80 nm. In some embodiments, the recesses 136A are deeper than the recesses 136B (i.e., D2>D4).

FIGS. 2I through 2I-4 illustrate a semiconductor structure 100 after the removal of the photoresist mask 140 and the mask layer 138, in accordance with some embodiments. FIG. 2I is a plan view of the semiconductor structure 100. FIGS. 2I-1, 2I-2, 2I-3 and 2I-4 are cross-sectional views corresponding to line Y1-Y1, line Y2-Y2, line X1-X1 and line X2-X2, respectively.

The photoresist mask 140 and the mask layer 138 are removed from the first device region 50A, thereby exposing the spacer layer 124, the active regions 104A and the dummy gate structures 112 in the first device region 50A, as shown in FIGS. 2I-1 and 2I-3, in accordance with some embodiments. In some embodiments, the removal process may be an anisotropic etching process such as dry plasma etching, an isotropic etching process such as dry chemical etching, remote plasma etching or wet chemical etching, an ashing process, and/or a combination thereof.

FIGS. 2J-1 through 2I-4 illustrate a semiconductor structure 100 after the formation of notches 142, in accordance with some embodiments. FIGS. 2J-1, 2J-2, 2J-3 and 2J-4 are cross-sectional views corresponding to line Y1-Y1, line Y2-Y2, line X1-X1 and line X2-X2, respectively.

An etching process is performed to laterally recess the first semiconductor layers 106 of the active regions 104A and 104B from the source/drain recesses 134A and 134B toward the channel regions, thereby forming notches 142, as shown in FIGS. 2J-3 and 2J-4, in accordance with some embodiments. In some embodiments, the etching process is an isotropic etching such as dry chemical etching, remote plasma etching, wet chemical etching, another suitable technique, or a combination thereof. The notches 142 are formed between adjacent second semiconductor layers 108 and between the lowermost second semiconductor layer 108 and the lower fin element 103P (or 103N), in accordance with some embodiments. In some embodiments, the notches 142 are located directly below the gate spacers 132.

FIGS. 2K-1 through 2K-4 illustrate a semiconductor structure 100 after the formation of a dielectric material 144, in accordance with some embodiments. FIGS. 2K-1, 2K-2, 2K-3 and 2K-4 are cross-sectional views corresponding to line Y1-Y1, line Y2-Y2, line X1-X1 and line X2-X2, respectively.

A dielectric material 144 is formed over the semiconductor structure 100 to overfill the notches 142, as shown in FIGS. 2K-1 through 2K-4, in accordance with some embodiments. In some embodiments, the dielectric material 144 is silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN).

In some embodiments, the dielectric material 144 is made of low-k dielectric materials. For example, the dielectric constant (k) value of the dielectric material 144 may be lower than a k-value of silicon oxide (SiO), such as lower than 4.2, equal to or lower than about 3.9, such as in a range from about 3.5 to about 3.9. In some embodiments, the dielectric material 144 is globally and conformally deposited over the semiconductor structure 100 using ALD, CVD (such as PECVD, LPCVD or HARP), another suitable technique, or a combination thereof.

FIGS. 2L-1 through 2L-4 illustrate a semiconductor structure 100 after an etching process, in accordance with some embodiments. FIGS. 2L-1, 2L-2, 2L-3 and 2L-4 are cross-sectional views corresponding to line Y1-Y1, line Y2-Y2, line X1-X1 and line X2-X2, respectively.

An etching process is performed on the dielectric material 144 to remove the portion of the dielectric material 144 outside the notches 142, as shown in FIGS. 2L-1 through 2L-4, in accordance with some embodiments. In some embodiments, the etching process includes an anisotropic etching process such as dry plasma etching, an isotropic etching process such as dry chemical etching, remote plasma etching or wet chemical etching, or a combination thereof. Portions of the dielectric material left remaining within the notches 142 form inner spacers 146, as shown in FIGS. 2L-3 and 2L-4, in accordance with some embodiments. The etching process may also recess the fin spacers 130A and 130B, in accordance with some embodiments.

A portion of the dielectric material 142 formed along the fin spacers 130A/130B partially fills the source/drain recesses 134A/134B, in accordance with some embodiments. The active region 104A in the first device region 50A has a relatively small width W1, and thus the distance between the pair of fin spacers 130A on opposite sides of the active region 104A is also short. As a result, in the case where the fin spacers 130A and the 130B have substantially the same height, the amount of etchant entering the source/drain recesses 134A is less than the amount of etchant entering the source/drain recesses 134B. Therefore, it is more difficult to completely remove the dielectric material 142 in the source/drain recesses 134A than in the source/drain recesses 134B. If after the etching process for forming the inner spacers 144, the residues of the dielectric material 142 remain in the source/drain recesses, which may negatively affect a subsequent epitaxial growth for forming source/drain features. For example, the epitaxial source/drain features may be undersized and/or have more lattice defects.

In accordance with some embodiments, the fin spacers 130A in the first device region 50A are shorter than the fin spacers 130B in the second device region 50B, and thus the dielectric material 142 can be completely removed from the source/drain recesses 134A and 134B before the etching process for forming the inner spacers 144 is complete. As a result, the issue of the residues of dielectric material in the source/drain recesses may be less of a concern, and the manufacturing yield of the resulting semiconductor structure may be improved.

The inner spacers 146 are formed to abut the sidewalls of the first semiconductor layers 106, as shown in FIGS. 2L-3 and 2L-4, in accordance with some embodiments. In some embodiments, the inner spacers 146 are located between adjacent second semiconductor layers 108 and between the lowermost second semiconductor layer 108 and the lower fin element 103 (or 103N). In some embodiments, the inner spacers 146 extend directly below the gate spacers 132, in accordance with some embodiments. The inner spacers 146 may avoid the source/drain features and the gate stack from being in direct contact and are configured to reduce the parasitic capacitance (e.g., Cgs and Cgd) between the gate stack and the source/drain features, in accordance with some embodiments.

FIGS. 2M-1 through 2M-4 illustrate a semiconductor structure 100 after the formation of a patterned mask layer 148, in accordance with some embodiments. FIGS. 2M-1 and 2M-2 are cross-sectional views corresponding to line Y1-Y1 and line Y2-Y2, respectively. FIG. 2M-3 is a combined cross-sectional view corresponding to lines X1-X1 and X1'-X1'. FIG. 2M-4 is a combined cross-sectional view corresponding to lines X2-X2 and X2'-X2'.

A patterned mask layer 148 is formed over the semiconductor structure 100 to cover the n-type wells $NW_1$ and $NW_2$, as shown in FIGS. 2M-1 through 2M-4, in accordance with some embodiments. The p-type wells $PW_1$ and $PW_2$ are uncovered by the patterned mask layer 148, in accordance with some embodiments. In some embodiments, the patterned mask layer 148 is made of dielectric material, such as silicon oxide ($SiO_2$), silicon nitride (SiN), silicon carbide (SiC), silicon oxynitride (SiON), zinc oxide (ZnO), aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$), another suitable dielectric material, and/or a combination thereof.

In some embodiments, the formation of the patterned mask layer 148 includes depositing globally and conformally a dielectric material for the patterned mask layer 148, and then patterning the dielectric material into the patterned mask layer 148. The deposition process may include ALD, CVD (such as LPCVD, PECVD, HDP-CVD and HARP), another suitable method, and/or a combination thereof. In some embodiments, the patterning process includes photolithography and etching processes.

FIGS. 2N-1 through 2N-4 illustrate a semiconductor structure 100 after the formation of source/drain features 150N, in accordance with some embodiments. FIGS. 2N-1 and 2N-2 are cross-sectional views corresponding to line Y1-Y1 and line Y2-Y2, respectively. FIG. 2N-3 is a combined cross-sectional view corresponding to lines X1-X1 and X1'-X1'. FIG. 2N-4 is a combined cross-sectional view corresponding to lines X2-X2 and X2'-X2'.

Source/drain features 150N are formed in the source/drain recesses 134A and 134B over the p-type wells $PW_1$ and $PW_2$ using an epitaxial growth process, as shown in FIGS. 2N-1 through 2N-4, in accordance with some embodiments. The epitaxial growth process may be MBE, MOCVD, or VPE, another suitable technique, or a combination thereof. The source/drain features 150N are grown on the source/drain region of the active regions 104A and 104B, in accordance with some embodiments. The source/drain features 150N abut the second semiconductor layers 108 of the active regions 104A and 104B and the inner spacers 146, in accordance with some embodiments.

In some embodiments, the source/drain features 150N are in-situ doped during the epitaxial processes. In some embodiments, the source/drain features 150N are doped with the n-type dopant during the epitaxial growth process. For example, the n-type dopant may be phosphorous (P) or arsenic (As). For example, the n-type source/drain features 150N may be the epitaxially grown silicon phosphorous (SiP), silicon carbon (SiC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 150N are in a range from about $2\times10^{19}$ $cm^{-3}$ to about $3\times10^{21}$ $cm^{-3}$.

The growth of the source/drain features 150N is initially confined by the fin spacers 130A and 130B such that the source/drain features 150N have a narrow body portion, in accordance with some embodiments. Once source/drain features 150N grow to protrude from the fin spacers 130A and 130B, the source/drain features 150N may grow to have facet surfaces that have specific crystalline orientations such that the source/drain features 150N has a wider head portion. Although the source/drain features 150N are illustrated as having the facet surfaces, the source/drain features 150N may have a curved surface in some other embodiments.

FIGS. 2O-1 through 2O-4 illustrate a semiconductor structure 100 after the removal of the patterned mask layer 148, in accordance with some embodiments. FIGS. 2O-1 and 2O-2 are cross-sectional views corresponding to line Y1-Y1 and line Y2-Y2, respectively. FIG. 2O-3 is a combined cross-sectional view corresponding to lines X1-X1 and X1'-X1'. FIG. 2O-4 is a combined cross-sectional view corresponding to lines X2-X2 and X2'-X2'.

The patterned mask layer 148 is removed from the n-type wells $NW_1$ and $NW_2$, as shown in FIGS. 2O-2 and 2O-4, in accordance with some embodiments. In some embodiments, the removal process may be an anisotropic etching process such as dry plasma etching, an isotropic etching process such as dry chemical etching, remote plasma etching or wet chemical etching, an ashing process, and/or a combination thereof.

FIGS. 2P-1 through 2P-4 illustrate a semiconductor structure 100 after the formation of a patterned mask layer 152, in accordance with some embodiments. FIGS. 2P-1 and 2P-2 are cross-sectional views corresponding to line Y1-Y1 and line Y2-Y2, respectively. FIG. 2P-3 is a combined cross-sectional view corresponding to lines X1-X1 and X1'-X1'. FIG. 2P-4 is a combined cross-sectional view corresponding to lines X2-X2 and X2'-X2'.

A patterned mask layer 152 is formed over the semiconductor structure 100 to cover the p-type wells $PW_1$ and $PW_2$, as shown in FIGS. 2P-1 through 2P-4, in accordance with some embodiments. The n-type wells $NW_1$ and $NW_2$ are uncovered by the photoresist mask 152, in accordance with some embodiments. In some embodiments, the patterned mask layer 152 is made of dielectric material, such as silicon oxide ($SiO_2$), silicon nitride (SiN), silicon carbide (SiC), silicon oxynitride (SiON), zinc oxide (ZnO), aluminum oxide ($Al_2O_3$), tin oxide (SnO), lead oxide (PbO), beryllium oxide (BeO), chromium oxide (CrO, $Cr_2O_3$, $Cr_2O_3$ or $Cr_3O_4$), another suitable dielectric material, and/or a combination thereof.

In some embodiments, the formation of the patterned mask layer 152 includes depositing globally and conformally a dielectric material for the patterned mask layer 152, and then patterning the dielectric material into the patterned mask layer 152. The deposition process may include ALD, CVD (such as LPCVD, PECVD, HDP-CVD and HARP), another suitable method, and/or a combination thereof. In some embodiments, the patterning process includes photolithography and etching processes.

FIGS. 2Q-1 through 2Q-4 illustrate a semiconductor structure 100 after the formation of source/drain features 150P, in accordance with some embodiments. FIGS. 2Q-1 and 2Q-2 are cross-sectional views corresponding to line Y1-Y1 and line Y2-Y2, respectively. FIG. 2Q-3 is a combined cross-sectional view corresponding to lines X1-X1 and X1'-X1'. FIG. 2Q-4 is a combined cross-sectional view corresponding to lines X2-X2 and X2'-X2'.

Source/drain features 150P are formed in the source/drain recesses 134A and 134B over the n-type wells $NW_1$ and $NW_2$ using an epitaxial growth process, as shown in FIGS. 2Q-1 through 2Q-4, in accordance with some embodiments. The epitaxial growth process may be MBE, MOCVD, or VPE, another suitable technique, or a combination thereof. The source/drain features 150P are grown on the source/drain region of the active regions 104A and 104B, in accordance with some embodiments. The source/drain features 150P abut the second semiconductor layers 108 of the active regions 104A and 104B and the inner spacers 146, in accordance with some embodiments.

In some embodiments, the source/drain features 150P are in-situ doped during the epitaxial processes. In some embodiments, the source/drain features 150P are doped with the p-type dopant during the epitaxial growth process. For example, the p-type dopant may be boron (B) or $BF_2$. For example, the p-type source/drain features 150P may be the epitaxially grown silicon germanium (SiGe), silicon germanium carbon (SiGeC), germanium (Ge), silicon (P) or a combination thereof doped with boron (B). In some embodiments, the concentrations of the dopant (e.g., B) in the source/drain features 150P are in a range from about $1\times10^{19}$ $cm^{-3}$ to about $6\times10^{20}$ $cm^{-3}$. In some embodiments, the n-type source/drain features 150N and the p-type source/drain features 150P are made of different epitaxial materials.

For example, the n-type source/drain features 150N are made of SiP, and the p-type source/drain features 150P are made of SiGe.

The growth of the source/drain features 150P is initially confined by the fin spacers 130A and 130B such that the source/drain features 150P have a narrow body portion, in accordance with some embodiments. Once source/drain features 150P grow to protrude from the fin spacers 130A and 130B, the source/drain features 150P may grow to have facet surfaces that have specific crystalline orientations such that the source/drain features 150N has a wider head portion. Although the source/drain features 150P are illustrated as having the facet surfaces, the source/drain features 150P may have a curved surface in some other embodiments.

FIGS. 2R-1 through 2R-4 illustrate a semiconductor structure 100 after the removal of the patterned mask layer 148, in accordance with some embodiments. FIGS. 2R-1 and 2R-2 are cross-sectional views corresponding to line Y1-Y1 and line Y2-Y2, respectively. FIG. 2R-3 is a combined cross-sectional view corresponding to lines X1-X1 and X1'-X1'. FIG. 2R-4 is a combined cross-sectional view corresponding to lines X2-X2 and X2'-X2'.

The patterned mask layer 152 is removed from the p-type wells $PW_1$ and $PW_2$, as shown in FIGS. 2R-2 and 2R-4, in accordance with some embodiments. In some embodiments, the removal process may be an anisotropic etching process such as dry plasma etching, an isotropic etching process such as dry chemical etching, remote plasma etching or wet chemical etching, an ashing process, and/or a combination thereof.

Figure 5B:
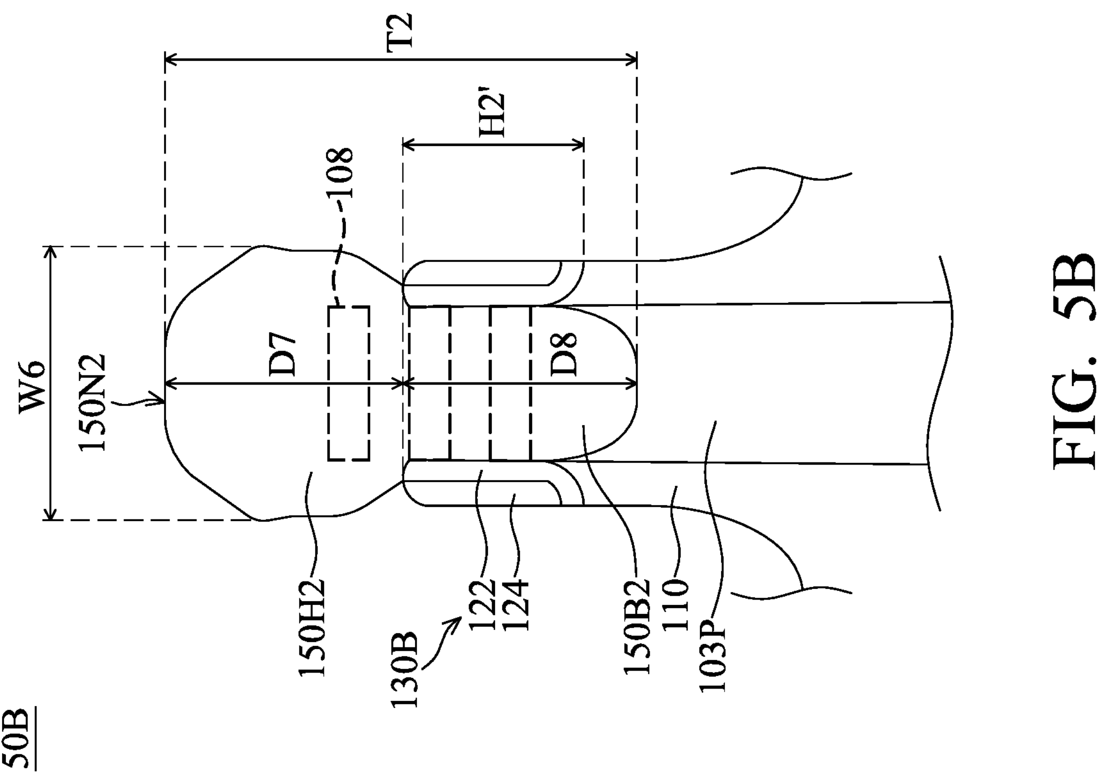
FIGS. 5A and 5B are enlarged views of FIGS. 2R-1 and 2R-2 to illustrate more detail of source/drain features and neighboring components, in accordance with some embodiments of the disclosure.
Figure 5A:
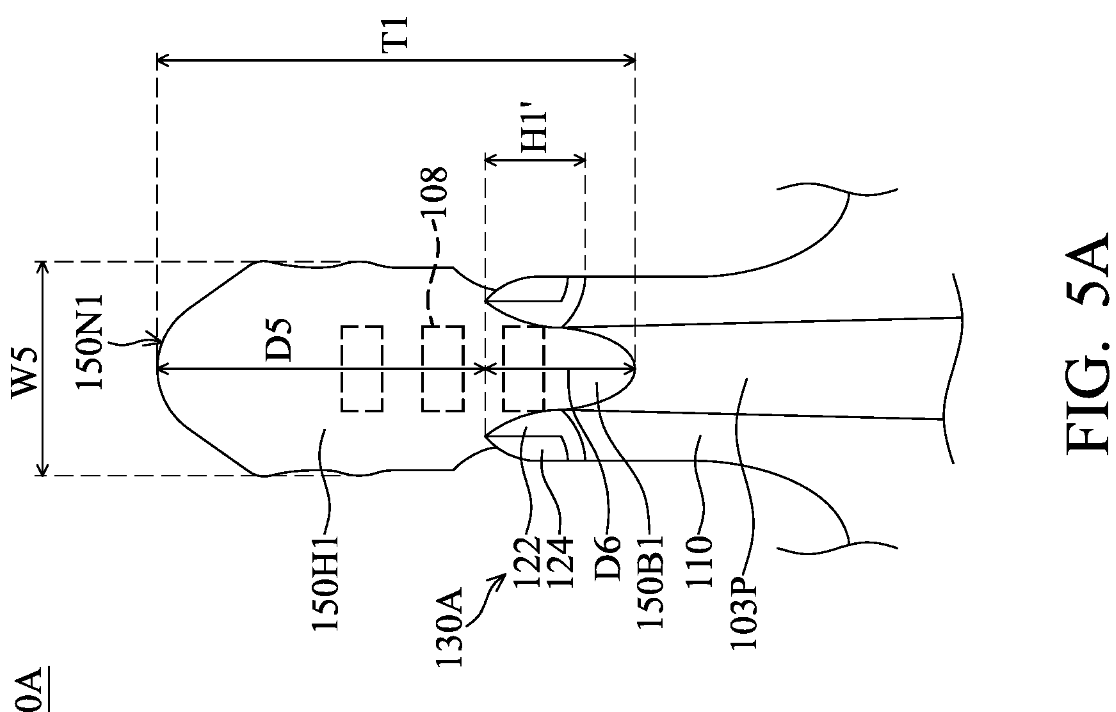

FIGS. 5A and 5B are enlarged views of FIGS. 2R-1 and 2R-2 to illustrate more detail of the source/drain features 150N1 and 150N2 and neighboring components, in accordance with some embodiments of the disclosure.

In some embodiments, the fin spacer 130A in the first device region 50A has a height H1' (i.e., the dimension in the Z direction) that is less than about 10 nm, e.g., in a range from about 3 nm to about 10 nm, as shown in FIG. 5A. In some embodiments, the fin spacer 130B in the second device region 50B is taller than the fin spacers 130A and has a height H2' (i.e., the dimension in the Z direction) that is greater than about 15 nm, e.g., in a range from about 20 nm to about 50 nm, as shown in FIG. 5B. In some embodiments, the ratio (H2'/H1') of the height H2' to the height H1' is in a range from about 1.5 to about 10.

The second semiconductor layers 108 are illustrated as dashed lines in FIGS. 5A and 5B. In some embodiments, the top of the fin spacer 130A is located at a position between the top surface of the lowermost second semiconductor layer 108 and the bottom surface of the second lowermost second semiconductor layer 108. In some embodiments, the top of the fin spacer 130B is located at a position substantially level the top surface of the second lowermost second semiconductor layer 108, or between the top surface of the second lowermost second semiconductor layer 108 and the bottom surface of the topmost second semiconductor layer 108.

In some embodiments, the source/drain feature 150N1 in the first device region 50A includes a body portion 150B1 interposed between the fin spacers 130A and a head portion 150H1 above the fin spacers 130A. In some embodiments, the head portion 150H1 has and a thickness D5 (i.e., the dimension in the Z direction) in a range from about 20 nm to about 50 nm. In some embodiments, the body portion 150B1 has a thickness D6 (i.e., the dimension in the Z direction) in a range from about 5 nm to about 35 nm. In some embodiments, the thickness D5 of the head portion 150H1 is substantially the same as or greater than the thickness D6 of the body portion 150B1. In some embodiments, the thickness D6 is about 0-30 nm greater than the thickness D5.

In some embodiments, the source/drain feature 150N1 has a thickness T1 (i.e., the dimension in the Z direction) in a range from about 40 nm to about 70 nm. In some embodiments, the source/drain feature 150N1 (or the head portion 150H1) has a width W5 (i.e., the dimension in the Y direction) in a range from about 10 nm to about 33 nm.

In some embodiments, the source/drain feature 150N2 in the second device region 50B includes a body portion 150B2 interposed between the fin spacers 130B and a head portion 150H2 above the fin spacers 130B. In some embodiments, the head portion 150H2 has and a thickness D7 (i.e., the dimension in the Z direction) in a range from about 10 nm to about 40 nm. In some embodiments, the head portion 150H2 is thinner than the head portion 150H1 (i.e., D7<D5).

In some embodiments, the body portion 150B2 has a thickness D8 (i.e., the dimension in the Z direction) in a range from about 15 nm to about 45 nm. In some embodiments, the body portion 150B2 is thicker than the body portion 150B1 (i.e., D8>D6). In some embodiments, the body portion 150B2 is thicker than the head portion 150H2, for example, the thickness D8 is about 0-20 nm greater than the thickness D7. In some embodiments, the head portion 150H2 is thicker than the body portion 150B2, for example, the thickness D7 is about 0-10 nm greater than the thickness D8. In some embodiments, the thickness D7 and the thickness D8 are substantially the same.

In some embodiments, the source/drain feature 150N2 has a thickness T2 (i.e., the dimension in the Z direction) in a range from about 40 nm to about 70 nm. In some embodiments, the thickness T2 of the source/drain feature 150N2 is substantially the same as the thickness T1 of the source/drain feature 150N1. In some embodiments, the source/drain feature 150N2 (or the head portion 150H2) has a width W6 (i.e., the dimension in the Y direction) in a range from about 25 nm to about 115 nm.

In some embodiments where the ratio of the width W2 of the active region 104B to the width W1 of the active region 104A is less than about 1.2, the width W6 of the source/drain feature 150N2 may be less than the width W5 of the source/drain feature 150N1. In some embodiments where the ratio of the width W2 of the active region 104B to the width W1 of the active region 104A is about or is greater than about 1.5, the width W6 of the source/drain feature 150N2 may be greater than the width W5 of the source/drain feature 150N1.

In some embodiments, the head portion 150H1 of the source/drain feature 150N1 partially covers and is in contact with the spacer layer 122 of the fin spacers 130A. In some embodiments, the head portion 150H2 of the source/drain feature 150N2 is not in contact with the spacer layer 122 of the fin spacers 130B. Although FIGS. 5A and 5B illustrate only the n-type source/drain features 150N, the p-type source/drain features 150P may a similar dimensional configuration.

In accordance with some embodiments, the fin spacers 130B in the second device region 50B are taller than the fin spacers 130A in the first device region 50A, and thus the height proportion of the body portion (e.g., 150B2) in the source/drain feature 150N/150P in the second device region 50B is greater than the height proportion of the body portion (e.g., 150B1) in the source/drain feature 150N/150P in the first device region 50A. The body portion of the source/drain feature with a greater height proportion can reduce the parasitic capacitance (e.g., Cgs and Cgd) between the gate stack and the source/drain feature, thereby enhancing the performance (e.g., speed) of the resulting semiconductor device.

FIGS. 2S-1 through 2S-4 illustrate a semiconductor structure 100 after the formation of a contact etching stop layer (CESL) 154 and an interlayer dielectric layer (ILD) and the formation of gate trenches 158 and gaps 160, in accordance with some embodiments. FIGS. 2S-1, 2S-2, 2S-3 and 2S-4 are cross-sectional views corresponding to line Y1-Y1, line Y2-Y2, line X1-X1 and line X2-X2, respectively.

A contact etching stop layer 154 is formed over the semiconductor structure 100 to cover the source/drain features 150N and 150P, as shown in FIGS. 2S-1 through 2S-4, in accordance with some embodiments. The contact etching stop layer 154 is further formed along, and covers, the sidewalls of the fin spacers 130A and 130B, the gate spacers 132 and the top surface of the isolation structure 110, in accordance with some embodiments.

In some embodiments, the contact etching stop layer 154 is made of dielectric material, such as silicon nitride (SiN), silicon oxide ($SiO_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 154 is globally and conformally deposited over the semiconductor structure 100 using CVD (such as LPCVD, PECVD, HDP-CVD, or HARP), ALD, another suitable method, or a combination thereof.

Afterward, an interlayer dielectric layer 156 is formed over the contact etching stop layer 154, as shown in FIGS. 2S-1 through 2S-4, in accordance with some embodiments. The interlayer dielectric layer 156 overfills the space between dummy gate structures 112, in accordance with some embodiments. In some embodiments, the interlayer dielectric layer 156 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the interlayer dielectric layer 156 and the contact etching stop layer 154 are made of different materials and have a great difference in etching selectivity. In some embodiments, the dielectric material for the interlayer dielectric layer 156 is deposited using such as CVD (such as HDP-CVD, PECVD, HARP or FCVD), another suitable technique, or a combination thereof. The dielectric materials for the contact etching stop layer 154 and the interlayer dielectric layer 156 above the top surface of the dummy gate electrode layer 116 are removed using such as CMP, in accordance with some embodiments.

The dummy gate structures 112 are removed using an etching process to form gate trenches 158 between the gate spacers 132, as shown in FIGS. 2S-3 and 2S-4, in accordance with some embodiments. In some embodiments, the gate trenches 158 expose the channel regions of the active regions 104A and 104B. In some embodiments, the gate trenches 158 further expose the sidewalls of the gate spacers 132 facing the channel region. In some embodiments, the etching process includes one or more etching processes. For example, when the dummy gate electrode layer 116 is made of polysilicon, a wet etchant such as a tetramethylammonium hydroxide (TMAH) solution may be used to selectively remove the dummy gate electrode layer 116. For example, the dummy gate dielectric layer 114 may be thereafter removed using a plasma dry etching, a dry chemical etching, and/or a wet etching.

Afterward, an etching process is performed to remove the first semiconductor layers 106 of the active regions 104A and 104B to form gaps 160, as shown in FIGS. 2S-3 and 2S-4, in accordance with some embodiments. The inner spacers 146 may be used as an etching stop layer in the etching process, which may protect the source/drain features 150N and 150P from being damaged. In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

The gaps 160 are formed between adjacent second semiconductor layers 108 and between the lowermost second semiconductor layer 108 and the lower fin element 103P (or 103N), in accordance with some embodiments. In some embodiments, the gaps 160 also expose the sidewalls of the inner spacers 146 facing the channel region.

After the one or more etching processes, the four main surfaces of the second semiconductor layers 108 are exposed, in accordance with some embodiments. The exposed second semiconductor layers 108 form nanostructures, in accordance with some embodiments. The nanostructures 108 are vertically stacked and spaced apart from one other, in accordance with some embodiments. As the term is used herein, "nanostructures" refers to the semiconductor layers with cylindrical shape, bar shaped and/or sheet shape. The nanostructures 108 function as channels of the resulting semiconductor devices (e.g., nanostructure transistors such as GAA transistors), in accordance with some embodiments.

FIGS. 2T through 2T-4 illustrate a semiconductor structure 100 after the formation of final gate stacks 162, in accordance with some embodiments. FIG. 2T is a plan view of the semiconductor structure 100. FIGS. 2T-1, 2T-2, 2T-3 and 2T-4 are cross-sectional views corresponding to line Y1-Y1, line Y2-Y2, line X1-X1 and line X2-X2, respectively.

Final gate stacks 162 are formed in the gate trenches 158 and gaps 160, thereby wrapping around the nanostructures 108, as shown in FIGS. 2T, 2T-3 and 2T-4, in accordance with some embodiments. In some embodiments, the final gate stacks 162 extend in the Y direction. The final gate stacks 162 have longitudinal axes parallel to the Y direction, in accordance with some embodiments. That is, the dimensions (lengths) of the final gate stacks 162 in the Y direction are greater than the dimensions (widths) of the final gate stacks 162 in the X direction. The final gate stacks 162 engage the channel region so that current can flow between the source/drain regions during operation. In some embodiments, each of the final gate stacks 162 includes an interfacial layer 164, a gate dielectric layer 166 and a metal gate electrode layer 168, as shown in FIGS. 2T-3 and 2T-4, in accordance with some embodiments.

The interfacial layer 164 is formed on the exposed surfaces of the nanostructures 108 and the exposed top surfaces of the lower fin elements 103P (and 103N), in accordance with some embodiments. The interfacial layer 164 wraps around the nanostructures 108, in accordance with some embodiments. In some embodiments, the interfacial layer 164 is made of a chemically formed silicon oxide. In some embodiments, the interfacial layer 164 is nitrogen-doped silicon oxide. In some embodiments, the interfacial layer 164 is formed using one or more cleaning processes such as including ozone ($O_3$), ammonia hydroxide-hydrogen peroxide-water mixture, and/or hydrochloric acid-hydrogen peroxide-water mixture. Semiconductor material from the nanostructures 108 and the lower fin elements 103P (and 103N) is oxidized to form the interfacial layer 164, in accordance with some embodiments.

The gate dielectric layer 166 is formed conformally along the interfacial layer 164 to wrap around the nanostructures 108, in accordance with some embodiments. The gate dielectric layer 166 is also conformally formed along the sidewalls of the gate spacers 132 facing the channel region, in accordance with some embodiments. The gate dielectric layer 166 is also conformally formed along the sidewalls of the inner spacers 146 facing the channel region, in accordance with some embodiments. The gate dielectric layer 166 is further formed along the top surface of the isolation structure 110, in accordance with some embodiments.

The gate dielectric layer 166 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Si_3N_4$, oxynitrides (SiON), a combination thereof, or another suitable material. The high-k dielectric layer may be deposited using ALD, PVD, CVD, and/or another suitable technique.

The metal gate electrode layer 168 is formed to fill remainders of the gate trenches 158 and gaps 160, in accordance with some embodiments. In some embodiments, the metal gate electrode layer 168 is made of more than one conductive material, such as a metal, metal alloy, conductive metal oxide and/or metal nitride, another suitable conductive material, and/or a combination thereof. For example, the metal gate electrode layer 168 may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layer 168 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 168 may be formed using ALD, PVD, CVD, e-beam evaporation, or another suitable technique.

A planarization process such as CMP may be performed on the semiconductor structure 100 to remove the materials of the gate dielectric layer 166 and the metal gate electrode layer 168 formed above the top surface of the interlayer dielectric layer 156, in accordance with some embodiments. The final gate stacks 162 wrapping around the nanostructures 108 of the active regions 104 combine with the neighboring source/drain features 150N/150P to form nanostructure transistors, e.g., n-channel nanostructure transistors in the p-type wells PW and p-channel nanostructure transistors in the n-type wells PW.

FIGS. 2U-1 through 2U-4 illustrate a semiconductor structure 100 after the formation of contact plugs 172, in accordance with some embodiments. FIGS. 2U-1, 2U-2, 2U-3 and 2U-4 are cross-sectional views corresponding to line Y1-Y1, line Y2-Y2, line X1-X1 and line X2-X2, respectively.

Contact plugs 172 are formed in and/or through the interlayer dielectric layer 156 and the contact etching stop layer 154 and land on the source/drain features 150N and 150P, as shown in FIGS. 2U-1 through 2U-4, in accordance with some embodiments. The contact plugs 172 are electrically connected to the source/drain features 150N and 150P, in accordance with some embodiments. In some embodiments, the formation of the contact plugs 172 includes patterning the interlayer dielectric layer 156 and the contact etching stop layer 154 to form contact openings (where the contact plugs 172 are to be formed) using photolithography and etching processes until the source/drain features 150N and 150P are exposed. The etch process may include plasma dry etching, another suitable method, or a combination thereof.

Silicide layers 170 are formed on the exposed surfaces of the source/drain features 150N and 150P. In some embodiments, the silicide layers 170 are made of WSi, NiSi, TiSi and/or CoSi. In some embodiments, the formation of the silicide layers 170 includes depositing a metal material followed by one or more annealing processes. The semiconductive material (e.g., Si) from the source/drain features 150N and 150P reacts with the metal material to form the silicide layers 170, in accordance with some embodiments.

Afterward, one or more conductive materials for the contact plugs 172 are deposited to overfill the contact openings, in accordance with some embodiments. In some embodiments, one or more conductive materials are deposited using CVD, PVD, e-beam evaporation, ALD, electroplating (ECP), electroless deposition (ELD), another suitable method, or a combination thereof to overfill the contact openings. The one or more conductive materials over the top surface of the interlayer dielectric layer 156 are planarized using, for example, CMP. After the planarization process, the top surfaces of the contact plugs 172 and the top surfaces of the metal gate electrode layer 168 are substantially coplanar, in accordance with some embodiments.

The contact plugs 172 may have a multilayer structure including, for example, liner layers, glue layers, barrier layers, seed layers, metal bulk layers, another suitable layer, or a combination thereof. For example, a barrier layer (not shown) may optionally be deposited along the sidewalls and the bottom surfaces of the contact openings. The barrier layer is used to prevent the metal from the subsequently formed metal material from diffusing into the dielectric material (e.g., the interlayer dielectric layer 156 and the contact etching stop layer 154). The barrier layer may be made of tantalum (Ta), tantalum nitride (TaN), titanium (Ti), titanium nitride (TiN), cobalt tungsten (CoW), another suitable material, or a combination thereof. If the subsequently formed metal material does not easily diffuse into the dielectric material, the barrier layer may be omitted.

A glue layer (not shown) may optionally be deposited along the sidewalls and the bottom surfaces of the contact openings, and on the barrier layer (if formed). The glue layer is used to improve adhesion between the subsequently formed metal material and the dielectric material (e.g., the interlayer dielectric layer 156 and the contact etching stop layer 154). The glue layer may be made of tantalum nitride (TaN), titanium (Ti), titanium nitride (TiN), another suitable material, or a combination thereof.

A metal bulk layer is then deposited on the glue layer (if formed) to fill the remainder of the contact openings. In some embodiments, the metal bulk layer is formed using a selective deposition technique such as cyclic CVD process or ELD process, and it is not necessary to form a glue layer in the contact openings before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

It should be understood that the semiconductor structure 100 may undergo further CMOS processes to form various features over the semiconductor structure, such as a multi-layer interconnect structure (e.g., contact plugs to final gate stacks, conductive vias, metal lines, inter metal dielectric layers, passivation layers, etc.). In some embodiments, the device formed in the first device region 50A may be electrically connected to the device formed in the second device region 50B through the conductive features of the multilayer interconnect structure.

As described above, the aspect of the present disclosure is directed to a semiconductor structure including fin spacers. The first fin spacers 130A in the first device region 50A are relatively short, which may help to completely remove a dielectric material 142 for inner spacers 144 from a source/drain recess 134A. Therefore, the problem that the source/drain epitaxial growth is negatively affected may be avoided, thereby improving the manufacturing yield of the resulting semiconductor structure.

In addition, the first fin spacers 130B in the second device region 50B are relatively taller, and thus the narrow body portion (e.g., 150B2) of the source/drain feature 150N/150P may have a relatively high height proportion. Therefore, the parasitic capacitance may be reduced, thereby enhancing the performance (e.g., speed) of the resulting semiconductor device.

Embodiments of a semiconductor structure are provided. The semiconductor structure may include first fin spacers, second fin spacers, a first source/drain feature between the first fin spacers, and a second source/drain feature between the second fin spacers. The first fin spacers are shorter than the second fin spacers, and thus the dielectric material for inner spacers may be completely removed from the source/drain recess for the first source/drain feature, thereby improving the manufacturing yield of the resulting semiconductor structure. In addition, the second source/drain feature may have a high proportion of a narrow body portion, thereby enhancing the performance of the resulting semiconductor device.

In some embodiments, a method for forming a semiconductor structure is provided. The method includes forming a first fin structure and a second fin structure over a substrate. The second fin structure is wider than the first fin structure. The method also includes forming a spacer layer along the first fin structure and the second fin structure, etching a first portion of the spacer layer and the first fin structure to form first fin spacers on opposite sides of the first fin structure and a first recess between the first fin spacers, and etching a second portion of the spacer layer and the second fin structure to form second fin spacers on opposite sides of the second fin structure and a second recess between the second fin spacers. The first fin spacers have a first height, and the second fin spacers have a second height that is greater than the first height. The method also includes forming a first source/drain feature in the first recess and a second source/drain feature in the second recess.

In some embodiments, a method for forming a semiconductor structure is provided. The method includes forming a first fin structure and a second fin structure over a substrate. The method includes forming a spacer layer over the first fin structure and the second fin structure. The method includes etching a first portion of the spacer layer over the first fin structure for a first time period to form first fin spacers on sidewalls of the first fin structure. The method includes recessing the first fin structure to form a first source/drain recess exposing the first fin spacers. The method includes etching a second portion of the spacer layer over the second fin structure for the second time period to form second fin spacers on sidewalls of the second fin structure. The method includes recessing the second fin structure to form a second source/drain recess exposing the second fin spacers. The method includes forming a first source/drain feature in the first source/drain recess and a second source/drain feature in the second source/drain recess. The second time period is shorter than the first time period.

In some embodiments, a semiconductor structure is provided. The semiconductor structure includes a first gate stack and a second gate stack extending in a first horizontal direction across a first active region, a third gate stack and a fourth gate stack extending in the first horizontal direction across a second active region. The second active region is wider than the first active region in the first horizontal direction. The semiconductor structure also includes first fin spacers extending on sidewalls of the first active region between the first gate stack and the second gate stack, and second fin spacers extending on sidewalls of the second active region between the third gate stack and the fourth gate stack. The second fin spacers are taller than the first fin spacers in a vertical direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a first fin structure and a second fin structure over a substrate, wherein the second fin structure is wider than the first fin structure;

forming a spacer layer along the first fin structure and the second fin structure, wherein both the first fin structure and the second fin structure include alternately stacking first semiconductor layers and second semiconductor layers;

etching a first portion of the spacer layer and the first fin structure to form first fin spacers on opposite sides of the first fin structure and a first recess between the first fin spacers;

etching a second portion of the spacer layer and the second fin structure to form second fin spacers on opposite sides of the second fin structure and a second recess between the second fin spacers, wherein the first fin spacers have a first height, and the second fin spacers have a second height that is greater than the first height; and laterally etching the first semiconductor layers to form notches;

depositing a dielectric layer to fill the notches; and etching a portion of the dielectric layer outside the notches to form inner spacers in the notches, wherein during the etching of the portion of the dielectric layer outside the notches, the first fin spacers and the second fin spacers are recessed to form first recessed fin spacers and second recessed fin spacers, respectively, the first recessed fin spacers have a third height, and the second recessed fin spacers have a fourth height that is greater than the third height;

forming a first source/drain feature in the first recess and a second source/drain feature in the second recess.

2. The method for forming the semiconductor structure as claimed in claim 1, further comprising:

forming a first photoresist mask covering the second portion of the spacer layer before etching the first portion of the spacer layer and the first fin structure; and removing the first photoresist mask after etching the first portion of the spacer layer and the first fin structure.

3. The method for forming the semiconductor structure as claimed in claim 2, further comprising:

forming a second photoresist mask covering the first fin structure and the first fin spacers after removing the first photoresist mask and before etching the second portion of the spacer layer and the second fin structure; and removing the second photoresist mask after etching the second portion of the spacer layer and the second fin structure.

4. The method for forming the semiconductor structure as claimed in claim 1, wherein:

etching the first portion of the spacer layer comprises using an etchant for a first time period, and etching the second portion of the spacer layer comprises using the etchant for a second time period that is shorter than the first time period.

5. The method for forming the semiconductor structure as claimed in claim 1, wherein a ratio of the fourth height to the third height is in a range from about 1.5 to about 10.

6. The method for forming the semiconductor structure as claimed in claim 1, further comprising:

removing the first semiconductor layers of the first fin structure and the first semiconductor layers of the second fin structure to form first gaps and second gaps, respectively; and forming a gate electrode layer to fill the first gaps and the second gaps.

7. The method for forming the semiconductor structure as claimed in claim 1, wherein:

the first source/drain feature includes a first head portion above tops of the first fin spacers and a first body portion interposed between the first fin spacers, the second source/drain feature includes a second head portion above tops of the second fin spacers and a second body portion interposed between the second fin spacers, and the first head portion is thicker than the second head portion, and the second body portion is thicker than the first body portion.

8. A method for forming a semiconductor structure, comprising:

forming a first fin structure and a second fin structure over a substrate, wherein the first fin structure has a first width measured along a first direction that is parallel a top surface of the substrate, and the second fin structure has a second width measured along the first direction, and the first width is less than the second width;

forming a spacer layer over the first fin structure and the second fin structure;

etching a first portion of the spacer layer over the first fin structure for a first time period to form first fin spacers on sidewalls of the first fin structure;

recessing the first fin structure to form a first source/drain recess exposing the first fin spacers;

etching a second portion of the spacer layer over the second fin structure for a second time period to form second fin spacers on sidewalls of the second fin structure, wherein the second time period is shorter than the first time period;

recessing the second fin structure to form a second source/drain recess exposing the second fin spacers; and forming a first source/drain feature in the first source/drain recess and a second source/drain feature in the second source/drain recess.

9. The method for forming the semiconductor structure as claimed in claim 8, further comprising:

forming a first dummy gate structure and a second dummy gate structure over the first fin structure and the second fin structure, respectively, wherein:

the spacer layer is further formed over the first dummy gate structure and the second dummy gate structure, a third portion of the spacer layer over the first dummy gate structure is etched during the etching of the first portion of the spacer layer over the first fin structure to form first gate spacers on sidewalls of the first dummy gate structure, and a fourth portion of the spacer layer over the second dummy gate structure is etched during the etching of the second portion of the spacer layer over the second fin structure to form second gate spacers on sidewalls of the second dummy gate structure.

10. The method for forming the semiconductor structure as claimed in claim 8, wherein a ratio of the first time period to the second time period is in a range from about 1.5 to about 10.

11. The method for forming the semiconductor structure as claimed in claim 8, wherein the first fin spacers have a first dimension in a second direction perpendicular to the top surface of the substrate, the second fin spacers have a second dimension in the first direction, and the second dimension is greater than the first dimension.

12. The method for forming the semiconductor structure as claimed in claim 11, wherein the first source/drain feature includes:

a first head portion above tops of the first fin spacers, wherein the first head portion has a third dimension in the first direction; and a first body portion interposed between the first fin spacers, wherein the first body portion has a fourth dimension in the first direction, wherein the fourth dimension is shorter than the third dimension.

13. The method for forming the semiconductor structure as claimed in claim 12, wherein the second source/drain feature includes:

a second head portion above tops of the second fin spacers, wherein the second head portion has a fifth dimension in the first direction; and a second body portion interposed between the second fin spacers, wherein the second body portion has a sixth dimension in the first direction, wherein the sixth dimension is greater than the fifth dimension.

14. The method for forming the semiconductor structure as claimed in claim 8, wherein the first source/drain feature has a first maximum width measured along the first direction, and the second source/drain feature has a second maximum width measured, and the first maximum width is greater than the second maximum width.

15. The method for forming the semiconductor structure as claimed in claim 8, wherein the first source/drain feature has a first maximum width measured along the first direction, and the second source/drain feature has a second maximum width measured, and the first maximum width is less than the second maximum width.

16. A method for forming a semiconductor structure, comprising:

forming a first fin structure and a second fin structure over a first region and a second region of a substrate, respectively;

forming an isolation structure to surround the first fin structure and the second fin structure;

forming a spacer layer over the first fin structure and the second fin structure;

forming a first patterned mask layer to cover the second region;

etching the spacer layer to form first fin spacers on opposite sides of the first fin structure;

etching the first fin structure to a first source/drain recess;

recessing a first portion of the isolation structure in the first region;

removing the first patterned mask layer after forming the first source/drain recess;

forming a second patterned mask layer to cover the first region;

etching the spacer layer to form second fin spacers on opposite sides of the second fin structure, wherein a first height of the first fin spacers is different than a second height of the second fin spacers;

etching the second fin structure to a second source/drain recess;

recessing a second portion of the isolation structure in the second region, wherein a first depth of the first portion of the isolation structure is different than a second depth of the second portion of the isolation structure;

removing the second patterned mask layer after forming the second source/drain recess;

forming a first epitaxial material and a second epitaxial material in the first source/drain recess and the second source/drain recess, respectively.

17. The method for forming the semiconductor structure as claimed in claim 16, wherein the first fin structure is narrower than the second fin structure, and the first height is less than the second height.

18. The method for forming the semiconductor structure as claimed in claim 16, wherein:

the first fin structure includes a first fin element, a first channel layer over the first fin element, a first sacrificial layer on the first channel layer and a second channel layer on the first sacrificial layer, wherein tops of the first fin spacers are located at a level between a top surface of the first channel layer and a bottom surface of the second channel layer, and the second fin structure includes a second fin element, a third channel layer over the second fin element, a second sacrificial layer on the third channel layer and a fourth channel layer on the second sacrificial layer, wherein tops of the second fin spacers are located at a level higher than a top surface of the fourth channel layer.

19. The method for forming the semiconductor structure as claimed in claim 16, wherein:

the first epitaxial material includes a lower portion between the first fin spacers and an upper portion protruding from the first fin spacers, a first dimension of the upper portion of the first epitaxial material in a vertical direction is greater than a second dimension of the lower portion of the first epitaxial material in the vertical direction, the second epitaxial material includes a lower portion between the second fin spacers and an upper portion protruding from the second fin spacers, and a third dimension of the upper portion of the second epitaxial material in the vertical direction is less than a fourth dimension of the lower portion of the second epitaxial material in the vertical direction.

20. The method for forming the semiconductor structure as claimed in claim 16, wherein a bottom of the first source/drain recess and a bottom of the second source/drain recess are located at substantially a same level.

* * * * *